United States Patent
Azuma et al.

[11] Patent Number: 5,803,961
[45] Date of Patent: Sep. 8, 1998

[54] INTEGRATED CIRCUITS HAVING MIXED LAYERED SUPERLATTICE MATERIALS AND PRECURSOR SOLUTIONS FOR USE IN A PROCESS OF MAKING THE SAME

[75] Inventors: Masamichi Azuma; Carlos A. Paz De Araujo; Larry D. McMillan, all of Colorado Springs, Colo.

[73] Assignees: Symetrix Corporation, Colorado Springs, Colo.; Matsushita Electronics Corporation, Takatsuki, Japan

[21] Appl. No.: 644,588

[22] Filed: May 10, 1996

Related U.S. Application Data

[60] Division of Ser. No. 406,374, Mar. 17, 1995, which is a continuation-in-part of Ser. No. 965,190, Oct. 23, 1992, abandoned.

[51] Int. Cl.[6] .................. C09D 5/00; C09D 5/24
[52] U.S. Cl. .................. 106/287.18; 106/287.19
[58] Field of Search .................. 106/287.18, 287.19

[56] References Cited

U.S. PATENT DOCUMENTS

| | | | |
|---|---|---|---|
| 4,704,785 | 11/1987 | Curran | 437/110 |
| 4,830,983 | 5/1989 | Thornton | 437/161 |
| 4,978,646 | 12/1990 | Bardhan et al. | 501/134 |
| 5,028,455 | 7/1991 | Miller et al. | 427/126.3 |
| 5,046,043 | 9/1991 | Miller et al. | 365/145 |
| 5,146,299 | 9/1992 | Lampe et al. | 357/23.5 |
| 5,198,269 | 3/1993 | Swartz et al. | 427/226 |
| 5,478,610 | 12/1995 | Desu et al. | 427/573 |
| 5,514,822 | 5/1996 | Scott et al. | 556/28 |
| 5,516,363 | 5/1996 | Azuma et al. | 106/287.18 |

FOREIGN PATENT DOCUMENTS

| | | | |
|---|---|---|---|
| 0489519A2 | 6/1992 | European Pat. Off. | 21/314 |
| 2232974 | 9/1990 | Japan | 29/788 |

OTHER PUBLICATIONS

CA 125:314350, Azuma et al, "Integrated circuits having mixed layered superlattice. . ." Sep. 26, 1996.

Dohler, Gottfried H., "Solid–State Superlattices," Scientific American (Nov. 1983).

Melnick, B.M., et al, "Process Optimization and Characterization of Device Worthy Sol–Gel Based PZT for Ferroelectric Memories," Ferroelectrics, (1990), vol. 109, Gordon & Breach Science Publishers S.A.

Vest, Robert W., et al, "$PBTiO_3$ Films From Metalloorganic Precursors," IEEE Transactions on Ultrasonics, Ferroelectrics and Frequency Control, vol. 35, No. 6, (Nov. 1988).

Smolenskii, G.A., et al, "Ferroelectrics and Related Materials," vol. 3 of Ferroelectricity and Related Phenomena, Gordon & Breach Science Publishers.

Subbarao, E.C., "A Family of Ferroelectric Bismuth Compounds," J. Physical Chem. Solids, Pergamon Press (1962), vol. 23, pp. 665–676.

Shu–Yau–Wu, "A New Ferroelectric Memory Device, Metal–Ferroelectric–Semiconductor Translator," IEEE Transactions on Electron Devices, vol. ED–21, No. 8, (Aug. 1974).

(List continued on next page.)

*Primary Examiner*—David Brunsman
*Attorney, Agent, or Firm*—Duft, Graziano & Forest, P.C.

[57] ABSTRACT

Metal alkoxycarboxylate-based liquid precursor solutions are used to form electronic devices (100) that include mixed layered superlattice materials (112) of a type having discrete oxygen octahedral layers (124) and (128) collated with a superlattice-generator layer (116). The precursor solutions include a plurality of metal moieties in effective amounts for yielding the layered superlattice materials. These metal moieties are mixed to include an A/B portion capable of forming an A/B layer (124), a perovskite-like AB layer portion capable of forming a perovskite-like AB octahedral layer (128), and a superlattice-generator portion capable of forming the superlattice-generator layer (116). The precursors are deposited in liquid form upon a substrate and annealed to provide the layered superlattice materials.

23 Claims, 22 Drawing Sheets

OTHER PUBLICATIONS

Joshi, P.C., et al, "Rapid Thermally Processed Ferroelectric Bi4Ti$_3$O$_{12}$ Thin Films," Journal of Applied Physics, (1992, Dec.), No. 11; New York, US.

Milhara, Takeshi, et al, Feasibility for Memory Devices and Electrical Characterization of Newly Developed Fatigue Free Capacitors, 4th Annual Int'l Symposium on Integrated Ferroelectrics, (1992).

INTEGRATED CIRCUITS HAVING MIXED LAYERED SUPERLATTICE MATERIALS AND PRECURSOR SOLUTIONS FOR USE IN A PROCESS OF MAKING THE SAME

This application is a division of U.S. application Ser. No. 08/406,374 filed 17 Mar. 1995, which is a continuation in part of U.S. application Ser. No. 07/965,190, filed 23 Oct. 1992.

BACKGROUND OF THE INVENTION

1. Field of the Invention

The present invention pertains to the field of integrated circuit technology and, more particularly, to high performance thin-film materials for use in ferroelectric switching capacitors. Still more specifically, a single liquid precursor solution is used to manufacture a thin-film ferroelectric material having multiple layers that present an oxygen octahedra superlattice.

2. Description of the Prior Art

Ferroelectric layered perovskite-like materials are known, and have been reported as phenomenonological curiosities. The term "perovskite-like" usually refers to a number of interconnected oxygen octahedra. A primary cell is typically formed of an oxygen octahedral positioned within a cube that is defined by large A-site metals where the oxygen atoms occupy the planar face centers of the cube and a small B-site element occupies the center of the cube. In some instances, the oxygen octahedral structure may be preserved in the absence of A-site elements. The reported annealing temperatures for these materials often exceed 1100° C. or even 1300° C., which would preclude their use in many integrated circuits.

Researchers have made and tested a large number of materials, and those materials found to be ferroelectric or to have high dielectric constants have been included in lengthy lists. See for example, Appendix F of *Principles and Applications of Ferroelectrics and Related Materials*, by M. E. Lines and A. M. Glass, Clarendon Press, Oxford, 1977, pp. 620–632. Ferroelectric materials are known to switch polarization states in the presence of an applied electric field, and can retain the switched polarization state for indefinite periods of time after the field is removed. Additional background information can be obtained, from copending application Ser. No. 07/965,190 filed Oct. 23, 1992, which is hereby incorporated by reference herein to the same extent as though fully disclosed herein.

Prior ferroelectrics are afflicted with high fatigue rates that preclude their widespread commercial acceptance. That is, under repeated switching, the polarizability decreases to less than 50% of the original polarizability over a useful life of an unacceptably short duration. Moreover, when a series of pulses of the same sign are applied to the prior art materials, they take a set, or an imprint. See for example the article "Anomalous Remanent Polarization In Ferroelectric Capacitors" by Norman E. Abt, Reza Moazzami, and Yoav Nissan-Cohen, in *Integrated Ferroelectrics*, 1992, Vol 2, pp. 121–131, which discusses the ΔP0 phenomenon.

Two layered perovskite-like ferroelectric materials, namely, bismuth titanate ($Bi_4Ti_3O^{12}$) and barium magnesium fluoride ($BaMgF_4$), were unsuccessfully tried in a switching memory application as a gate on a transistor. See "A New Ferroelectric Memory Device, Metal-Ferroelectric-Semiconductor Transistor", by Shu-Yau Wu, *IEEE Transactions On Electron Devices*, August 1974, pp. 499–504, which relates to the $Bi_4Ti_3O_{12}$ device, and the article "Integrated Ferroelectrics" by J. F. Scott, C. A. Paz De Araujo, and L. D. McMillan in *Condensed Matter News*, Vol. 1, No. 3, 1992, pp. 16–20.

Neither of the above two devices was suitable for use in a memory. In the case of the $Bi_4Ti_3O_{12}$ device, the ON state decayed logarithmically after only two hours. Similarly, both states of the $BaMgF_4$ device decayed exponentially after a few minutes, but the rapid dissipation of the "polarized" state creates significant questions whether the material actually functioned as an electret, not a ferroelectric. See "Memory Retention And Switching Behavior Of Metal-Ferroelectric-Semiconductor Transistors", by S. Y. Wu, *Ferroelectrics*, 1976 Vol. 11, pp. 379–383. Thus, the prior art suggests that materials degradation is an insuperable obstacle to commercial acceptance.

Yet another problem with ferroelectric materials is that the ferroelectric phenomenon is temperature sensitive. The polarization magnitude varies greatly across a temperature range, and may not even occur at all depending upon the temperature.

SUMMARY OF THE INVENTION

The present invention overcomes the problems that are outlined above, by providing special liquid precursor solutions and methods of using these precursor solutions to make fatigue-resistant and high polarization ferroelectric integrated circuit devices. Ingredients for the class of materials employed can be adjusted to accommodate different temperatures in the intended environment of use.

Precursor-derived thin-films having a thickness of less than 2000 Å can have total magnitude switching polarizabilities ("2Pr") of greater than 15 $\mu C/cm^2$, 24 $\mu C/cm^2$, or more determined at a coercive electric field ("2Ec") of less than about 150 KV/cm and a temperature of about 20° C. The preferred materials also have a switching fatigue endurance of at least $10^{10}$ cycles or more at 3V with essentially no polarization degradation. The above values far exceed results obtainable from prior ferroelectric materials on platinum and titanium electrodes, and make the ferroelectric materials well suited for use in ferroelectric memories.

The special liquid precursor solutions permit the formation of corresponding ferroelectric materials through a low-temperature anneal process. The low-temperature anneal enables the widespread use of these materials in integrated circuits.

The layered perovskite-like materials are referred to herein as "mixed layered superlattice materials." This term is introduced because no suitable commonly accepted word or phrase exists to describe these materials. Mixed layered superlattice materials are hereby defined to include metal oxides having at least three interconnected layers that respectively have an ionic charge: (1) A first layer ("A/B layer") that can contain an A-site metal, a B-site metal, or both an A-site metal and a B-site metal, which A/B layer may or may not have a perovskite-like oxygen octahedral lattice; (2) A superlattice-generating layer; and (3) A third layer ("AB layer") that contains both an A-site metal and a B-site metal, which AB layer has a perovskite-like oxygen octahedral lattice that is different from the A/B layer lattice. A useful feature of these materials is the fact that an amorphous or non-ordered single mixture of superlattice-forming metals, when heated in the presence of oxygen, will spontaneously generate a thermodynamically-favored layered superlattice.

The present invention broadly pertains to thin-film electronic devices, such as integrated circuits, as well as methods and materials for producing these devices. A thin-film ferroelectric capacitor is formed as a ferroelectric mixed layered superlattice material interposed between a first electrode and a second electrode. The mixed layered superlattice material has a plurality of collated layers in a sequence at least including an A/B layer having an A/B material ionic subunit cell, a superlattice-generator layer having a superlattice-generator ionic subunit cell, and a perovskite-like AB layer having a perovskite-like octahedral ionic subunit cell. The A/B layer and the perovskite-like AB layer have different crystal structures with respect to one another, despite the fact that they may both include metals which are suitable for use as A-site and/or B-site metals. It should not be assumed that the A/B layer must contain both A-site metals and B-site metals; it may contain only A-site metals or only B-site metals, and does not necessarily have a perovskite-like lattice.

The ferroelectric layer is preferably produced from a liquid precursor solution that includes a plurality of metal moieties in effective amounts for yielding the mixed layered superlattice material. The solution is applied to a substrate, in order to form a liquid thin film. This film is subjected to a low-temperature anneal for purposes of generating the mixed layered superlattice material from the film.

Related applications have emphasized the formation of electronic devices that contain thin-film layered superlattice materials. The term 'layered superlattice materials' includes both the mixed layered superlattice materials discussed herein and layered superlattice materials that are formed of repeating identical perovskite-like oxygen octahedra layers. The prior applications did not specifically recognize the superiority of mixed layered superlattice materials, although, such materials were contemplated. The present application provides additional details for the construction of improved perovskite-like ferroelectric devices. The improvement constitutes ferroelectric materials having different types of perovskite-like oxygen octahedra layers separated from one another by bismuth oxide layers. For example, the structure can include A/B layers each having a thickness of a two octahedra and other perovskite-like AB layers each having a thickness of three octahedra. These different layers generate from a single solution of superlattice-forming precursor moieties.

All types of layered superlattice materials may be generally summarized under the average empirical formula:

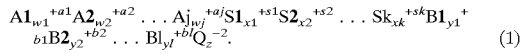
(1)

Note that Formula (1) refers to a stoichiometrically balanced list of superlattice-forming moieties. Formula (1) does not represent a unit cell construction, nor does it attempt to allocate ingredients to the respective layers. In Formula (1), A1, A2 . . . Aj represent A-site elements in a perovskite-like octahedral structure, which includes elements such as strontium, calcium, barium, bismuth, lead, and mixtures thereof, as well as others metals of similar ionic radius. S1, S2 . . . Sk represent superlattice generator elements, which preferably include only bismuth, but can also include trivalent materials such as yttrium, scandium, lanthanum, antimony, chromium, and thallium. B1, B2 . . . Bl represent B-site elements in the perovskite-like structure, which may be elements such as titanium, tantalum, hafnium, tungsten, niobium, vanadium, zirconium, and other elements, and Q represents an anion, which preferably is oxygen but may also be other elements, such as fluorine, chlorine and hybrids of these elements, such as the oxyfluorides, the oxychlorides, etc. The superscripts in Formula (1) indicate the valences of the respective elements. The subscripts indicate the number of atoms of a particular element in the empirical formula compound. In terms of the unit cell, the subscripts indicate a number of atoms of the element, on the average, in the unit cell. The subscripts can be integer or fractional. That is, Formula (1) includes the cases where the unit cell may vary throughout the material, e.g. in $Sr_{0.75}Ba_{0.25}Bi_2Ta_2O_9$, on the average, 75% of the time Sr is the A-site atom and 25% of the time Ba is the A-site atom. If there is only one A-site element in the compound then it is represented by the "A1" element and w2 . . . wj all equal zero. If there is only one B-site element in the compound, then it is represented by the "B1" element, and y2 . . . yl all equal zero, and similarly for the superlattice generator elements. The usual case is that there is one A-site element, one superlattice generator element, and one or two B-site elements, although Formula (1) is written in the more general form because the invention is intended to include the cases where either of the A and B sites and the superlattice generator can have multiple elements. The value of z is found from the equation:

(a1w1+a2W2 . . . +ajwj)+(s1x1+s2x2 . . . +skxk)+(b1y1+b2y2 . . . +bjyj)=2z. (2)

The layered superlattice materials do not include every material that can be fit into Formula (1), but only those ingredients which spontaneously form themselves into a layer of distinct crystalline layers during crystallization. This spontaneous crystallization is typically assisted by thermally treating or annealing the mixture of ingredients. The enhanced temperature facilitates ordering of the superlattice-forming moieties into thermodynamically favored structures, such as perovskite-like octahedra.

The term "superlattice generator elements" as applied to S1, S2 . . . Sk, refers to the fact that these metals are particularly stable in the form of a concentrated metal oxide layer interposed between two perovskite-like layers, as opposed to a uniform random distribution of superlattice generator metals throughout the mixed layered superlattice material. In particular, bismuth has an ionic radius that permits it to function as either an A-site material or a superlattice generator, but bismuth, if present in amounts less than a threshold stoichiometric proportion, will spontaneously concentrate as a non-perovskite-like bismuth oxide layer.

It should also be understood that the term layered superlattice material herein also includes doped layered superlattice materials. That is, any of the material included in Formula (1) may be doped with a variety of materials, such as silicon, germanium, uranium, zirconium, tin, chromium, dysprosium, or hafnium.

Formula (1) at least includes all three of the Smolenskii-type ferroelectric layered superlattice materials, namely, those having the respective formulae:

(3)

(4)

(5)

wherein A is an A-site metal in the perovskite-like superlattice, B is a B-site metal in the perovskite-like superlattice, S is a trivalent superlattice-generator metal such as bismuth or thallium, and m is a number sufficient to balance the overall formula charge. Where m is a fractional number, the overall average empirical formula provides for a plurality of different or mixed perovskite-like layers. Materials according to Formula (3) above are particularly preferred.

The mixed layered superlattice materials include at least three different types of ionic layers. The simplest case is one in which there is a single type of superlattice-generator layer G and two different types of oxygen octahedra layers, namely, $L_1$ and $L_2$ (A/B and AB layers). The octahedra layers are separated from one another by the superlattice-generator layers. Accordingly, any random sequence of collated perovskite-like layers may be observed with intervening G layers, e.g., $$GL_1GL_1GL_2GL_1GL_2GL_2G.$$

$L_1$ differs from $L_2$ in the structure of ionic subunit cells that are the building blocks of the respective layers, e.g., as respective layers having thicknesses of one and two octahedra. The $L_1$-structure (A/B) layers will form a percentage of the total number of perovskite layers. This percentage may also be viewed as a concentration-derived probability $\delta$ of finding a given type of L layer interposed between any two G layers. The total of $\delta$ probabilities equals one, and these probabilities are mutually exclusive for a given layer. Layers $L_1$ and $L_2$ may also have a plurality of structurally equivalent A-site moieties or a plurality of equivalent B-site moieties. For example, layers $L_1$ and $L_2$ may include two structurally equivalent B-site metals, B and B', which have similar ionic radii and valences. Accordingly, the B' elements constitute a percentage of the total B-site elements in the average empirical formula for both layers $L_1$ and $L_2$. There will be a corresponding formula portion $\alpha$ of each metal in the average empirical formula for each layer.

More generally, the ionic layers may repeat themselves in an overall superlattice according to the average repeating-structure formula $$G\{[(L_1\delta_1)(\Sigma_{i=1}{}^J Mi_{\alpha i})][(L_2\delta_2)(\Sigma_{i=1}{}^J Mi_{\alpha i})][(L_k\delta_k)(\Sigma_{i=1}{}^J Mi_{\alpha i})]\} G\ldots, \tag{6}$$

wherein G is a superlattice-generator layer having a trivalent metal; L is a layer containing A-site and/or B-site materials with a different crystal lattice as compared to other types of L layers denoted by the corresponding integer subscripts 1, 2, and k; $\delta$ is a mutually exclusive probability of finding a given L layer formed of a particular lattice structure denoted by the subscripts 1, 2, and k; $\alpha i$ is an empirical formula portion of a given metal Mi in an average empirical formula for a corresponding L layer; and J is an integer equal to a total number of metals Mi in the corresponding L layer.

The overall average Formula (6) includes a plurality of different L layers, which are formed of ionic subunit cells. The A/B layer is a type of L layer that preferably has an A/B layer average empirical formula $$(A_{m-1}B_mO_c)^{V}, \tag{7}$$

wherein A is an A-site metal suitable for use in an A/B subunit cell; B is a B-site metal suitable for use in the A/B subunit cell; O is oxygen; m is a number equal to at least one; c is a value selected from a group consisting of (3m+1), (3m+0.5) and (3m); S is a trivalent superlattice-generator element; and V is an A/B layer charge selected from a group consisting of 1+, 1−, 2−, and 3−. The A/B layer can have a perovskite-like octahedra structure; however, it can also include A-site metals and/or B-site metals arranged in a non-perovskite like structure. That is, the above terms "A-site metal" and "B-site metal" refer to metal cations having suitable ionic radii for use in a perovskite lattice, but these cations do not necessarily occupy the A-site and B-site locations of a perovskite-like lattice in the A/B layer. For example, (m=1) materials are not perovskite-like because they have no A-site element, however, (m=1) materials are still encompassed by Formula (7).

Suitable A-site metals typically have an ionic radius ranging from about 0.9 Å to about 1.3 Å, and suitable B-site metals typically have an ionic radius ranging from about 0.5 Å to about 0.8 Å.

The perovskite-like AB layer is a type of L layer that preferably includes an empirical formula $$(A'_{n-1}B'_nO_{3n+1})^{V'}, \tag{8}$$

wherein A' is an A-site atom in a perovskite-like AB ionic subunit cell, B' is a B-site atom in the perovskite-like AB ionic subunit cell, O is oxygen, n is a number having a value greater than one, and V' is a second formula charge selected from a group consisting of 1+, 1−, 2−, and 3−, but is most preferably 2−. In Formula (8), at least one of A', B', and n are different from the corresponding elements A, B, and m of the A/B layer empirical Formula (7). In particular, it is preferred that n is different from m.

The superlattice-generator layer preferably has an empirical formula of $$(S_2O_2)^{2+}, \tag{9}$$

wherein S is a trivalent superlattice-generator element such as bismuth or thallium. The layer according to Formula (9) repeats itself as needed to balance the charges of layers according to Formulae (7) and (8). Typically, there will be one layer according to Formula (9) for each type of L layer according to Formula (7) and each L layer according to Formula (8).

A feature of the mixed layered superlattice materials is that a variety of charge compensation mechanisms may arise in the lattice. These compensation mechanisms advantageously serve to compensate point charge defects and prevent line defects from establishing a long-range order. Overall polarizability and reliability of the ferroelectric materials are, accordingly, optimized. For example, an A-site cation deficiency in a L-type layer at a point proximal to an interface with a superlattice-generator layer may be compensated by an oxygen deficient bismuth atom from the superlattice-generator layer of Formula (9). Other charge compensation mechanisms include variations such as $(BiO_3)^{3-}$ and $Bi^{3+}$ through the addition and deletion of atoms from the base Formula (9). These various compensation mechanisms provide an overall balanced charge in the crystal and yet permit the L layer to form as an octahedra structure having compensated surface defects.

As indicated above, Formula (7) includes both perovskite-like and non-perovskite-like materials. This feature of Formula (7) permits charge compensation by layers as necessitated by the requirement that the overall crystal must have a balanced formula charge. By way of example, where B is pentavalent and A is divalent, Formula (8) will have a charge of 2− when n=2. Similarly, when m=1, Formula (7) will have a charge of 3− when (c=3m+1) and a charge of 1− when (c=3m). The formation of perovskite-like octahedra is thermodynamically favored in the crystallization process.

The following example serves to illustrate an application of Formulae (5)–(9). A mixed layered superlattice material can include material having an empirical formula of $A_{0.833}Bi_2B_{0.167}B'_{1.667}O_{8.417}$, wherein the A-site metal A is divalent, and the B-site metals B and B' are pentavalent. This empirical formula is obtained by combining precursor ingredients as follows: (1) providing an aliquot of a first precursor solution capable of yielding a fixed a number of moles of a pure AB layer $(AB_2O_7)^{2-}$ material according to Formula (8) where (n=2); (2) adding to the aliquot a second precursor capable of yielding a pure A/B layer $(BO_{3.5})^{2-}$ material according to Formula (7) where (m=1) in an amount equal to 20% of the fixed number of moles obtainable from the first precursor; and (3) further adding sufficient $(Bi_2O_2)^{2+}$ to balance the overall formula charge.

In the above empirical formula, the B-site elements include about 9% B' and 91% B elements, e.g., (0.0167/(0.0167+1.667=0.091 or $\alpha$ for B'). The B and B' atoms are randomly distributed at B-sites throughout the respective layers that can be allocated to each of Formulae (7) and (8). The stoichiometric proportions are sufficient to provide 16.7% $L_1$ layers (0.2/(1+0.2)=0.1667 or $\delta$ for $L_1$) having materials in equal percentages (8.335% each) of the empirical formula $(B_{0.09}B'_{0.91}O_4)^{3-}$ and $(B_{0.09}B'_{0.91}O_3)^{1-}$, or an average formula of $(B_{0.09}B'_{0.91}O_{3.5})^{2-}$. The 16.7% value can be obtained by adding to a pure $L_2$ precursor that contains one mole of $L_2$ materials or layers, a pure $L_1$ precursor that contains 0.2 moles of $l_1$ materials or layers (i.e., 0.2/(1+0.2) =0.1667). In this context, the 0.2 quantity is referred to herein as an "X value," and represents the quantity of a given L layer precursor that may be added to another L layer precursor to form a mixed layered superlattice material. The X value (e.g. 0.2) is different from the number of corresponding L layers or $\delta_1$ probability (e.g., 16.7%) in the mixed layered superlattice material. The $(B_{0.09}B'_{0.91}O_4)^{3-}$ materials follow Formula (7) with (m=1), (c=3m+1) and (V=3–), while the $(B_{0.09}B'_{0.91}O_3)^{1-}$ materials follow Formula (7) with (m=1) and (c=3m). The overall 2– charge is balanced by the $(Bi_2O_2)^{2+}$ layers. The stoichiometric proportions also provide for 83.3% $L_2$ dual octahedra thickness layers having an empirical formula $(AB_{0.18}B'_{1.82}O_7)^{2-}$ after Formula (8), with the subscripts indicating the corresponding $\alpha$ values for the metals of the $L_2$ layer according to Formula (6). The $\delta_1$ value is 0.167, and the $\delta_2$ value is 0.833 based upon the addition of (m=1) materials according to Formula (7). In the $L_1$ layer, $\alpha_1$ is 0.09 for the B metal and $\alpha_2$ is 0.91 for the B' metal based upon the amounts of B-site metals added. In the $L_2$ layer, $\alpha_1$ is 1.00 for A, $\alpha_2$ is 0.167 for B, and $\alpha_3$ is 1.667 for B'.

In particularly preferred forms of the invention, S is bismuth (Formula 9). The B-site metals are preferably selected from a B-site group consisting of titanium, tantalum, niobium, zirconium, vanadium, molybdenum, tungsten, and mixtures thereof. It is particularly preferred that the B-site metals, e.g., both B and B' (Formulae (7) and (8)), each have a valence or oxidation state of plus five. Tantalum and niobium are the most preferred elements for B and B'. It is particularly preferred that A and A' each have a charge of plus two, and are selected from an A-site group consisting of strontium, barium, lead, lanthanum, and calcium. Strontium is the most preferred element for A and A'. In instances where one of A or A' is not divalent, $Bi^{3+}$ is a preferred A-site cation.

Particularly preferred mixed layered superlattice materials include materials from the broad categories of strontium bismuth tantalate, strontium bismuth tantalum niobate, and strontium bismuth niobate according to the above Formulae (6)–(9). These preferred categories of materials broadly encompass specific materials that will form non-mixed layered superlattice materials having only one type of perovskite-like crystalline lattice. For example, Formula (3) $A_{m-1}S_2B_mO_{3m+3}$ permits the construction of $SrBi_2Ta_2O_9$ materials that have a repeating structure of $(Bi_2O_2)^{2+}$ $(SrTa_2O_7)^{2-}(Bi_2O_2)^{2+}(SrTa_2O_7)^{2-}$ . . . , where (n=2). This pure (n=2) material is not a mixed layered superlattice material.

The electrical properties of mixed layered superlattice materials can be adjusted by altering the $\delta$ probability values, as well as the $\alpha$ empirical portion values. For example, in the case of strontium bismuth tantalate, ferroelectric polarization can be optimized by adding to the pure $L_2$ materials an amount of $L_1$ materials ranging from about 10% to 30% of the total number of $L_1$ and $L_2$ layers, with the most preferred amount of $L_1$ layers added being about 20%. In the case of strontium bismuth niobium tantalate $L_1$ and $L_2$ materials, where the quantity of $L_1$ layers is adjusted by adding niobium metal in solution to a mixture of ingredients capable of yielding a pure (n=2) strontium bismuth tantalate, polarization is optimized by adding up to 50% $L_1$ materials with the most preferred amount of $L_1$ materials ranging from about 30% to about 40%.

As indicated above, the mixed layered superlattice materials are preferably made from special precursor solutions. These solutions are each a substantially homogenous liquid mixture having an A-site metal portion, a B-site metal portion, a superlattice-generator metal portion, and a solvent portion. The respective metal portions are mixed in effective amounts for spontaneously yielding, upon drying and annealing of the mixture, a solid layered superlattice material having a plurality of collated layers in a sequence of an A/B layer formed of an A/B ionic subunit cell structure, a superlattice-generator layer having a superlattice-generator ionic subunit cell structure, and a perovskite-like AB layer having a perovskite-like AB octahedral ionic subunit cell structure different from the A/B ionic subunit cell structure.

A single precursor solution preferably contains all of the metal moieties that are needed to form a mixed layered superlattice material after accounting for volatilization of metal moieties during the crystallization process. The A/B layer portion of the precursor solution is allocated to yielding a plurality of A/B ionic L layers having a formula according to Formula (7). The superlattice-generator portion is allocated to yielding superlattice-generator layers according to Formula (9). The perovskite-like AB portion is allocated to yielding perovskite-like AB ionic L layers according to Formula (8). In liquid solution, these respective layer portions need not have the complete amount of oxygen that will be necessary to form the final solid layers, because the additionally required oxygen can come from ambient oxygen during the anneal process.

It is sometimes observed that mixed layered superlattice precursors fail to spontaneously generate respective L layers of (m=1) and (n=2). In these instances, only (n=2) octahedra are formed, and the crystal grain boundaries are decorated with the (m=1) metals in a non-octahedral form. This phenomenon sometimes occurs under conditions outside of the preferred drying and annealing process conditions that are set forth below. Even so, these pure (n=2) materials with (m=1) decorated grains still provide excellent ferroelectric performance. It is believed that the (m=1) decorations serve to compensate for surface charge defects on the (n=2) grains. This charge compensation either prevents or reduces the magnitude of field-induced shielding at each (n=2) layer and, consequently, increases the overall polarizability. Accordingly, a feature of the invention is that a portion of Formula (1) which is allocable to an (m=1) type of L layer can increase polarizability and reduce fatigue regardless of whether the (m=1) portion actually forms a collated (m=1) octahedra structure.

The (m=1) octahedra structures are typically not ferroelectric at room temperatures because there is no A-site cation alignment to assist the ferroelectric effect. Even so, the addition of nonferroelectric (m=1) materials can serve to increase the overall polarizability of the ferroelectric layer. It is again theorized that the charge-compensating effect of (m=1) materials prevents or reduces the magnitude of shielding at each successive layer. In this manner, a relatively lower density of ferroelectric material in the mixed layered superlattice materials can provide a relatively greater polarization than do the non-mixed varieties of layered superlattice materials.

A preferred general processes for preparing polyoxyalkylated metal pre-precursors is provided in application Ser. No. 08/132,744 filed Oct. 6, 1993, which is hereby incorporated by reference herein to the same extent as though fully disclosed herein, and application Ser. No. 07/965,190, which is hereby incorporated by reference herein to the same extent as though fully disclosed herein. The processes preferably include reacting a metal with an alkoxide (e.g., 2-methoxyethanol) to form a metal alkoxide, and reacting the metal alkoxide with a carboxylate (e.g., 2-ethylhexanoate) to form a metal alkoxycarboxylate according to one of the generalized formulae:

(10)

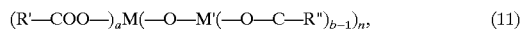

(11)

wherein M is a metal having an outer valence of (a+n) and M' is a metal having an outer valence of b, with M and M' preferably being selected from the group consisting of tantalum, calcium, bismuth, lead, yttrium, scandium, lanthanum, antimony, chromium, thallium, hafnium, tungsten, niobium, zirconium, vanadium, manganese, iron, cobalt, nickel, magnesium, molybdenum, strontium, barium, titanium, vanadium, and zinc; R and R' are respective alkyl groups preferably having from 4 to 9 carbon atoms and R" is an alkyl group preferably having from 3 to 8 carbon atoms. The latter formula, which has a central —O—M—O—M'—O— structure, is particularly preferred due to the formation in solution of at least 50% of the metal to oxygen bonds that will exist in the final solid metal oxide product. Similar —M—O—M'—O— structures are obtainable from reactions between metal alkoxycarboxylates and respective metal alkoxide or metal carboxylate reagents. These endothermic reactions are preferably driven to completion by distilling away reaction byproducts (alcohols and ethers) as well as any other contaminants having boiling points of less than 115° C., with 120° C. being more preferred, and 125° C. being most preferred. Elimination of these volatile moieties from solution advantageously reduces cracking and other defects in the final metal oxide films.

The liquid precursor that is used to form the thin film is preferably a metal alkoxide or metal carboxylate, and is most preferably a metal alkoxycarboxylate diluted with a xylene or octane solvent to a desired concentration. The use of an essentially anhydrous metal alkoxycarboxylate is particularly preferred due to the corresponding avoidance of water-induced polymerization or gelling, which can significantly reduce the shelf-life of solutions that contain alkoxide ligands. The presence of any hydrolysis-inducing moiety in solution is preferably avoided or minimized. Hydrolyzed precursors, such as conventional sol-gels, may also be utilized, but the increased sol-gel viscosity tends to impair the uniformity of thickness derived from the preferred spin-on application process, and the quality of the hydrolyzed solution tends to degrade rapidly with time. Therefore, made-ready hydrolyzed gels disadvantageously yield poor and inconsistent quality metal oxide films over a period of time.

The precursor solutions are designed to yield corresponding mixed layered superlattice materials, with the understanding that the formation of perovskite-like octahedra is thermodynamically favored where possible. Generally, in terms of the perovskite-like octahedra structure, equivalent site substitutions may be made between metal cations having substantially similar ionic radii, i.e. radii that vary no more than about 20%. These substitutions are made by adding the alternative metal moieties to the precursor solution.

The preferred ingredients of the precursor solutions include the preferred metals of the desired mixed layered superlattice material. The A-site portion is preferably formed by reacting with an alcohol or carboxylic acid at least one A-site element selected from an A-site group consisting of Ba, Bi, Sr, Pb, La, Ca, and mixtures thereof. The B-site portion is preferably produced by reacting with an alcohol or carboxylic acid at least one B-site element selected from a B-site group consisting of Zr, Ta, Mo, W, V, Nb, and mixtures thereof. The use of titanium as an equivalent radius B-site element, though possible, is less preferred in practice due to problems that derive from titanium diffusion into other integrated circuit components and point charge defects that arise from different valence states among the titanium ions.

Solvents that may be used to form the precursor include xylenes, 2-methoxyethanol, n-butyl acetate, n-dimethylformamide, 2-methoxyethyl acetate, methyl isobutyl ketone, methyl isoamyl ketone, isoamyl alcohol, cyclohexanone, 2-ethoxyethanol, 2-methoxyethyl ether, methyl butyl ketone, hexyl alcohol, 2-pentanol, ethyl butyrate, nitroethane, pyrimidine, 1,3,5 trioxane, isobutyl isobutyrate, isobutyl propionate, propyl propionate, ethyl lactate, n-butanol, n-pentanol, 3-pentanol, toluene, ethylbenzene, and octane as well as many others. These solvents may be used individually or they may be mixed as cosolvents. Preferred solvents include xylenes, n-octane, and n-butyl acetate.

The process of making the precursor solutions includes several different steps. The first step includes providing a plurality of polyoxyalkylated metals moieties including an A-site metal moiety, a B-site metal moiety, and a superlattice-generator metal moiety. It is to be understood that the terms "A-site metal" and "B-site metal" refer to metals that are suitable for use in a perovskite-like lattice, but do not actually occupy A-site and B-site positions in solution. The respective metal moieties are combined in effective amounts for yielding, upon crystallization of the precursor solution, a mixed layered superlattice material. The combining step preferably includes mixing the respective metal moieties to substantial homogeneity in a solvent, with the addition of a sufficient excess amount of at least one of the respective metal moieties to compensate for anticipated metal volatilization loss during formation of the mixed layered superlattice material. Bismuth moieties are prone to severe volatilization losses through sublimation, and a particularly preferred precursor design includes up to about fifteen percent more bismuth in the precursor than is desired from a stoichiometric standpoint in the final mixed layered superlattice material. The most preferred range of bismuth excess is from about five to ten percent.

Economies of scale can be gained by mixing a base stock of pre-precursor solution, e.g., one capable of forming a pure $L_2$ material, and preparing the final precursor solution by adding metal carboxylate or metal alkoxycarboxylate pre-precursor solutions to an aliquot of the base stock in the required proportions according to the empirical formulas. This process demands that the pre-precursor solutions must have an extended storage life. Accordingly, the shelf-life of the made-ready to apply precursors and pre-precursors can be extended indefinitely by distilling the pre-precursor solution as described above to eliminate water and byproducts of precursor-forming reactions, as well as other hydrolysis-inducing reagents. An additional step of extending the precursor storage life includes storing the solution under an inert atmosphere. Storage will preferably include maintaining the mixture at a temperature below about 60° C., due to the relative instability of bismuth precursor moieties. Furthermore, for the same reason, distillation will preferably occur after the step of adding the bismuth precursors.

A process of making integrated circuits according to the invention includes the manufacture of a precursor solution as described above, applying the precursor solution to a substrate, and treating the precursor solution on the substrate to form a mixed layered superlattice material. The treating step preferably includes heating the applied precursor solution in an oxygen atmosphere to a sufficient temperature for purposes of eliminating organic ligands from the solution and crystallizing residual metal moieties in a mixed layered superlattice structure. The use of a liquid precursor solution makes possible a low annealing temperature or temperature of crystallization that is useful in forming solid metal oxide thin-films of the desired layered superlattice materials for use in integrated circuits.

DETAILED DESCRIPTION OF THE PREFERRED EMBODIMENT

Figure 1:
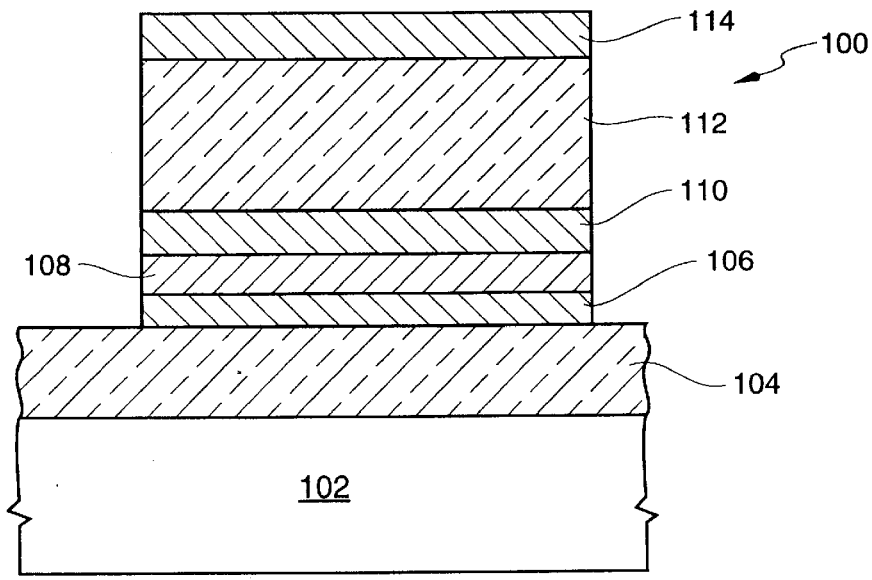
FIG. 1 depicts a thin-film ferroelectric capacitor formed of a mixed layered superlattice material according to the present invention.

FIG. 1 depicts a thin-film integrated circuit device, i.e., ferroelectric capacitor 100, according to the present invention. Thin-film capacitor 100 includes a silicon wafer 102, which may alternatively be any common type of integrated circuit substrate material such as GaAs or other materials. As will be understood by those skilled in the art, capacitor 100 is preferably formed on a single crystal or polycrystalline silicon wafer 102 having a thick layer 104 of silicon dioxide formed thereon by any conventional technique. Titanium adhesion layer 106 preferably has a thickness of about 200 Å, and is formed atop layer 104. Layer 106 is optionally followed by a titanium nitride diffusion barrier 108, which preferably has a thickness of about 800 to 1500 Å. First platinum electrode 110 is formed atop barrier 108, and preferably has a thickness of from about 1200 Å to 2500 Å. Metal oxide layer 112 is formed on electrode 110, and includes a mixed layered superlattice material that typically ranges in thickness from about 700 Å to about 2500 Å.

Second platinum or top electrode 114 is formed over metal oxide layer 112. Layers 106, 108, 110, and 114 are preferably produced through the use of conventional sputtering protocols such as radio frequency ("r.f.") sputtering. Electrodes 110 and 114 may be operably connected with conventional circuitry to form, for example, an improved ferroelectric capacitor component in a DRAM circuit having a polarization-switching ferroelectric memory cell including capacitor 100.

In the integrated circuit art, the silicon wafer 100 is often referred to as a "substrate." Herein, "substrate" may be used to refer to the silicon layer 100, but more generally will refer to any support for another layer. By way of example, the substrate for the metal oxide layer 112 is most immediately platinum first electrode 110, but also broadly includes layers 102, 104, 106, and 108.

Those skilled in the art will recognize that there exist many equivalent capacitor structures to capacitor 100. By way of example, other electrode metals and materials thicknesses may be used. Titanium adhesion layer 106 and barrier layer 108 may be eliminated or substituted with equivalent materials. Metalization layers 106, 108, and 110 may be entirely eliminated, and a contact hole (not depicted) may be cut through oxide layer 104. Substrate 102 may be doped to function as an electrode. Other layers of ferroelectric-compatible materials may be interposed between electrodes 110 and 114. Accordingly, while capacitor 100 depicts a preferred form of the present invention, the scope of the disclosure hereof pertains to alternative integrated circuit devices as well.

Ferroelectric capacitors like capacitor 100, which includes mixed layered superlattice materials 112, offer distinct advantages in comparison to conventional capacitors in volatile memory cells. For example, conventional DRAM memory cells utilize a thin-film dielectric capacitor that must be refreshed once every millisecond or so due to a charge depletion state that derives from the high leakage current of the conventional thin-film dielectric materials. In contrast, ferroelectric materials can be induced to switch polarization states in the presence of an applied field, and can retain the resulting switched state for extended periods of time even after the applied field is removed. A release or uptake of electric charge is typically observed when switching the ferroelectric material from or to a particular orientation. Mixed layered superlattice ferroelectric materials also typically have high dielectric constants that exceed the dielectric constants of the conventional silicon dioxide dielectric materials by a factor of ten or more. These features make ferroelectric capacitors according to the invention acceptable for use with conventional control logic, e.g., TTL control logic, in either the dielectric or ferroelectric mode. The ferroelectric switching mode is particularly preferred due to the extended period of memory retention.

As indicated above, the crystalline metal oxide of layer 112 is a mixed layered superlattice material. Copending U.S. patent application Ser. No. 07/965,190 filed Oct. 23, 1992 discloses that the layered superlattice materials discovered by G. A. Smolenskii, V. A. lsupov, and A. I. Agranovskaya (See Chapter 15 of the book, *Ferroelectrics and Related Materials*, ISSN 0275-9608, [V.3 of the series Ferroelectrics and Related Phenomena, 1984] edited by G. A. Smolenskii, especially sections 15.3–15) are far better suited for ferroelectric and high dielectric constant integrated circuit applications than any prior materials used for these applications. These layered superlattice materials comprise complex oxides of metals, such as strontium, calcium, barium, bismuth, cadmium, lead, titanium, tantalum, hafnium, tungsten, niobium, zirconium, bismuth, scandium, yttrium, lanthanum, antimony, chromium, and thallium that spontaneously form layered superlattices, i.e. crystalline lattices that include alternating layers of distinctly different sublattices, such as ferroelectric perovskite-like and non-ferroelectric sublattices. Generally, each layered superlattice material will include two or more of the above metals; for example, strontium, bismuth and tantalum form the layered superlattice material strontium bismuth tantalate, $SrBi_2Ta_2O_9$ (a pure $L_2$ material). Copending U.S. patent application Ser. No. 07/981,133, describes a method of fabricating layered superlattice thin films that have electronic properties several times better than the best prior materials.

It is possible to have mixed materials or those having layers of different m and n values in Formulae (3)–(9). For example, when Formula (3) is $A_{2.5}S_2B_{3.5}O_{14.25}$, the 3.5 value actually represents a 1:1 ratio mixture of $L_3$ and $L_4$ materials with the 1:1 ratio referring to respective quantities of $(A_2B_3O_{10.5})^{2-}$ $L_3$ layers according to Formula (7) and $(A_3B_4O_{14})^{2-}$ $L_4$ layers according to Formula (8). Thus, in Formula (6), δ is 0.5 or the quantity [1/(1+1)] for each of the $L_3$ and $L_4$ layers.

Figure 2:
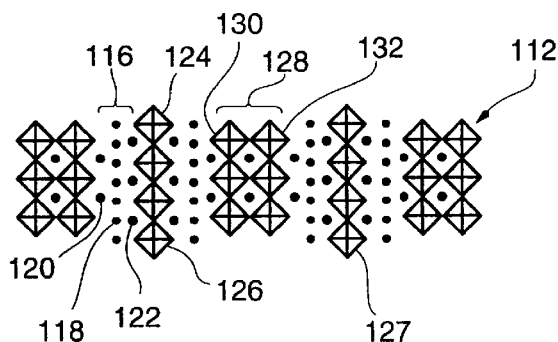
FIG. 2 depicts a mixed layered superlattice material having collated layers that are formed of different perovskite-like octahedra layers interrupted by a superlattice-generator layer, for use in the capacitor of FIG. 1.

FIG. 2 depicts a collated perovskite-like oxygen octahedral material for layer 112 according to Formula (6) for strontium bismuth tantalate, i.e., a mixed layered superlattice material 112 having a combination of $L_1$ and $L_2$-types of ionic layers. Layer 116 is a superlattice-generator layer having an empirical formula of $(Bi_2O_2)^{2+}$ and an approximate thickness in the amount of one oxygen ionic diameter 118 and two bismuth ionic diameters 120 and 122. Layer 124 is a $L_1$ layer having a thickness of one octahedral 126 and an average empirical formula of $(TaO_{3.5})^{2-}$ according to Formula (7). Layer 127 is yet another such $L_1$ layer. Layer 128 is a $L_2$ layer having a thickness of two octahedra 130 and 132 and an empirical formula of $(SrTa_2O_7)^{2+}$ according to Formula (8).

Figure 3:
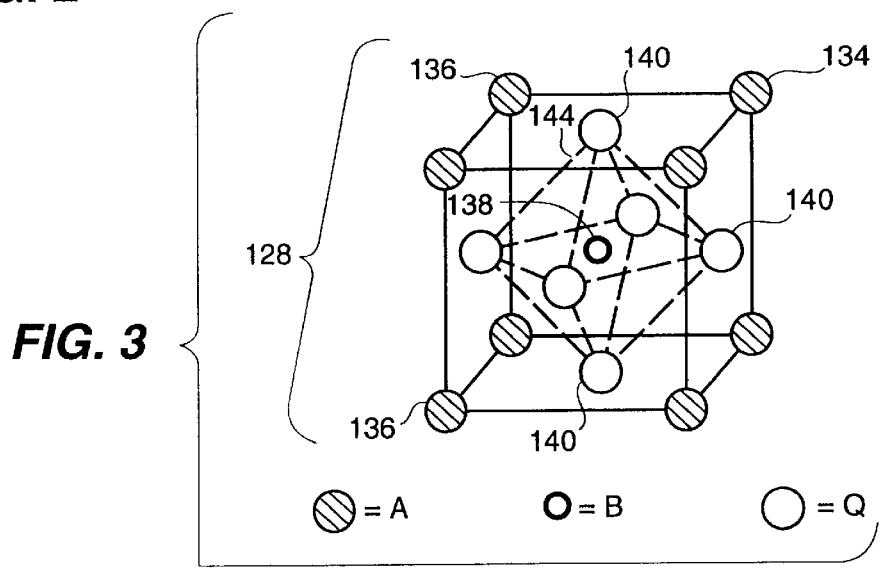
FIG. 3 depicts a partial perovskite-like ionic subunit cell corresponding to a layer having a thickness of two octahedra in the mixed layered superlattice material of FIG. 2.

FIG. 3 depicts $L_2$ layer 128 in more detail. A primitive perovskite-like partial subunit cell 134 is shown as conventionally represented in the literature. In this depiction, the perovskite-like structure is cubic, with the A-site cations 136 (also called the A-site elements) being located at the corners of the cube. These A-site elements are of relatively large size and small valence. The B-site cation 138, which is also called the B-site element, is located at the center of the cube and generally is an element of relatively small size and large valence. The anions 140, are located at the face centers of the cube.

Figure 4:
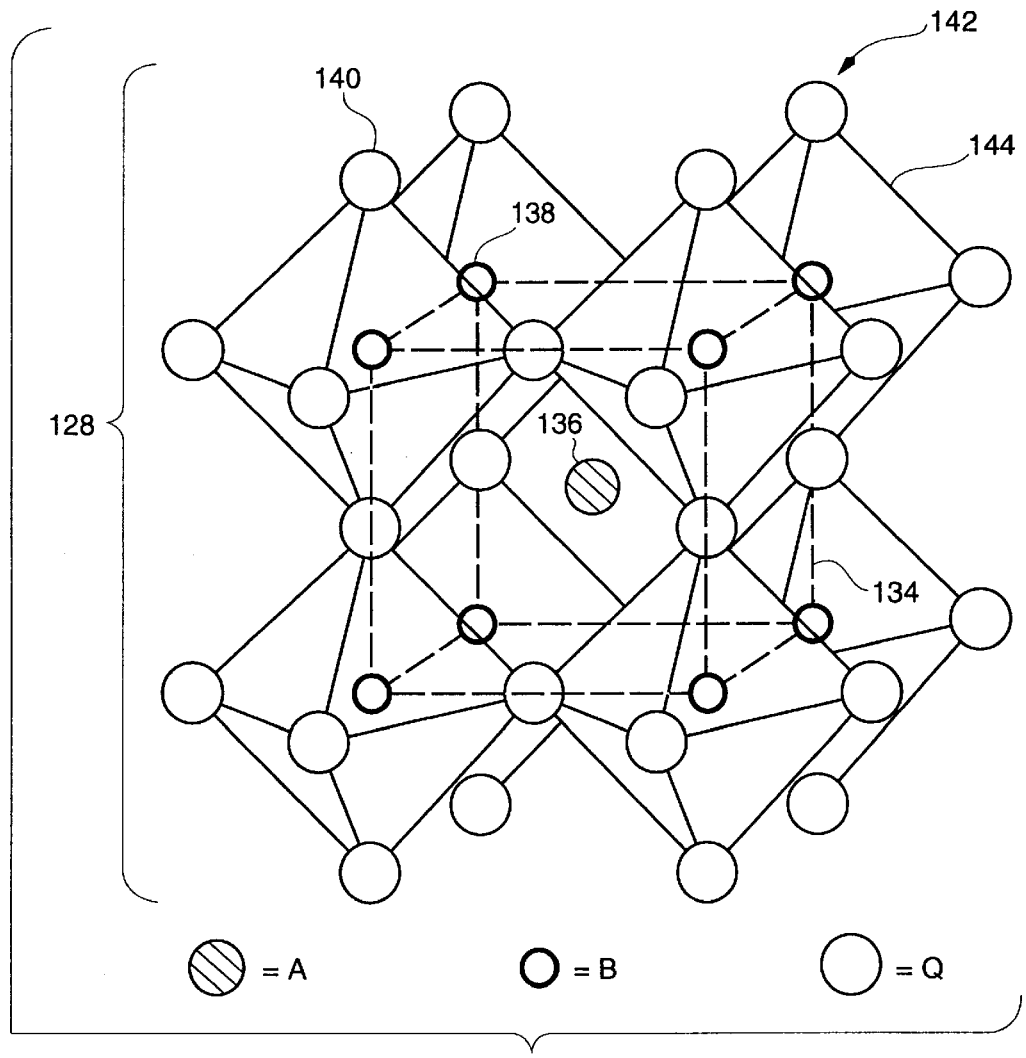
FIG. 4 depicts the perovskite-like ionic subunit cell of FIG. 3 and provides additional detail.

FIG. 4 provides yet another depiction of the $L_2$ AB layer 128. Cell 142 is a complete $L_2$ perovskite-like AB ionic subunit cell, which is not a primitive cell 134. Cell 142 is a quadruple octahedral perovskite-like structure that comprises a plurality of corner-linked octahedra 144, with the anions 140 at the corners of the respective octahedra 144. The quadruple octahedra structure has a thickness of two octahedra, hence, the designation $L_2$. The B cations 138 are at the centers of the octahedra 144, and the A cations 136 are located in the spaces between the octahedra 144. The primitive cube 134 is shown by dotted lines in FIG. 4, and the octahedral 144 is shown by doted lines in FIG. 3. From the depiction of the ionic subunit cell 142 in FIG. 4, it is easy to see how the octahedra 144, each having a dipole moment that causes the ferroelectric character of the material, can move slightly as the polarization switches the octahedral upper and lower "points" are attached to a material more flexible than the lattice of a ferroelectric material.

Figure 5:
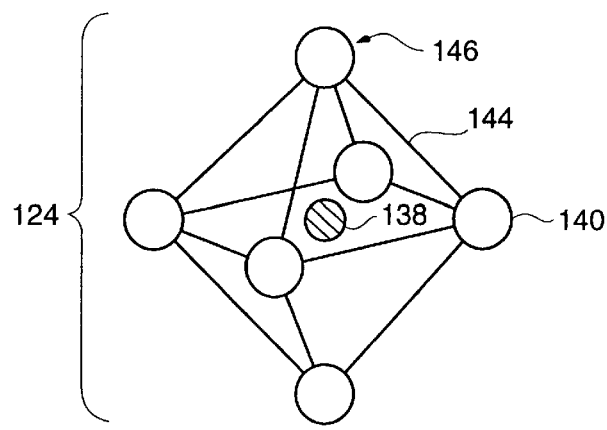
FIG. 5 depicts a perovskite-like ionic subunit cell corresponding to a layer having a thickness of one octahedral in the mixed layered superlattice material of FIG. 2.

FIG. 5 depicts a perovskite-like A/B subunit cell 146 for an $L_1$ material having a single octahedral structure 144 with a central B-site atom 138 and corner anions 140 for layer 124. In this case, no A-site atoms are present according to Formula (7) for (m=1).

Figure 6:
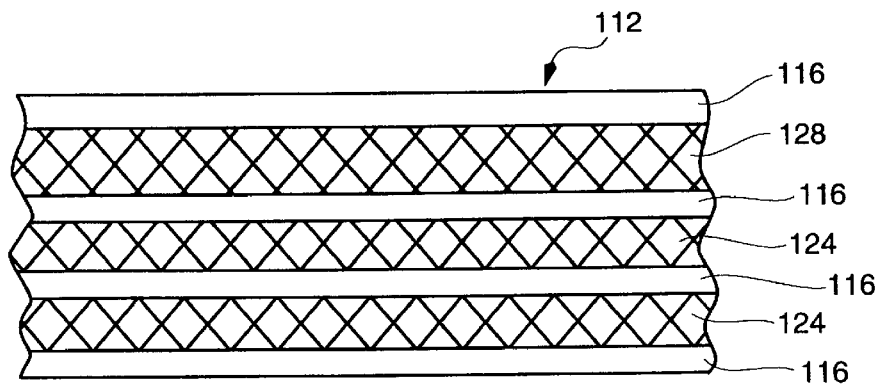
FIG. 6 depicts a mixed superlattice material having a collated layer construction, for use in the capacitor of FIG. 1.

FIG. 6 depicts the collated layer construction of mixed layered superlattice material layer 112. During annealing of a mixture of superlattice-forming elements, the $L_1$ layers 124 and $L_2$ layers 128 spontaneously generate into an alternating collated perovskite-like sublattice structure. The layers 124 and 128 are collated with superlattice-generator layers 116.

Figure 7:
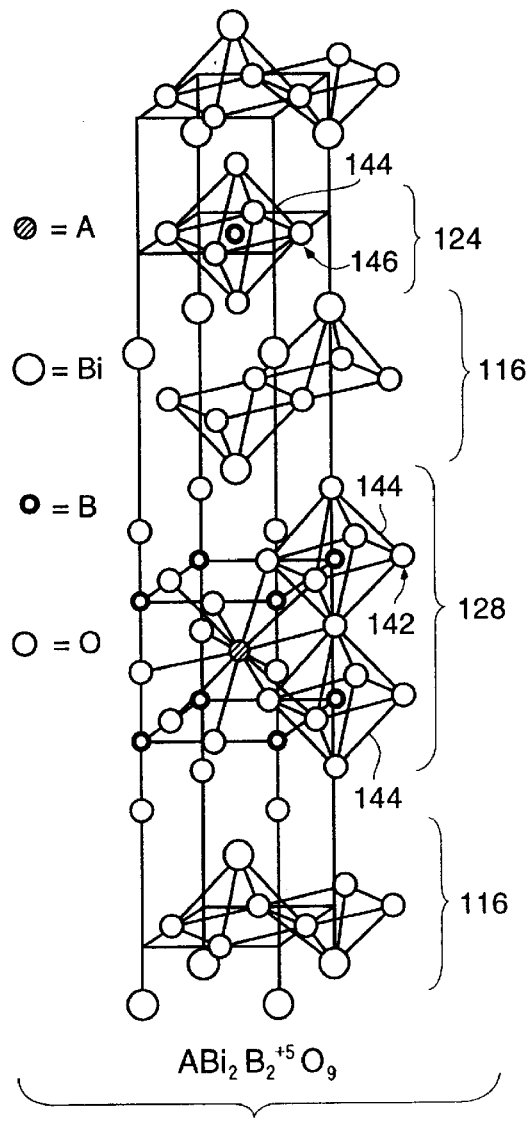
FIG. 7 depicts an exemplary unit cell that combines a plurality of perovskite-like octahedra structures interrupted by a superlattice-generator layers for use in the capacitor of FIG. 1.

As a further example of the mixed perovskite-like octahedra structure, FIG. 7 depicts a square-sectional view that is cut through a number of layer 112 subunit cells of the material $A_{0.5}^{+2}Bi_2B_{1.5}^{+5}O_{7.25}$, i.e., a mixed layered superlattice material having a 1:1 mixture of $L_1$ and $L_2$ materials with a pentavalent B-site element. Examples of these types of materials can include strontium bismuth tantalate and strontium bismuth niobate. In this structure, $L_1$ layer 124 is a single octahedral 144 in unit cell 146, and is separated by superlattice-generator layer 116 from the dual-octahedral thickness of quadruple-octahedral cell 142 in $L_2$ layer 128.

Figure 8:
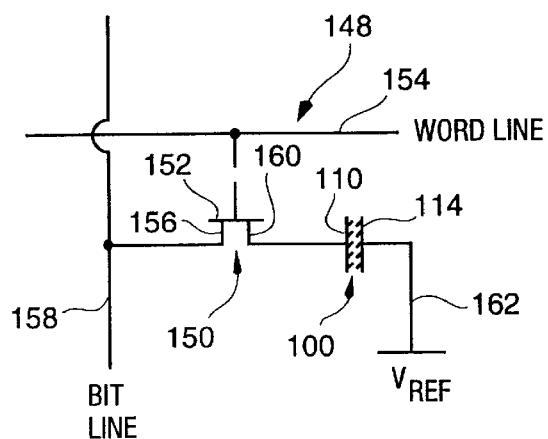
FIG. 8 depicts a schematic dynamic random access memory ("DRAM") circuit of a type that includes the ferroelectric capacitor of FIG. 1.

FIG. 8 depicts an improved ferroelectric DRAM circuit 148. Circuit 148 includes two electrically interconnected electrical devices: a transistor 150 and a ferroelectric switching capacitor 100. The gate 152 of transistor 150 is connected to word line 154. Source/drain 156 of transistor 150 is connected to bit line 158. The other source/drain 160 of transistor 150 is connected to electrode 110 of switching capacitor 100. The other electrode 114 of switching capacitor 100 is connected to reference voltage line 162. Circuit 140 operates in a conventional manner for ferroelectric DRAM cells.

Figure 9:
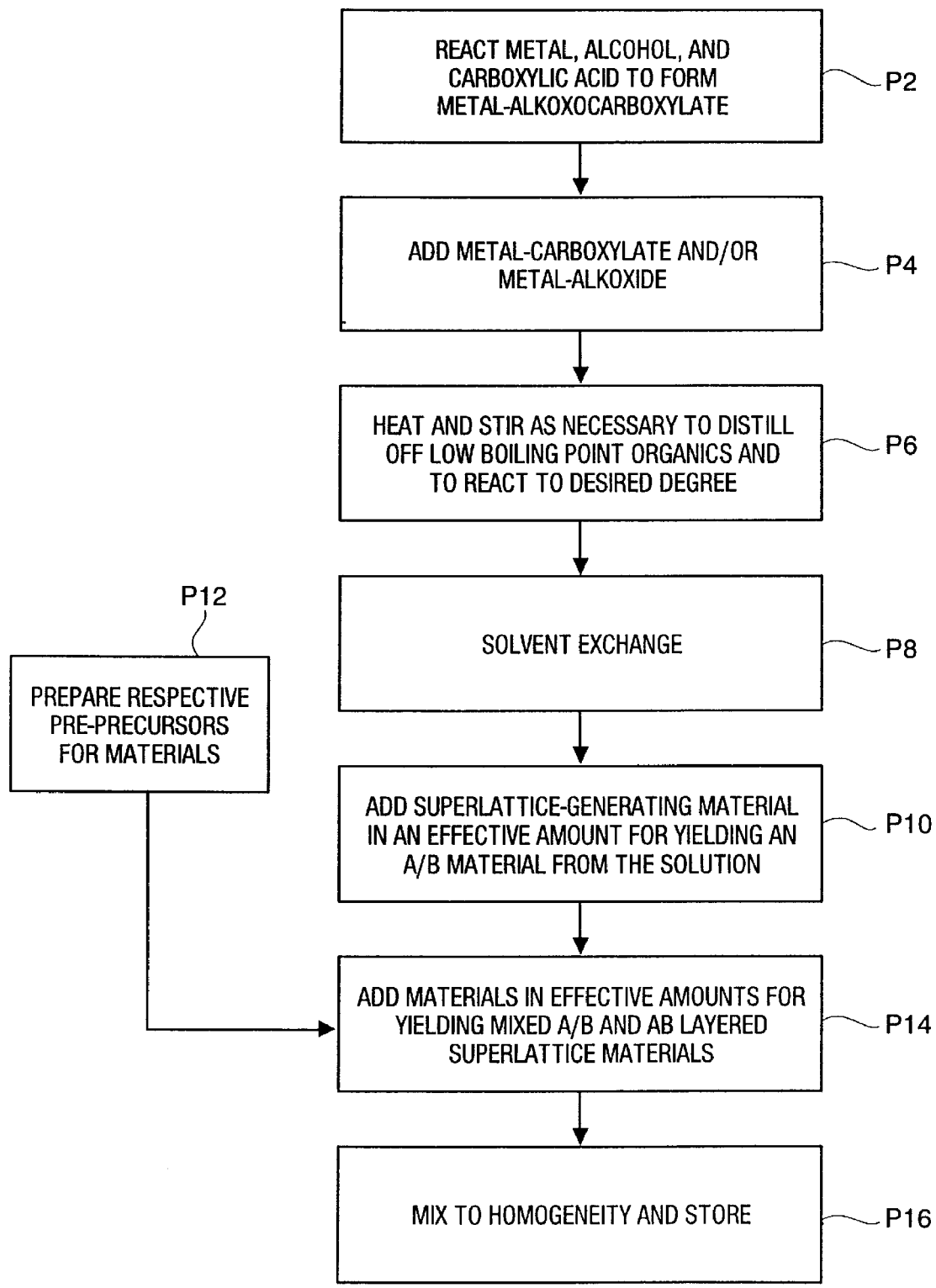
FIG. 9 depicts a process for making a precursor solution that is used to form a mixed layered superlattice material.

FIG. 9 depicts a flow chart of a generalized process according to the present invention for providing a liquid precursor solution to be used in forming layered superlattice materials. The word "precursor" is often used ambiguously in this art. It may mean a solution containing one metal that is to be mixed with other materials to form a final solution, or it may mean a solution containing several metals made-ready for application to a substrate. In this discussion we shall generally refer to the individual precursors in non-final form as "pre-precursors" and the precursor made-ready to apply as the "final precursor" or just "precursor," unless the meaning is clear from the context. In intermediate stages the solution may be referred to as the "intermediate precursor."

The preferred generalized reaction chemistry for the formation of liquid solutions of metal alkoxides, metal carboxylates, and metal alkoxycarboxylates for use in producing the initial metal precursor portions is as follows:

alkoxides —$M^{+n}$+n R—OH→M(—O—R)$_n$+n/2 $H_2$ (12)

carboxylates —$M^{+n}$+n(R—COOH)→M(—OOC—R)$_n$+n/2 $H_2$ (13)

alkoxycarboxylates —M(—O—R')$_n$+b R—COOH+heat→(R'—O—)$_{n-b}$M(—OOC—R)$_b$+b HOR, (14)

where M is a metal cation having a charge of n; b is a number of moles of carboxylic acid ranging from 0 to n; R' is preferably an alkyl group having from 4 to 15 carbon atoms and R is preferably an alkyl group having from 3 to 9 carbon atoms.

In step P2 a first metal, indicated by the term M or M' in the equations above, is reacted with an alcohol and a carboxylic acid to form a metal-alkoxycarboxylate pre-precursor. The process preferably includes reacting a metal with an alcohol (e.g., 2-methoxyethanol) to form a metal alkoxide according to Equation (12), and reacting the metal alkoxide with a carboxylic acid (e.g., 2-ethylhexanoic acid) to form a metal alkoxycarboxylate according to Equation (14). A reaction according to Equation (13) is also observed in the preferred mode when the unreacted metal is simultaneously combined with the alcohol and the carboxylic acid. The simultaneous reactions are preferably conducted in a reflux condenser that is heated by a hot plate having a temperature ranging from about 120° C. to about 200° C. over a period of time preferably ranging from one to two days to permit substitution of the alkoxide moieties by carboxylate ligands. At the end of the initial one to two day reaction period, the reflux condenser is preferably opened to atmosphere, and the solution temperature is monitored to observe a fractional distillation plateau that indicates the substantial elimination of all water and alcohol portions from the solution, i.e., a plateau exceeding at least about 100° C. (115° C., 120° C., or about 125° C. in increasing order of preference) at which time the solution is removed from the heat source.

In the above equations, the metal is preferably selected from the group consisting of tantalum, calcium, bismuth, lead, yttrium, scandium, lanthanum, antimony, chromium, thallium, hafnium, tungsten, niobium, zirconium, manganese, iron, cobalt, nickel, magnesium, molybdenum, strontium, barium, titanium, vanadium, and zinc. Alcohols that may be used preferably include 2-methoxyethanol, 1-butanol, 1-pentanol, 2-pentanol, 1-hexanol, 2-hexanol, 3-hexanol, 2-ethyl-1-butanol, 2-ethoxyethanol, and 2-methyl-1-pentanol, preferably 2-methoxyethanol. Carboxylic acids that may be used preferably include 2-ethylhexanoic acid, octanoic acid, and neodecanoic acid, preferably 2-ethylhexanoic acid.

The reactions of step P2 and subsequent steps are preferably facilitated by the use of a compatible solvent. Solvents that may be used include octane, xylenes, 2-methoxyethanol, n-butyl acetate, n-dimethylformamide, 2-methoxyethyl acetate, methyl isobutyl ketone, methyl isoamyl ketone, isoamyl alcohol, cyclohexanone, 2-ethoxyethanol, 2-methoxyethyl ether, methyl butyl ketone, hexyl alcohol, 2-pentanol, ethyl butyrate, nitroethane, pyrimidine, 1,3,5 trioxane, isobutyl isobutyrate, isobutyl propionate, propyl propionate, ethyl lactate, n-butanol, n-pentanol, 3-pentanol, toluene, ethylbenzene, and octane, as well as many others. These solvents preferably have boiling points exceeding that of water for purposes of distilling the precursor to eliminate water and other distillable moieties from solution prior to application of the precursor to a substrate. The cosolvents should be miscible with one another and may be compatibly mixed in differing proportions, especially between polar and apolar solvents, as needed to fully solubilize the precursor ingredients. Xylene and octane are particularly preferred apolar solvents, and n-butyl acetate is a particularly preferred polar cosolvent.

Portions of step P2 can be skipped in the event that intermediate metal reagents can be obtained in research grade purity. For example, where tantalum isobutoxide is available, it will only be preferred to substitute the isobutoxide moiety with an acceptable carboxylate ligand by reacting the metal alkoxide with a carboxylic acid such as 2-ethylhexanoic acid according to Equation (14).

In a typical second step, P4, a metal-carboxylate, a metal-alkoxide or both may be added to the metal-alkoxycarboxylate in effective amounts for yielding an intermediate precursor having a stoichiometrically balanced mixture of superlattice-forming metal moieties representative of a particular $L_k$ layer according to Formulae (6) and (8) of a majority-type perovskite-like octahedral structure. Despite the preference to have a complete stoichiometric balance according to Formulae (6)–(9), at this time the mixture will preferably exclude bismuth compounds, which will be added later due to their relatively greater thermal instability. Any of the metals listed above may be reacted with any of the carboxylic acids listed above to form the metal carboxylate, while any of the metals listed above may be reacted with any of the alcohols may form the alkoxide. It is particularly preferred to conduct this reaction in the presence of a slight excess carboxylic acid for purposes of partially substituting alkoxide ligands with carboxylate ligands.

In step P6 the mixture of metal-alkoxycarboxylates, metal-carboxylates and/or metal-alkoxides is heated and stirred as necessary to form metal-oxygen-metal bonds and boil off any low-boiling point organics that are produced by the reaction. According to a generalized reaction theory, if a metal-alkoxide is added to the metal-alkoxycarboxylate, and the solution is heated, the following reactions occur:

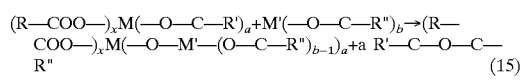

(15)

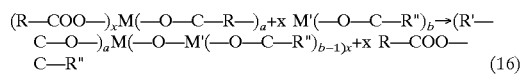

(16)

where M and M' are metals; R and R' are defined above; R" is an alkyl group preferably having from about zero to sixteen carbons; and a, b, and x are integers denoting relative quantities of corresponding substituents that satisfy the respective valence states of M and M'. Generally, the reaction of Equation (15) will predominate. Thus, ethers having low boiling points are generally formed. These ethers boil out of the pre-precursor to leave a final product having a reduced organic content and the metal-oxygen-metal bonds of the final desired metal oxide already partially formed. If the heating is sufficient, some of the reaction (16) will also occur, creating metal-oxygen-metal bonds and esters. Esters generally have higher boiling points and remain in solution. These high boiling point organics slow down the drying process after the final precursor is applied to a substrate, which tends to reduce cracking and defects; thus, in either case, metal-oxygen-metal bonds are formed and the final precursor performance is improved.

If a metal-carboxylate is added to the metal-alkoxycarboxylate and the mixture is heated, the following reaction occurs:

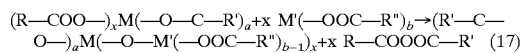
(17)

where R—COOOC—R' is an acid anhydride, and the terms are as defined above. This reaction requires considerably more heat than do the reactions (15) and (16) above, and proceeds at a much slower rate. The reaction products of equations (14)–(17) can be heated with excess carboxylic acid to further substitute carboxylate ligands for alkoxide ligands, thereby reducing the hydrolyzing ability of the carboxylated products and increasing precursor shelf life.

In addition to the above reactions which produce metal-alkoxycarboxylates, reactions occur such as:

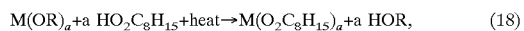
$M(OR)_a + a\ HO_2C_8H_{15} + heat \rightarrow M(O_2C_8H_{15})_a + a\ HOR,$ (18)

where the terms are as defined above. This reaction, with heating in the presence of excess carboxylic acid, substitutes the alkoxide part of the intermediate metal-alkoxycarboxylate to form a substantially full carboxylate;

however, it is now believed that a complete substitution of the alkoxides by the carboxylates does not occur with the parameters as disclosed herein. Full substitution of the carboxylates requires significantly more heating, and even then may not readily occur.

At the end of step P6, it is preferable to have formed in solution at least 50% of the metal to oxygen bonds of the final L metal oxide. The reactions are preferably conducted in a vessel that is open to atmospheric pressure and is heated by a hot plate preferably having a temperature ranging from about 120° C. to about 200° C. until the solution temperature is monitored to observe a fractional distillation plateau that indicates the substantial elimination of all water, alcohol, ether, and other reaction byproduct portions from the solution, i.e., a plateau at least exceeding 100° C. as before. At this time, extended refluxing can produce a potentially undesirable amount of an ester or acid anhydride byproduct that is often difficult to remove from the solution by fractional distillation. The potential complication of an excessive acid anhydride concentration can be entirely avoided by adding only metal carboxylates in step P4. The reactions are driven to substantial completeness by the elimination of the distillable moieties (reaction byproducts) from solution. Termination of the reaction is indicated by a rise in the distillation plateau temperature, as well as a decrease in the rate of condensate accumulation, if monitored.

Step P8 is an optional solvent exchange step. The use of a common solvent in a variety of precursor solutions having equivalent combined molarities of superlattice material-forming metals is advantageous due to the predictability of fluid parameters such as viscosity and adhesion tension, which influence the thickness of the liquid precursor film after it is applied to a substrate. These fluid parameters also affect the quality and the electrical performance of the corresponding metal oxide film after annealing of the dried precursor residue. In step P8, the standard solvent, which is preferably xylenes or n-octane, is added in an amount that is appropriate to adjust the intermediate precursor to a desired molarity of superlattice ingredients. This molarity preferably ranges from about 0.100M to about 0.400M determined as moles of the stoichiometric empirical formula for the mixed layered superlattice material with the superlattice generating element normalized to a value of 2, and is most preferably about 0.200M. After the addition of the standard solvent, the solution is heated to a temperature that is sufficient to distill away any non-standard solvents and leave a solution having the desired molarity.

Step P10 includes adding the superlattice-generator material to the solution derived from step P8. Bismuth ($Bi^{3+}$) is the most preferred superlattice-generator element, and the bismuth pre-precursor will most preferably be bismuth tri-2-ethylhexanoate. The addition of bismuth pre-precursors subsequent to the heating of step P8 is preferred due to the relative instability of these pre-precursors, i.e., substantial heating could disrupt coordinate bonds with potential deleterious effects upon the ability of the solution to yield superior thin-film metal oxides. It should be understood that step P10 is optional in the sense that bismuth pre-precursors can often be added in any of steps P2, P4, P10 and P14 without problems. Additionally, it should be understood that bismuth can also function as an A-site metal in the perovskite-like octahedral structure.

Special problems exist with regard to the potential for bismuth volatilization during heating of the precursor solution and, especially, during high temperature annealing of the dried precursor residue to form a layered superlattice material of the desired stoichiometric proportions. Accordingly, in step P10, it is preferred to add from about 5% to about 15% excess bismuth for purposes of compensating the precursor solution for anticipated bismuth losses. At annealing temperatures ranging from about 600° C. to about 850° C. for a period of about one hour, this excess bismuth moiety in the precursor solution will typically range from 5% to 9% of the proportional amount that is required for a stoichiometrically balanced layered superlattice product. In the event that the excess bismuth is not fully volatilized during the formation of a metal oxide product, the remaining excess bismuth moiety can act as an A-site material and, thus, induce point defects in the resulting layered superlattice crystal. The additional bismuth can cause such defects by functioning as an A-site material to convert a corresponding portion of the $L_1$ material into a $L_2$ material having a lattice defect corresponding to the additional bismuth electron ($Bi^{3+}$ versus $Sr_{2+}$).

Step P12 includes the preparation of pre-precursor solutions for use in forming $L_k$ materials that have different numbers of interconnected octahedra structures than those of the intermediate precursor derived from step P8. The preparation of these second $L_k$ layer-types of materials essentially follows the procedure of steps P2 through P8, but it is also possible to simply combine metal alkoxides and metal carboxylates in the correct proportions. Due to the possibility of diluting the solution derived from step P8 to an unacceptable level, it is preferred that the respective step P12 pre-precursors have a greater concentration in a common solvent than the step P8 intermediate precursor. For example, the step P12 pre-precursors may have a concentration in xylenes of 0.400M when the step P8 intermediate precursor has a 0.200M concentration.

Step P14 includes adding portions of the respective pre-precursors from step P12 to the solution derived from step P8. The resultant mixture will preferably have a stoichiometric balance of metal moieties that reflects the relative proportions of metals which are required to form a $L_1$ and $L_2$ mixed layered superlattice material according to Formula (6).

In step P16, the solution is diluted with an organic solvent to produce a final precursor having the desired concentration of superlattice-forming metal moieties, with a concentration of from 0.100M to 0.500M being preferred for the corresponding fluid characteristics such as viscosity and adhesion tension. Note that the conventional designation M stands for molarity, but is used herein to have a slightly different meaning. Depending upon environmental factors, a crystal lattice can grow to indefinite sizes by interconnecting any number of unit cells in crystal grains or "molecules," hence, concentration is better expressed in terms of an average empirical formula. The difference between an empirical formula and a molecular formula is that, while the empirical formula includes all of the molecular ingredients in their correct proportions, the empirical formula does not necessarily provide the exact portions which are required to form a complete molecule. Where the empirical formula can be expressed in terms of fractional numbers, there arises a question of exactly what constitutes one 'mole' or unit of the empirical formula. The 'molar' concentration of the empirical formula is hereby defined as counting the number of metal oxide units having the empirical formula that can be obtained from the metals in one liter of solution, with the elements of the empirical formula having their formula portions adjusted by a fixed ratio multiplier to arrive at a superlattice-generator metal with a subscript of two, i.e., $S_2$.

The solution is mixed to substantial homogeneity, and is preferably stored under an inert atmosphere of desiccated nitrogen or argon if the final solution will not be consumed within several days or weeks. This precaution in storage serves to assure that the solutions are kept essentially water-free and avoids the deleterious effects of water-induced polymerization, viscous gelling, and precipitation of metallic moieties that water can induce in alkoxide ligands. Even so, the desiccated inert storage precaution is not strictly necessary when the precursor, as is preferred, primarily consists of metals bonded to carboxylate ligands and alkoxycarboxylates.

The use of liquid final precursors having molecules according to the —M—O—M—O— type reaction products of Formulae (15)–(17) is most preferred due to the resultant high quality of metal oxide films. The solutions may also be made by mixing metal alkoxides, metal carboxylates, and metal alkoxycarboxylates in any proportion. The final precursor solution will contain various polyoxyalkylated metals in a stoichiometric balance capable of forming the desired mixed layered superlattice material after accounting for element-specific evaporation or sublimation losses in the manufacturing process.

The exemplary discussion of the reaction process, as given above, above is generalized and, therefore, non-limiting. The specific reactions that occur depend on the metals, alcohols, and carboxylic acids used, as well as the amount of heat that is applied. Detailed examples will be given below.

The order of steps P2–P16 is important in a preferred sense; however, various steps may be combined, added, or skipped altogether. Steps P2–P10 together permit the production of a large batch of $L_2$ precursor solution that may be subdivided for further production of mixed $L_1$ and $L_2$ layered superlattice materials. Thus, a manufacturing facility can benefit from the economy of scale in producing a relatively large batch of precursor solution for multiple uses. Step P14 may be combined with step P6 in the event that this economy of scale is not desired.

Figure 10:
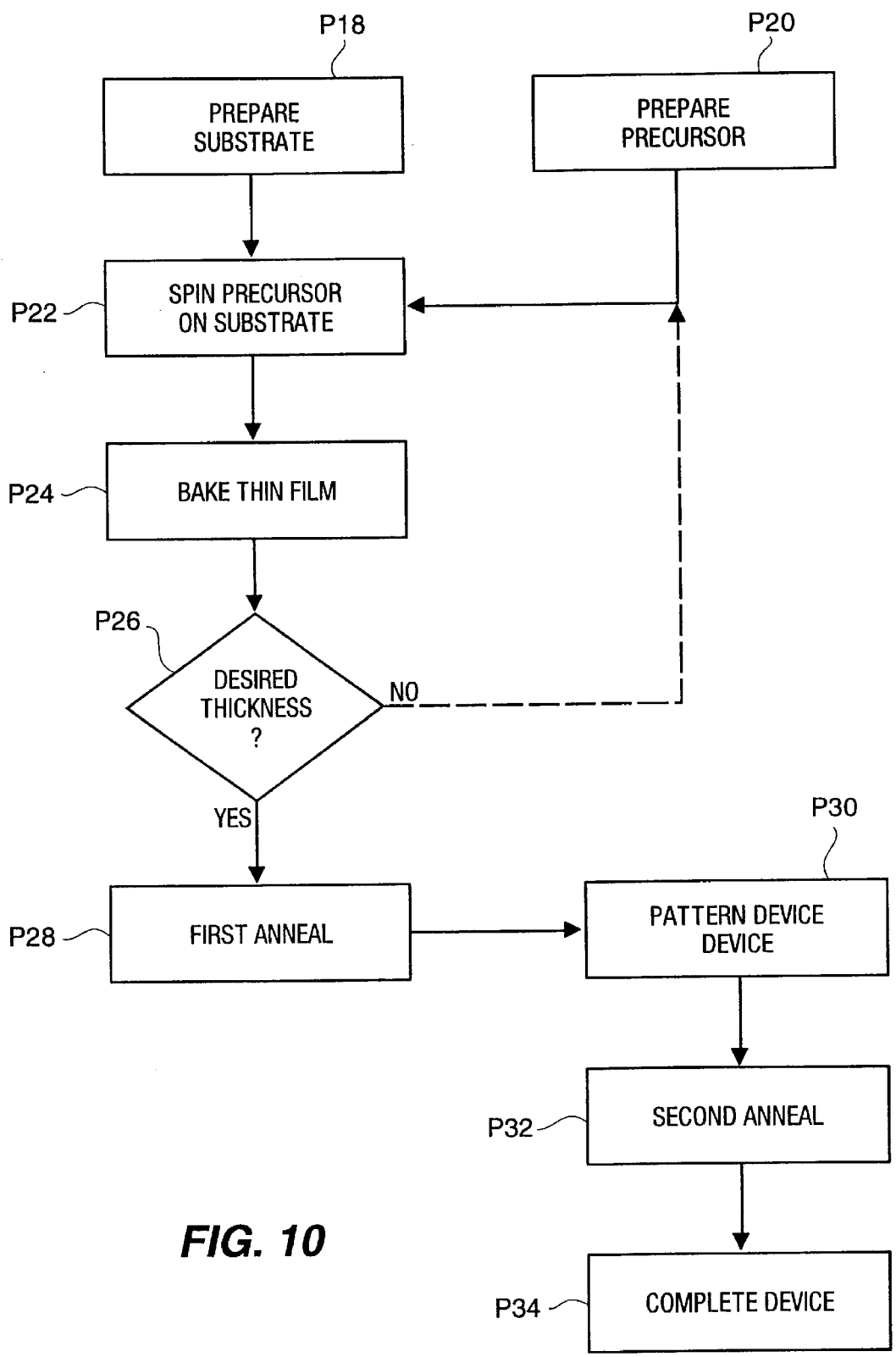
FIG. 10 depicts a process for using the precursor solution derived from the process of FIG. 9 to form an integrated circuit device such as the ferroelectric capacitor of FIG. 1.

FIG. 10 depicts a flow chart of a process for fabricating capacitor 100 of the present invention. The process shall be discussed in terms of the embodiment of FIG. 1, but those skilled in the art will understand its applicability to other embodiments.

In step P18, titanium adhesion layer 106, titanium nitride layer 108, and first platinum electrode 110 are successively sputtered into place and annealed according to conventional protocols, as are known in the art. For example, these protocols may include r.f. sputtering and diffusion furnace annealing in a ramped temperature profile up to about 1100° C. The resultant substrate is annealed and/or prebaked for purposes of preparing the uppermost surface of electrode 110 for subsequent process steps.

In step P20, a final precursor is prepared as in FIG. 9. An aliquot of this precursor is taken, and may at this time be doped to a desired level with an appropriate metal pre-precursor. Particularly preferred dopants include any of the A or B-site metals.

In step P22, the precursor solution from step P20 is applied to the substrate from step P18, which presents the uppermost surface of electrode 110. This application is preferably conducted by dropping the liquid precursor solution at ambient temperature and pressure onto the uppermost surface of electrode 110 and then spinning substrate 110 at up to about 2000 RPM for about 30 seconds to remove any excess solution and leave a thin-film liquid residue. The most preferred spin velocity is 1500 RPM. Alternatively, the liquid precursor may be applied by a misted deposition technique, such as the technique described in copending application Ser. No. 07/993,380, which is hereby incorporated by reference herein to the same extent as though fully disclosed herein.

In steps P24 and P28, the precursor is thermally treated to form a solid metal oxide having a mixed layered superlattice structure, i.e., layer 112 on electrode 110. This treating step is conducted by drying and annealing the result of step P22. In step P24, the precursor is dried on a hot plate in a dry air atmosphere and at a temperature of from about 200° C. to 500° C. for a sufficient time duration to remove substantially all of the organic materials from the liquid thin film and leave a dried metal oxide residue. This period of time is preferably from about one minute to about thirty minutes. A 400° C. drying temperature for a duration of about two to ten minutes in air is most preferred. This high temperature drying step is essential in obtaining predictable or repeatable electronic properties in the crystalline compositions to be derived from step P28.

In step P26, if the resulting dried film is not of the desired thickness, then steps P22 and P24 are repeated until the desired thickness is attained. A thickness of about 1800 Å typically requires two coats of a 0.130M solution under the parameters disclosed herein.

In step P28, the dried precursor is annealed to form the layered superlattice material of layer 112. This annealing step is referred to as the first anneal to distinguish it from a later annealing step. The first anneal is preferably performed in oxygen at a temperature of from 500° C. to 1000° C. for a time from 30 minutes to 2 hours. Step P28 is more preferably performed at from 750° C. to 850° C. for 80 minutes, with the most preferred anneal temperature being about 800° C. The first anneal of step P28 preferably occurs in an oxygen atmosphere in an 80 minute push/pull process including 5 minutes for the "push" into the furnace and 5 minutes for the "pull" out of the furnace. The indicated anneal times include the time that is used to create thermal ramps into and out of the furnace. In a commercial manufacturing process, it will be necessary to provide careful control of the annealing temperatures and times for purposes of providing consistent and reproducible results in terms of the electronic performance of capacitor 100.

Steps P24 and P28 may also be conduced according to a rapid thermal processing ("RTP") technique. Generally, this procedure includes the use of electromagnetic radiation from a conventional radiation source. Additionally, ultraviolet ("UV") radiation, such as can be obtained from a deuterium lamp, can be used in the drying step to improve the qualities of the final metal oxide film. It is believed that the application of UV light during the drying and/or first annealing steps can serve to orient the crystalline growth of layered superlattice materials along a given axis. It is sometimes observed that superlattice materials formed from these RTP-derived oriented crystals exhibit superior electrical performance. In particular, various electrical performance parameters of the final metal oxide, such as polarization magnitude, switching speed, and leakage current performance, can sometimes be improved if drying step 28 is conducted by drying the precursor film under ultraviolet light according to the indicated time and temperature parameters. This UV application may be conducted simultaneously with heating on the hot plate. Other thermal treating options may comprise exposing the liquid thin film to a vacuum for drying in step P24, or a combination of furnace baking and UV baking procedures.

In step P30, a second electrode 114 is deposited by sputtering. The device is then patterned by a conventional photoetching process including the application of a photoresist followed by ion etching, as will be understood by those skilled in the art. This patterning preferably occurs before the second annealing step P32 so that the second anneal will serve to remove patterning stresses from capacitor 100 and correct any oxide defects that are created by the patterning procedure.

The second annealing step, P32, is preferably conducted in like manner with the first anneal in step P28, taking care not to vary the annealing temperature by an amount greater than a small temperature range of from about 50° C. to 100° C. with respect to the first (e.g., 800° C.) annealing temperature. The time for the second anneal is preferably from about twenty to ninety minutes in duration, and a duration of about 30 minutes is most preferred.

Finally, in step P34 the device is completed and evaluated. The completion may entail the deposition of additional layers, ion etching of contact holes, and other conventional procedures, as will be understood by those skilled in the art. Wafer 102 may be sawed into separate units to separate a plurality of integrated circuit devices that have been simultaneously produced thereon.

The following non-limiting examples set forth preferred materials and methods for practicing the invention hereof.

EXAMPLE 1

LIQUID PRE-PRECURSOR SOLUTION FOR USE IN FORMING A L$_2$ STRONTIUM BISMUTH TANTALATE LAYERED SUPERLATTICE MATERIAL

The precursor ingredients of Table 1 were obtained from the indicated commercial sources and subdivided to obtain the portions shown.

TABLE 1

| Ingredient | Formula Weight (g/mol) | Grams | mmole | Molar Equiv. | Vendor |
|---|---|---|---|---|---|
| tantalum pentabutoxide Ta(OC$_4$H$_9$)$_5$ | 546.52 | 43.722 | 80.001 | 2.0000 | Vnipim |
| 2-ethylhexanoic acid | 144.21 | 72.684 | 504.01 | 12.600 | Aldrich |
| strontium | 87.62 | 3.5048 | 40.000 | 1.0000 | Strem |
| bismuth tri-2-ethylhexanoate (in naphtha) Bi(O$_2$C$_6$H$_{11}$)$_5$ | (765.50) | 64.302 | 84.000 | 2.1000 | Strem |

The tantalum pentabutoxide and 2-ethylhexanoic acid were placed in a 250 ml Erlenmeyer flask with 40 ml of xylenes, i.e., about 50 ml xylenes for each 100 mmol of tantalum. The flask was covered with a 50 ml beaker to assist in refluxing and to isolate the contents from atmospheric water. The mixture was refluxed with magnetic stirring on a 160° C. hot plate for 48 hours to form a substantially homogenous solution including butanol and tantalum 2-ethylhexanoate. It should be understood that the butoxide moiety in solution was almost completely substituted by the 2-ethylhexanoic acid, but full substitution did not occur within the heating parameters of this example. At the expiration of 48 hours, the 50 ml beaker was removed and the hot plate temperature was then raised to 200° C. for distillation of the butanol fraction and water to eliminate the same from solution. The flask was removed from the hot plate when the solution first reached a temperature of 124° C., which indicated that substantially all butanol, ether, and water had exited the solution. The flask and its contents were cooled to room temperature.

The strontium and 50 ml of 2-methoxyethanol solvent were added to the cooled mixture for reaction to form strontium di-2-ethylhexanoate. A 100 ml portion of xylenes was added to the strontium mixture, and the flask and its contents were returned to the hot plate at 200° C. and refluxed for five hours with the 50 ml beaker again in place for reaction to form a predominant tantalum-strontium alkoxycarboxylate product according to Formula (11). The beaker was removed and the solution temperature was allowed to rise to 125° C. for elimination of the 2-methoxyethanol solvent from solution, as well as any ethers, alcohols, or water in solution. After removal from the heat source, the flask was permitted to cool to room temperature. The bismuth tri-2-ethylhexanoate was added to the cooled solution, which was further diluted to 200 ml with xylenes to form a pre-precursor solution that was capable of forming 0.200 moles of SrBi$_{2.1}$Ta$_2$O$_{9.15}$ per liter in the absence of bismuth volatilization.

The precursor formulation was designed to compensate for anticipated bismuth volatilization during a process of manufacturing solid metal oxides from the liquid precursor. Specifically, the Bi$_{2.10}$ moiety included an approximate five percent excess (0.10) bismuth portion. After accounting for the anticipated bismuth volatilization during the forthcoming annealing steps, the pre-precursor solution would be expected to yield a stoichiometric n=2 material according to Formula (3), i.e., 0.2 moles of SrBi$_2$Ta$_2$O$_9$ per liter of solution.

EXAMPLE 2

PREPARATION OF A PRE-PRECURSOR SOLUTION CONTAINING TANTALUM 2-ETHYLHEXANOATE IN XYLENES

The ingredients of Table 2 were purchased from commercial sources and subdivided to obtain the portions shown.

TABLE 2

| Ingredient | Formula Weight (g/mol) | Grams | mmole | Vendor |
|---|---|---|---|---|
| tantalum pentabutoxide Ta(OC$_4$H$_9$)$_5$ | 546.52 | 22.888 | 48.040 | Vnipim |
| 2-ethylhexanoic acid | 144.21 | 36.373 | 252.22 | Aldrich |

The tantalum pentabutoxide and 2-ethylhexanoic acid were placed in a 250 ml Erlenmeyer flask with 30 ml of xylenes. The flask was covered with a 50 ml beaker to assist in refluxing and to isolate the contents from atmospheric water. The mixture was refluxed with stirring on a 160° C. hot plate for 48 hours to form a substantially homogenous solution including butanol and tantalum 2-ethylhexanoate. The butoxide moiety in solution was almost completely substituted by the 2-ethylhexanoic acid, but full substitution did not occur within the heating parameters of this example. At the expiration of 48 hours, the 50 ml beaker was removed and the hot plate temperature was then raised to 200° C. for distillation to eliminate the butanol from solution. Accordingly, the flask was removed from the hot plate when the solution first reached a temperature of 124° C. The flask and its contents were cooled to room temperature. Xylenes were added to the hot solution to dilute the same to a normality of 0.4 mmol tantalum per gram of solution, and the solution was removed from the heat for cooling to room temperature.

EXAMPLE 3

PREPARATION OF A PRE-PRECURSOR SOLUTION CONTAINING BISMUTH 2-ETHYLHEXANOATE IN XYLENES AND NAPHTHA

The ingredients of Table 3 were purchased from commercial sources and subdivided to obtain the portions shown.

TABLE 3

| Ingredient | Formula Weight (g/mol) | Grams | mmole | Vendor |
|---|---|---|---|---|
| bismuth tri-2-ethylhexa-noate (in naphtha) $Bi(O_2C_6H_{11})_5$ | (765.50) | 66.752 | 87.201 | Strem |

The bismuth tri-2-ethylhexanoate in naphtha was poured into a 250 ml Erlenmeyer flask and mixed with xylenes to a normality of 0.4 mmoles of bismuth per gram of solution. The mixture was swirled in the flask to substantial homogeneity. No supplemental heating was provided due to the potential for disrupting bonds between the bismuth atoms and their corresponding carboxylate ligands.

EXAMPLE 4

PREPARATION OF A PRE-PRECURSOR SOLUTION CONTAINING NIOBIUM 2-ETHYLHEXANOATE IN XYLENES

TABLE 4

| Ingredient | Formula Weight (g/mol) | Grams | mmole | Vendor |
|---|---|---|---|---|
| niobium penta-2-ethylh-exanoate (in xylenes) $Nb(O_2C_6H_{11})_5$ | (1,105.3) | 39.739 | 87.201 | Vnipim |

The niobium penta-2-ethylhexanoate in xylenes was poured into a 250 ml Erlenmeyer flask and mixed with additional xylenes to a normality of 0.4 mmoles per gram of solution. The mixture was swirled in the flask to substantial homogeneity without heating.

EXAMPLE 5

PREPARATION OF A STRONTIUM BISMUTH TANTALATE LIQUID PRECURSOR SOLUTION DESIGNED TO FORM MIXED COLLATED $L_1$ and $L_2$ LAYERED SUPERLATTICE MATERIALS A strontium bismuth tantalate precursor solution including relative proportions of ingredients capable of forming 83% strontium tantalate $L_2$ and 17% tantalate $L_1$ metal oxide portions was prepared using the pre-precursor solutions of previous examples. A 2 ml aliquot of the 0.200M precursor solution from Example 1 was placed in a 250 ml Erlenmeyer flask, i.e., a sufficient volume of precursor to yield 0.4 mmoles of $SrBi_2Ta_2O_9$. A 0.210 g aliquot of the bismuth 2-ethylhexanoate solution from Example 3 (0.4 mmol $Bi^{3+}$/g) was also added to the flask, as was a 0.100 g aliquot of the tantalum 2-ethylhexanoate solution of Example 2 (0.4 mmol $Ta^{5+}$/g). The combined ingredients were swirled in the flask to a homogenous state. It should be noted that mixing of the combined precursor solutions from the various examples was facilitated by the use of a common xylenes solvent. The resultant mixture included a 5% excess bismuth moiety to account for bismuth volatilization during subsequent high-temperature annealing processes that would yield a solid metal oxide.

The relative proportions of ingredients in the precursor solution were designed, upon annealing of the dried precursor residue, to yield a solid mixed layered superlattice material having an empirical formula of $Sr_{0.833}Bi_2Ta_{1.833}O_{8.417}$. This material included a plurality of $L_1$, $L_2$, and G collated layers, namely, $(Bi_2O_2)^{2+}$ superlattice-generator layers according to Formula (9), 83% $(SrTa_2O_7)^{2-}$ $L_2$ layers according to Formula (8), and 17% $(TaO_{3.5})^{2-}$ $L_1$ layers according to Formula (7). These formulae did not account for the excess bismuth moiety in solution because the excess bismuth moiety will compensate for bismuth volatilization losses during a 700° C. to 800° C. anneal. Of course, with the 5% excess bismuth moiety in solution, the empirical formula would need to be adjusted in the event that no bismuth volatilization occurs during the formation of the solid metal oxide. The remaining excess bismuth could function as an A-site material in combination with the excess tantalum B-site atoms.

EXAMPLE 6

STRONTIUM BISMUTH NIOBIUM TANTALATE LIQUID PRECURSOR SOLUTION FOR USE IN FORMING MIXED CRYSTAL $L_2$ and $L_1$ LAYERED SUPERLATTICE MATERIALS A strontium bismuth niobium tantalate precursor solution including relative proportions of ingredients capable of forming a 17:83 mixture of $L_1$ (m=1) and $L_2$ (n=2) metal oxide layer portions was prepared using the pre-precursor solutions of previous examples. A 2 ml aliquot of the 0.200M precursor solution from Example 1 was placed in a 250 ml Erlenmeyer flask. A 0.200 g aliquot of the bismuth 2-ethylhexanoate solution (0.4 mmol $Bi^{3+}$/g) from Example 3 was added to the flask, as was a 0.100 g aliquot of the niobium 2-ethylhexanoate solution (0.4 mmol $Nb^{5+}$/g) of Example 4. The combined ingredients were swirled in the flask to a homogenous state. Mixing of the combined precursor solutions from the various examples was facilitated by the use of a common xylenes solvent.

The relative proportions of ingredients in the precursor solution were designed, upon annealing of the dried precursor residue, to yield a mixed layered superlattice material having an empirical formula of $Sr_{0.833}Bi_2Nb_{0.167}Ta_{1.667}O_{8.417}$. This material included collated layers of mixed $L_1$ and $L_2$ materials according to Formula (6). The precursor design permitted equivalent substitution of the pentavalent B-site atoms $Ta^{5+}$ (ionic radius 0.68 Å) and $Nb^{5+}$ (ionic radius 0.69 Å) throughout the $L_1$ and $L_2$ materials. With respect to the stoichiometrically balanced 17:83 mixture of $L_1$ and $L_2$ strontium bismuth tantalum niobate materials, G is $(Bi_2O_2)^{2+}$ according to Formula (9). $L_1$ presents 17% of L layers having the empirical formulae $(Nb_{0.091}Ta_{0.909}O_{3.5})^{2-}$ according to Formula (7). $L_2$ includes a thickness of dual octahedral metal groups and has the empirical formula $(SrNb_{0.182}Ta_{1.818}O_7)^{2-}$ according to Formula (8). $\delta_1$ is 0.17 based upon the amount of $L_1$ (niobium) materials added. $\delta_2$ is 0.83 for the $L_2$ layers. For the $L_1$ layer portion, $M1_{\alpha 1}$ is 0.091 based upon the amount of niobium added and $M2_{\alpha 2}$ is 0.909 based upon the amount of tantalum added. For the $L_2$ layer portion, $M1_{\alpha 1}$ is 1.0 for the strontium A-site metal, $M2_{\alpha 2}$ is 0.182 for the niobium B-site metal; and $M3_{\alpha 3}$ is 1.818 for the tantalum B-site metal.

EXAMPLE 7

FINAL PRECURSOR SOLUTIONS

Table 7 identifies several $L_2$ and $L_1$ final precursor solutions (mixed m=1 and n=2 solutions) that were formed by mixing the respective precursor solutions in the manner of Examples 5 and 6. Additionally, the procedure was repeated by substituting niobium for the tantalum moiety of Example 1, and diluting the resultant strontium bismuth niobate precursor with a bismuth tantalate precursor. Table 7 identifies the solution ingredients by the anticipated empirical formulae that will result upon drying and annealing of the precursor respective solutions, as well as the $L_2$ and $L_1$ portions of the crystalline formula that reside between the collated $(Bi_2O_2)^{2+}$ layers. The empirical formulae of Table 7 are intended to have a zero net charge, but some negligible charge imbalances may be observed in the stated formulae due to roundoff error in the numbers that are presented.

The precursor solutions of Table 7 were developed according to the following relationship in accord with Examples 5 and 6:

$$ABi_2B_2O_9 + X\ Bi_2B'O_{5.5} \rightarrow ABi_{2+2X}B_2B'_XO_{9+5.5X}L_2+L_1 \rightarrow \text{mixed material.} \quad (19)$$

The subscripts were then normalized to a value of $Bi_2$ by multiplying each subscript by the quantity $\{2/(2+2X)\}$. The $\delta$ probabilities were calculated as the total number of a particular type of L layers (e.g., $L_1$ or $L_2$) divided by the total number of L layers (e.g., $L_1+L_2$). The B-site metals were randomly distributed throughout the solution. Note that the $L_1$ layers have no A-site metal (Sr) when m=1. It should be understood that relationship (19) represents a mixture of solution ingredients, but does not represent a chemical reaction in the solution.

TABLE 7

PRECURSORS FOR FORMING MIXED $L_1$ and $L_2$ LAYERED SUPERLATTICE MATERIALS ACCORDING TO THE GENERALIZED FORMULA
$G\{[(L_1\delta_1)(\Sigma_{I-1}{}^JMi_{\alpha 1})][(L_2\delta_2)(\Sigma_{I-1}{}^JMi_{\alpha 1})] \ldots [(L_k\delta_k)(\Sigma_{I-1}{}^JMi_{\alpha 1})]\}G_*$

| X Value | Empirical Formula** | $\delta_1$ | $\delta_2$ | $L_1$ Formula | $L_2$ Formula |
|---|---|---|---|---|---|
| 0 | $SrBi_2Ta_2O_9$ ($L_1$ additive below is $Bi_2TaO_{5.5}$) | 0 | 1.00 | (Not applicable; 100% n = 2 material) | $(SrTa_2O_7)^{2-}$ (100%) |
| 0.05 | $Sr_{0.952}Bi_2Ta_{1.952}O_{8.833}$ | 0.048 | 0.953 | $(TaO_{3.5})^{2-}$ | $(SrTa_2O_7)^{2-}$ |
| 0.10 | $Sr_{0.909}Bi_2Ta_{1.909}O_{8.682}$ | 0.091 | 0.909 | $(TaO_{3.5})^{2-}$ | $(SrTa_2O_7)^{2-}$ |
| 0.20 | $Sr_{0.833}Bi_2Ta_{1.833}O_{8.417}$ | 0.167 | 0.833 | $(TaO_{3.5})^{2-}$ | $(SrTa_2O_7)^{2-}$ |
| 0.25 | $Sr_{0.800}Bi_2Ta_{1.800}O_{8.300}$ | 0.200 | 0.800 | $(TaO_{3.5})^{2-}$ | $(SrTa_2O_7)^{2-}$ |
| 0.30 | $Sr_{0.769}Bi_2Ta_{1.769}O_{8.192}$ | 0.231 | 0.769 | $(TaO_{3.5})^{2-}$ | $(SrTa_2O_7)^{2-}$ |
| 0.40 | $Sr_{0.714}Bi_2Ta_{1.714}O_{8.000}$ | 0.286 | 0.714 | $(TaO_{3.5})^{2-}$ | $(SrTa_2O_7)^{2-}$ |
| 0.50 | $Sr_{0.667}Bi_2Ta_{1.667}O_{7.833}$ | 0.333 | 0.667 | $(TaO_{3.5})^{2-}$ | $(SrTa_2O_7)^{2-}$ |
| 0.60 | $Sr_{0.625}Bi_2Ta_{1.625}O_{7.688}$ | 0.375 | 0.625 | $(TaO_{3.5})^{2-}$ | $(SrTa_2O_7)^{2-}$ |
| 0.70 | $Sr_{0.588}Bi_2Ta_{1.588}O_{7.559}$ | 0.412 | 0.588 | $(TaO_{3.5})^{2-}$ | $(SrTa_2O_7)^{2-}$ |
| 0.80 | $Sr_{0.556}Bi_2Ta_{1.556}O_{7.444}$ | 0.444 | 0.556 | $(TaO_{3.5})^{2-}$ | $(SrTa_2O_7)^{2-}$ |
| 0.90 | $Sr_{0.526}Bi_2Ta_{1.526}O_{7.342}$ | 0.474 | 0.526 | $(TaO_{3.5})^{2-}$ | $(SrTa_2O_7)^{2-}$ |
| 1.00 | $Sr_{0.500}Bi_2Ta_{1.500}O_{7.250}$ $Bi_2TaO_{5.5}$ | 0.500 1.00 | 0.500 0 | $(TaO_{3.5})^{2-}$ $(TaO_{3.5})^{2-}$ | $(SrTa_2O_7)^{2-}$ (Not applicable; 100% m = 1 material) |
| 0 | $SrBi_2Ta_2O_9$ ($L_1$ additive below is $Bi_2TaO_{5.5}$) | 0 | 1.00 | (Not applicable; 100% n = 2 material) | $(SrTa_2O_7)^{2-}$ (100%) |
| 0.05 | $Sr_{0.952}Bi_2Nb_{0.048}Ta_{1.905}O_{8.833}$ | 0.048 | 0.952 | $(Nb_{0.024}Ta_{0.976}O_{3.5})^{2-}$ | $(SrNb_{0.049}Ta_{1.951}O_7)^{2-}$ |
| 0.10 | $Sr_{0.909}Bi_2Nb_{0.091}Ta_{1.818}O_{8.682}$ | 0.091 | 0.909 | $(Nb_{0.048}Ta_{0.952}O_{3.5})^{2-}$ | $(SrNb_{0.095}Ta_{1.905}O_7)^{2-}$ |
| 0.20 | $Sr_{0.833}Bi_2Nb_{0.167}Ta_{1.667}O_{8.416}$ | 0.167 | 0.833 | $(Nb_{0.091}Ta_{0.909}O_{3.5})^{2-}$ | $(SrNb_{0.182}Ta_{1.818}O_7)^{2-}$ |
| 0.25 | $Sr_{0.800}Bi_2Nb_{0.200}Ta_{1.600}O_{8.417}$ | 0.200 | 0.800 | $(Nb_{0.111}Ta_{0.889}O_{3.5})^{2-}$ | $(SrNb_{0.222}Ta_{1.778}O_7)^{2-}$ |
| 0.30 | $Sr_{0.769}Bi_2Nb_{0.231}Ta_{1.538}O_{8.192}$ | 0.231 | 0.769 | $(Nb_{0.130}Ta_{0.870}O_{3.5})^{2-}$ | $(SrNb_{0.261}Ta_{1.739}O_7)^{2-}$ |
| 0.40 | $Sr_{0.714}Bi_2Nb_{0.286}Ta_{1.429}O_{8.000}$ | 0.286 | 0.714 | $(Nb_{0.167}Ta_{0.833}O_{3.5})^{2-}$ | $(SrNb_{0.333}Ta_{1.667}O_7)^{2-}$ |
| 0.50 | $Sr_{0.667}Bi_2Nb_{0.333}Ta_{1.333}O_{7.833}$ | 0.333 | 0.667 | $(Nb_{0.200}Ta_{0.800}O_{3.5})^{2-}$ | $(SrNb_{0.400}Ta_{1.600}O_7)^{2-}$ |
| 0.60 | $Sr_{0.625}Bi_2Nb_{0.375}Ta_{1.25}O_{7.688}$ | 0.375 | 0.625 | $(Nb_{0.231}Ta_{0.769}O_{3.5})^{2-}$ | $(SrNb_{0.462}Ta_{1.538}O_7)^{2-}$ |
| 0.70 | $Sr_{0.588}Bi_2Nb_{0.411}Ta_{1.176}O_{7.559}$ | 0.412 | 0.588 | $(Nb_{0.259}Ta_{0.741}O_{3.5})^{2-}$ | $(SrNb_{0.519}Ta_{1.481}O_7)^{2-}$ |
| 0.80 | $Sr_{0.555}Bi_2Nb_{0.444}Ta_{1.111}O_{7.444}$ | 0.444 | 0.556 | $(Nb_{0.286}Ta_{0.714}O_{3.5})^{2-}$ | $(SrNb_{0.571}Ta_{1.429}O_7)^{2-}$ |
| 0.90 | $Sr_{0.526}Bi_2Nb_{0.473}Ta_{1.053}O_{7.342}$ | 0.474 | 0.526 | $(Nb_{0.310}Ta_{0.690}O_{3.5})^{2-}$ | $(SrNb_{0.621}Ta_{1.379}O_7)^{2-}$ |
| 1.00 | $Sr_{0.500}Bi_2Nb_{0.500}Ta_{1.500}O_{7.250}$ $Bi_2NbO_{5.5}$ | 0.500 1.00 | 0.50 0 | $(Nb_{0.333}Ta_{0.667}O_{3.5})^{2-}$ $(NbO_{3.5})^{2-}$ | $(SrNb_{0.667}Ta_{1.333}O_7)^{2-}$ (Not applicable; 100% m = 1 material) |
| 0 | $SrBi_2Nb_2O_9$ ($L_1$ additive below is $Bi_2TaO_{5.5}$) | 0 | 1.00 | (Not applicable; 100% n = 2 material) | $(SrNb_2O_7)^{2-}$ (100%) |
| 0.10 | $Sr_{0.909}Bi_2Nb_{1.818}Ta_{0.091}O_{8.682}$ | 0.091 | 0.909 | $(Nb_{0.942}Ta_{0.048}O_{3.5})^{2-}$ | $(SrNb_{1.905}Ta_{0.096}O_7)^{2-}$ |
| 0.20 | $Sr_{0.833}Bi_2Nb_{1.667}Ta_{0.167}O_{8.416}$ | 0.167 | 0.833 | $(Nb_{0.909}Ta_{0.091}O_{3.5})^{2-}$ | $(SrNb_{1.818}Ta_{0.182}O_7)^{2-}$ |
| 0.30 | $Sr_{0.769}Bi_2Nb_{1.538}Ta_{0.231}O_{8.192}$ | 0.231 | 0.769 | $(Nb_{0.870}Ta_{0.130}O_{3.5})^{2-}$ | $(SrNb_{1.739}Ta_{0.261}O_7)^{2-}$ |
| 0.40 | $Sr_{0.714}Bi_2Nb_{1.429}Ta_{0.286}O_{8.000}$ | 0.286 | 0.714 | $(Nb_{0.833}Ta_{0.167}O_{3.5})^{2-}$ | $(SrNb_{1.667}Ta_{0.333}O_7)^{2-}$ |
| 0.50 | $Sr_{0.667}Bi_2Nb_{1.333}Ta_{0.333}O_{7.833}$ | 0.333 | 0.667 | $(Nb_{0.800}Ta_{0.200}O_{3.5})^{2-}$ | $(SrNb_{1.600}Ta_{0.400}O_7)^{2-}$ |
| 1.00 | $Sr_{0.500}Bi_2Nb_{1.500}Ta_{0.500}O_{7.250}$ | 0.500 | 0.500 | $(Nb_{0.667}Ta_{0.333}O_{3.5})^{2-}$ | $(SrNb_{1.333}Ta_{0.667}O_7)^{2-}$ |

*G is $(Bi_2O_2)^{2+}$;
**These formulae do not account for a 5% excess bismuth moiety in the corresponding precursor solution.

Each precursor solution of Table 7 included 5% excess bismuth moiety to account for anticipated bismuth volatilization during the annealing process, but Table 7 does not account for this excess bismuth concentration under the assumption that the 5% excess bismuth portion would be lost during processing of the precursor solution to convert it into a solid metal oxide. The 5% bismuth loss estimate was compiled from ICP mass analysis data as set forth in Table 8. The mass analysis results of Table 8 were obtained from precursor solutions that were processed under identical conditions to those anticipated for use with the precursors of Table 7. These mass analysis results were accurate to within ±3%.

TABLE 8

STRONTIUM BISMUTH TANTALATE MASS ANALYSIS

| Sample | Precursor Solution Prepared to Contain | | | Mass Analysis of Metal Oxide Film | | |
|---|---|---|---|---|---|---|
| Sample | Bi | Sr | Ta | Bi | Sr | Ta |
| 1 | 2.18 | 1 | 2.06 | 2.10 | 1 | 2.07 |
| 2 | 2.18 | 1 | 2.08 | 2.13 | 1 | 2.07 |
| 3 | 2.18 | 1 | 2.09 | 2.13 | 1 | 2.07 |

Table 8 demonstrates that about 5% of the precursor bismuth was lost to volatilization during formation of the metal oxide. This determination ignores the results of sample 1, which provides a metal oxide bismuth content that is low with respect to the other values. Apparent Ta losses (or gains) in the Ta content varied within the range of experimental error. Table 8 indicates that layered superlattice metal oxides can have metal contents that very accurately reflect the precursor contents if the precursor is designed to compensate for bismuth volatilization.

EXAMPLE 8

FORMING A THIN FILM METAL OXIDE FERROELECTRIC CAPACITOR

The fabrication method of FIG. 10 was identically conducted for each of the strontium bismuth tantalate and strontium bismuth niobium tantalate precursor solutions represented in Table 7.

A conventional four inch diameter polycrystalline wafer was prepared to receive the $Sr_{0.833}Bi_2Ta_{1.833}O_{8.417}$ solution of Example 7. The preparation process included diffusion furnace annealing at 1100° C. in oxygen according to conventional protocols for yielding a thick layer of silicon oxide 104 (see FIG. 1). The substrate including oxide 104 was cooled to room temperature, and inserted into a vacuum chamber for conventional DC magnetron sputtering. A discharge voltage of 95 volts and a current of 0.53 amperes was utilized at a sputter pressure of 0.0081 Torr to sputter a 160 Å thickness of titanium metal on oxide layer 104. A discharge voltage of 130 volts and a current of 0.53 amperes was then used to sputter a 2200 Å thickness of platinum atop the titanium metal.

The substrate including titanium and platinum metals was annealed in a diffusion furnace under a nitrogen atmosphere at 450° C. for two hours and ten minutes. This time included a five minute push into the furnace and a five minute pull out of the furnace. The resultant structure included layers 106 and 110 as depicted in FIG. 1, but without layer 108. A 2 nh volume of the 0.2M $Sr_{0.833}Bi_2Ta_{1.833}O_{8.417}$ precursor from Table 7 was adjusted to a 0.13M concentration by the addition of 1.08 ml n-butyl acetate and passed through a 0.2 μm filter. The substrate including titanium and platinum metals was spun at 1500 rpm in a conventional spin-coating machine. An eyedropper was used to apply precursor solution to the substrate for thirty seconds while spinning. The precursor-coated substrate was removed from the spin-coating machine and dried in air for two minutes on a 140° C. hot plate. The substrate was dried for an additional four minute on a second hot plate at 260° C. The substrate was dried for an additional thirty seconds in oxygen at 725° C. using a 1200 W tungsten-halogen lamp (visible spectrum; Heatpulse 410 by AG Associates, Inc. using J208V bulbs by Ushio of Japan). The spin-coating and drying procedure was repeated a second time to increase the overall thickness of layer 112.

The substrate including the dried precursor was annealed under an oxygen ($O_2$) atmosphere for eighty minutes at 800° C. in a diffusion furnace. This time included a five minute push into the furnace and a five minute pull out of the furnace.

Platinum metal was sputtered to a 2000 Å thickness using a DC magnetron as before. The substrate was patterned using a conventional negative resist mask and argon ion etching. After removal of the resist, the device was annealed under oxygen at 800° C. for forty minutes including a five minute push into the diffusion furnace and a five minute pull out of the furnace.

Identical procedures were conducted for each of the precursors described in Table 7. Top electrode 114 was not applied in some instances because the presence of the electrode would interfere with electrical measurements.

The examples below provide details of the comparative measurements that were performed on the respective samples. The metal oxide materials were subjected to a variety of electric measurements at ambient temperature and pressure. These measurements served to compare the electrical performance of strontium bismuth tantalate and strontium bismuth niobate materials having different amounts of respective (m=1) and (n=2) layers. The specific electrical parameters that were studied included polarization hysteresis parameters, the capacitance, the polarization switching fatigue endurance, switching speeds, and the comparative leakage currents of the mixed layered superlattice materials. Identical polarization, leakage current, fatigue endurance, and switching speed measurements were performed on a $SrBi_2Ta_2O_9$ material (100% n=2) for comparison against the mixed strontium bismuth materials.

EXAMPLE 9

COMPARATIVE EVALUATION OF MIXED LAYERED SUPERLATTICE MATERIAL POLARIZATION HYSTERESIS PERFORMANCE

Figure 11:
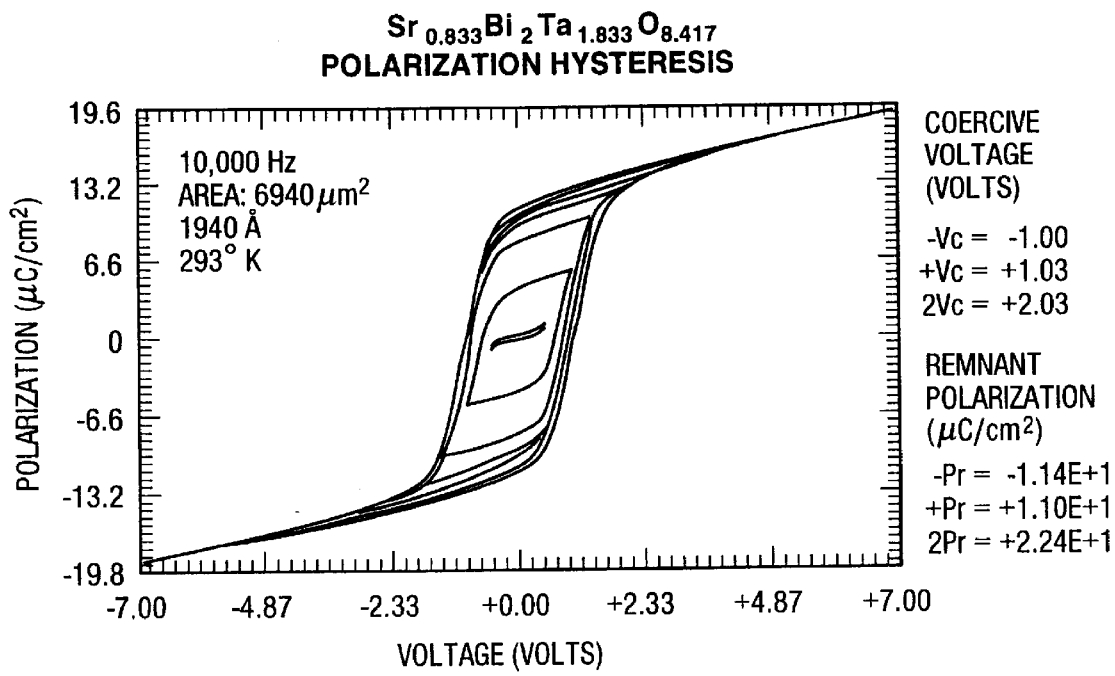
FIG. 11 depicts a polarization hysteresis plot of polarization in $\mu C/cm^2$ versus an ordinate of applied field in kV/cm, with measurements obtained at voltages ranging from 0.25 to 7 volts from a mixed layered superlattice material having an empirical formula of $Sr_{0.833}Bi_2Ta_{8.417}$.

A capacitor 100 that included a 1940 Å thickness of $Sr_{0.833}Bi_2Ta_{1.833}O_{8.417}$ material of Table 7, i.e., a 17% $L_1$ (m=1) and 83% $L_2$ (n=2) strontium bismuth tantalate material, was subjected to polarization hysteresis measurements on an uncompensated Sawyer-Tower circuit including a Hewlit Packard 3314A function generator and a Hewlit Packard 54502A digitizing oscilloscope. Measurements were obtained from the film at 20° C. using a sine wave function having a frequency of 10,000 Hz and voltage amplitudes of 0.25, 0.5, 1.0, 1.5, 2.0, 2.5, 3.0, 4.0, 5.0, and 7.0V. FIG. 11 depicts a plot of the data obtained as a polarization hysteresis curve for each of the voltage amplitudes. The ordinate is an electric field in KV/cm, and the abscissa is an observed remanent polarization $\mu C/cm^2$. The steeply rising, quasi-rectangular, boxy nature of the hysteresis curve indicates an excellent ferroelectric memory-switching performance with a remanent polarization (2Pr) value up to about 22.4 $\mu C/cm^2$ at voltages greater than about 5V.

Figure 12:
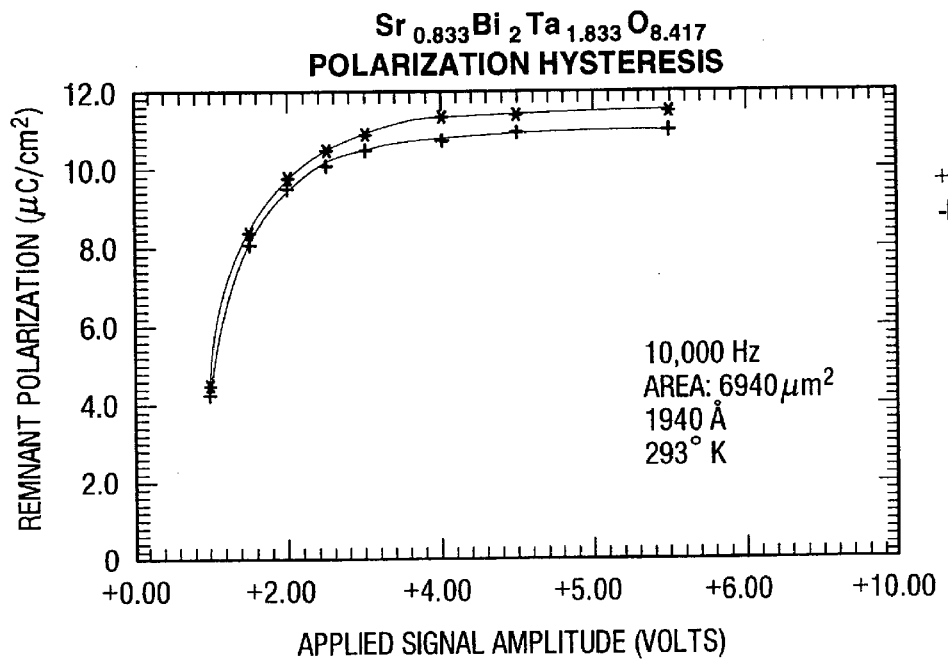
FIG. 12 depicts a remanent polarization plot of polarization in $\mu C/cm^2$ versus an ordinate of applied signal amplitude in volts for the material of FIG. 11.
Figure 13:
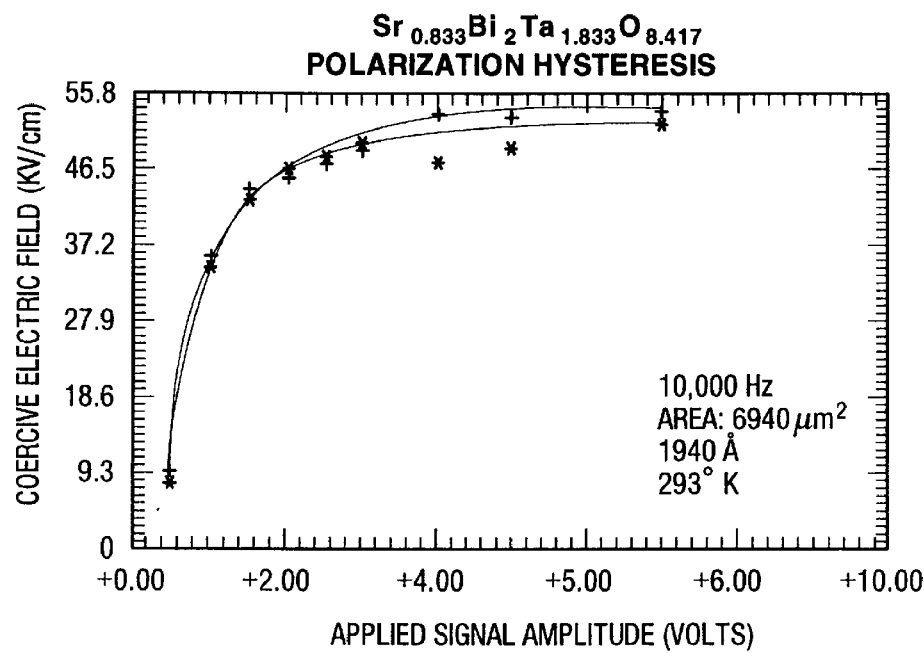
FIG. 13 depicts a plot of coercive electric field in $\mu C/cm^2$ versus an ordinate of applied signal amplitude in volts for the material of FIG. 11.

FIG. 12 depicts a plot of remanent polarization (±Pr) values in $\mu C/cm^2$ versus an ordinate representing the applied signal voltages for each of the curves in FIG. 11. FIG. 12 demonstrates that a substantially complete switching of the $Sr_{0.833}Bi_2Ta_{1.833}O_{8.417}$ material occurred to a ±Pr value of about 11 $\mu C/cm^2$ occurred at applied voltages having an amplitude exceeding about 3V. Similarly, FIG. 13 is a plot of coercive electric field ±Ec in KV/cm versus an ordinate of applied signal voltages for the hysteresis measurements of FIG. 11. FIG. 13 demonstrates that a coercive electric field of about 50 KV/cm was required for full switching of the $Sr_{0.833}Bi_2Ta_{1.833}O_{8.417}$ material, and this field existed at voltages greater than about 3V.

Figure 14:
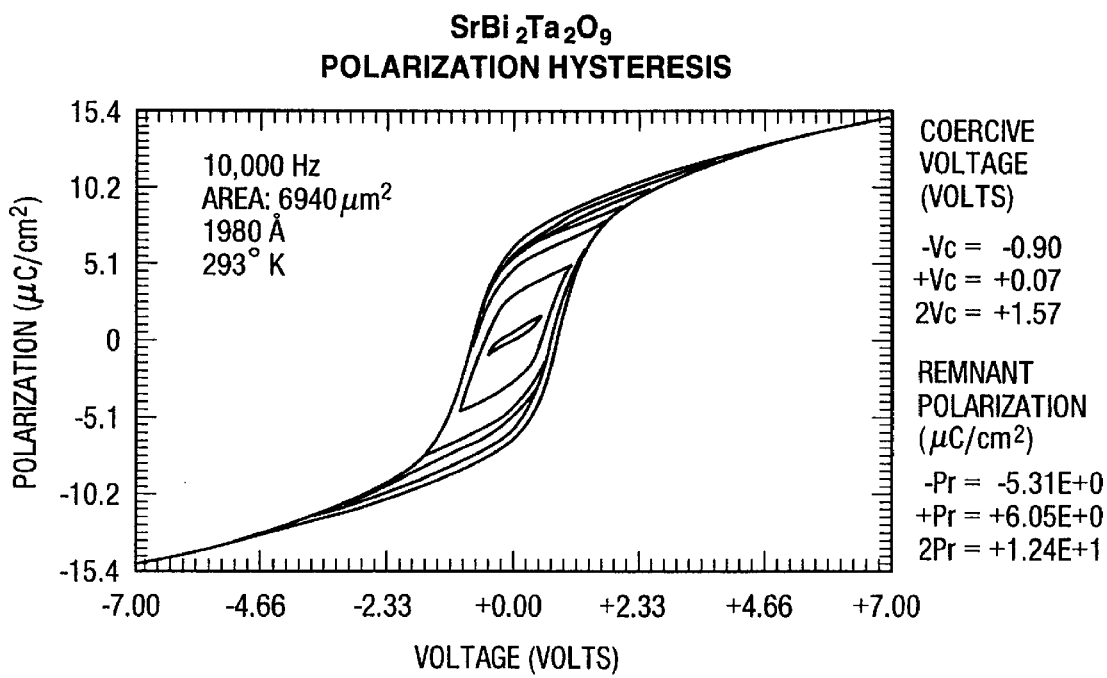
FIG. 14 depicts a polarization hysteresis plot like that of FIG. 11, but includes comparative results from a non-mixed layered superlattice material having an empirical formula $SrBi_2Ta_2O_9$.

A capacitor 100 having a 1980 Å thickness of the $SrBi_2Ta_2O_9$ material of Table 7 (a non-mixed materials having a perovskite-like octahedra layer with a thickness of two octahedra) was subjected to identical hysteresis measurements for purposes of comparison with the $Sr_{0.833}Bi_2Ta_{1.833}O_{8.417}$ sample of FIGS. 11, 12, and 13. FIG. 14 depicts the $SrBi_2Ta_2O_9$ sample results as a polarization hysteresis curve similar to FIG. 11. Again, the boxy nature of the curve indicates a good switching ferroelectric material, with 2Pr being about 12 $\mu C/cm^2$ at voltages greater than about 5V; however, these 2Pr values were only about 55% of those depicted in FIG. 11. The polarization of the $SrBi_2Ta_2O_9$ material, i.e., a non-mixed layered superlattice material having pure $L_2$ layers, was inferior to that of the $Sr_{0.833}Bi_2Ta_{1.833}O_{8.417}$ mixed layered superlattice material which included both $L_1$ and $L_2$ layers.

Figure 15:
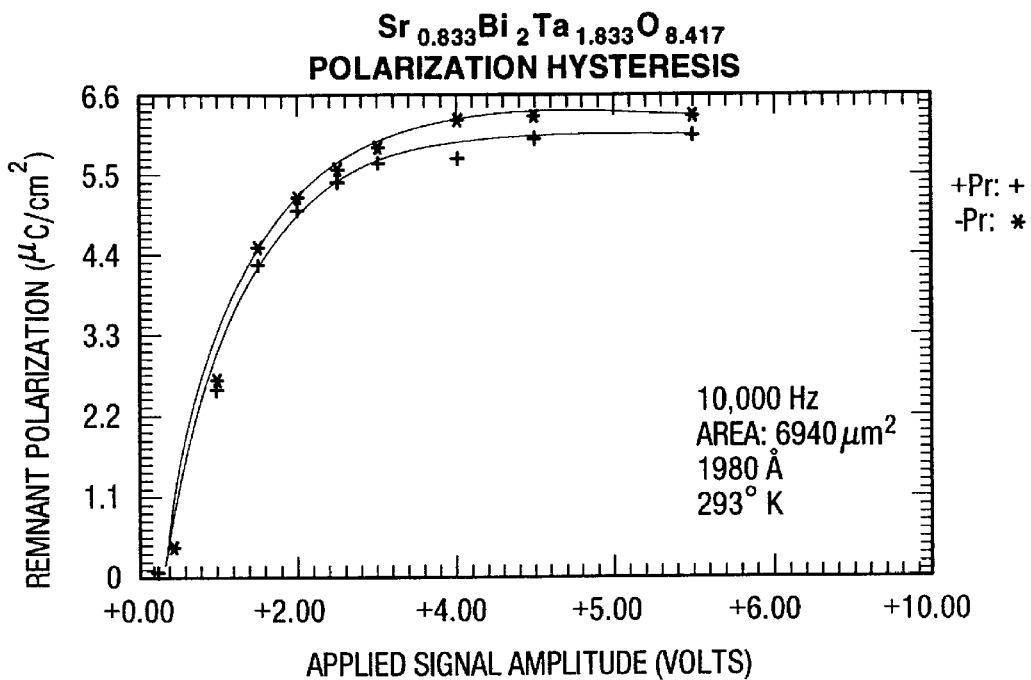
FIG. 15 depicts a plot like that of FIG. 12, but includes comparative polarization data from the $SrBi_2Ta_2O_9$ sample of FIG. 14.
Figure 16:
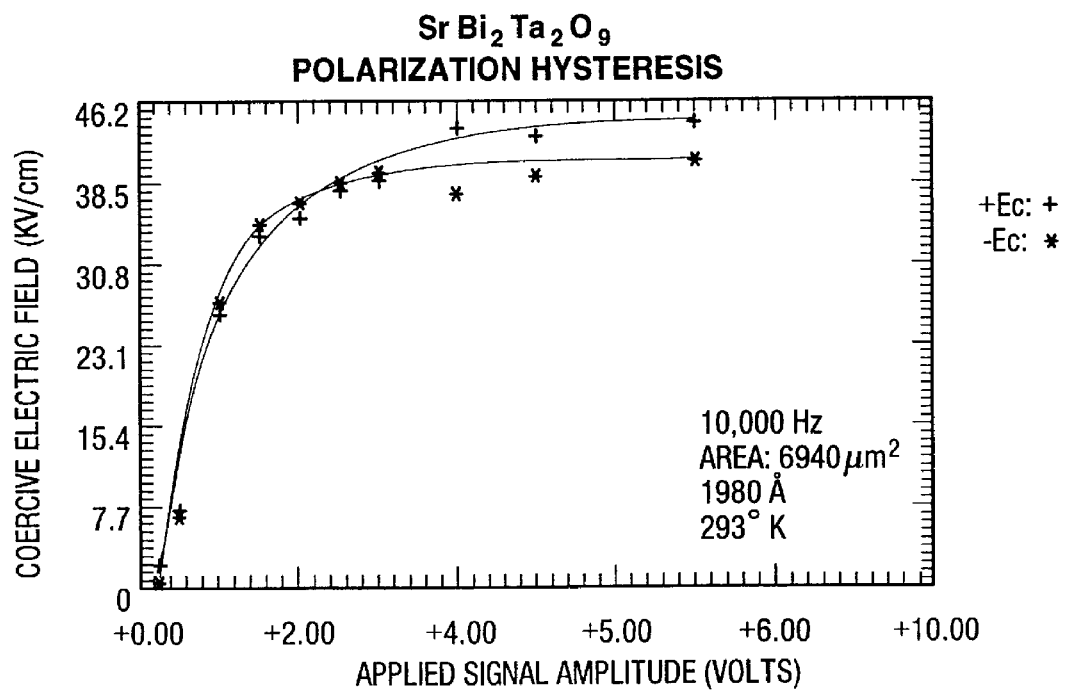
FIG. 16 depicts a plot like that of FIG. 13, but includes comparative coercive electric field data from the $SrBi_2Ta_2O_9$ sample of FIG. 14.

FIG. 15 is similar to FIG. 12, and depicts results for the $SrBi_2Ta_2O_9$ sample as (±Pr) values in $\mu C/cm^2$ plotted against an ordinate representing the applied signal voltage. The material was fully switched to a (±Pr) of about 6 $\mu C/cm^2$ at applied voltages greater than about 3V. FIG. 16 is similar to FIG. 13, and depicts a plot of an abscissa representing a coercive electric field ±Ec in KV/cm versus an ordinate representing applied signal voltages for the $SrBi_2Ta_2O_9$ sample. FIG. 13 demonstrates that a coercive electric field of about 38 KV/cm was required to switch the material, and this existed at voltages greater than about 3V.

Figure 30:
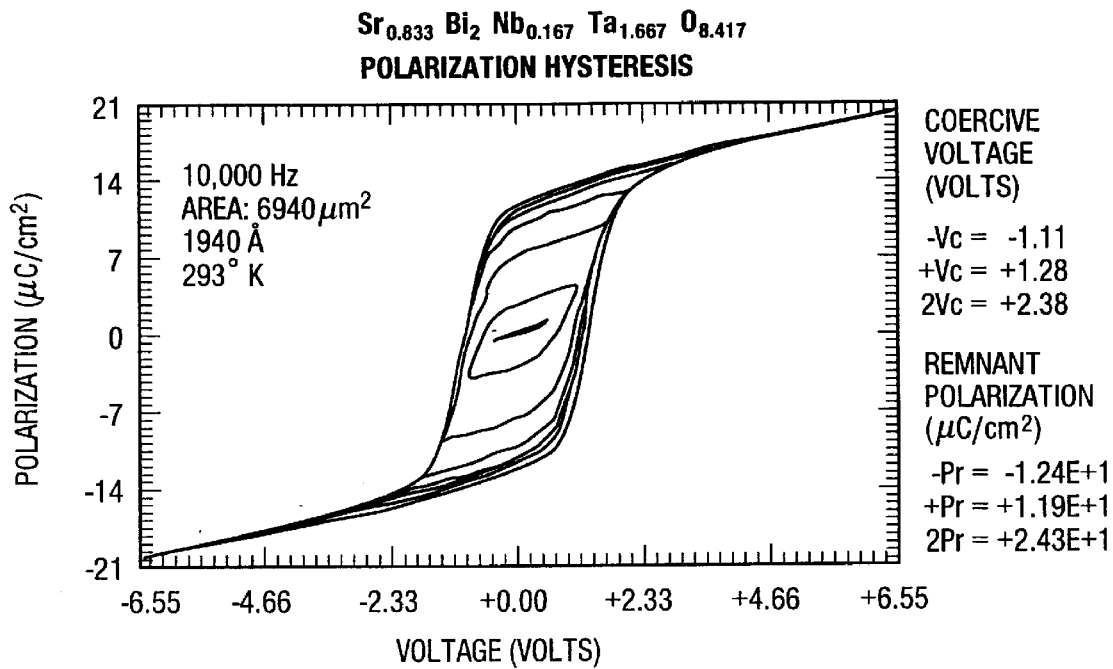
FIG. 30 depicts a polarization hysteresis plot like that of FIGS. 11 and 14, but includes comparative results from a mixed layered superlattice material having an empirical formula $Sr_{0.833}Bi_2Nb_{0.167}Ta_{1.667}O_{8.417}$.

A capacitor 100 having a 1940 Å thickness of the $Sr_{0.833}Bi_2Nb_{0.167}Ta_{1.667}O_{8.417}$ material of Table 7, i.e., a 17% $L_1$ (m=1) and 83% $L_2$ (n=2) strontium bismuth niobium tantalate material was subjected to identical hysteresis measurements for purposes of comparison with the $Sr_{0.833}Bi_2Ta_{1.833}O_{8.417}$ samples of FIGS. 11–13 and 14–16. FIG. 30 depicts the $Sr_{0.833}Bi_2Nb_{0.167}Ta_{1.667}O_{8.417}$ sample results as a polarization hysteresis curve similar to FIGS. 11 and 14. Again, the boxy nature of the curve indicates a good switching ferroelectric material, with 2Pr being about 24 $\mu C/cm^2$ at voltages greater than about 5V. These 2Pr values were slightly greater than those of FIG. 11.

Figure 31:
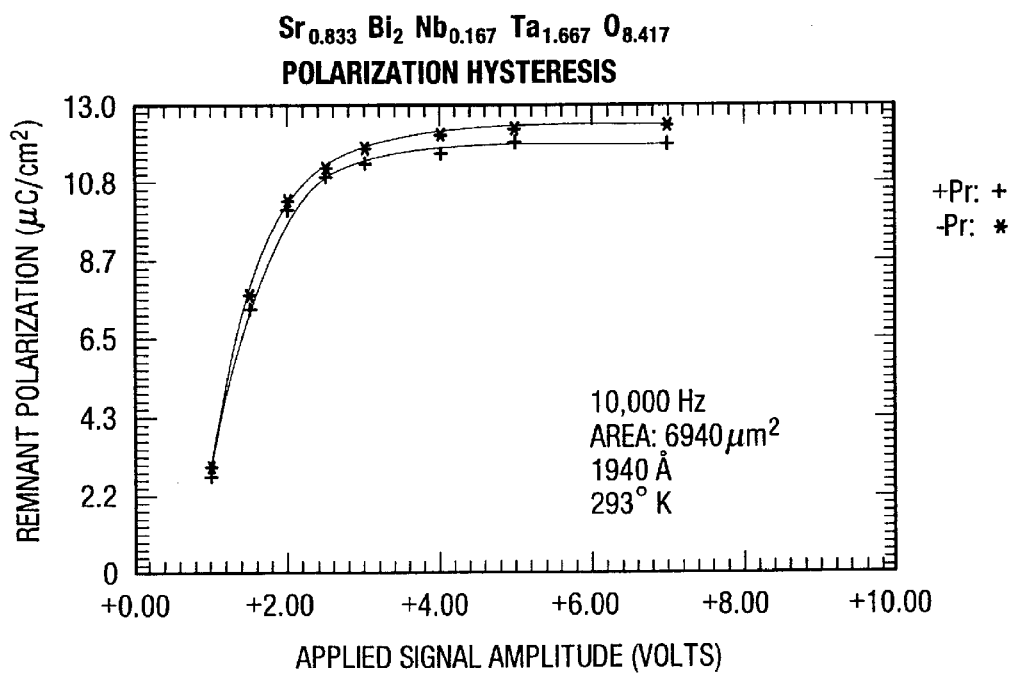
FIG. 31 depicts a plot like that of FIGS. 12 and 15, but includes comparative polarization data from the $Sr_{0.833}Bi_2Nb_{0.167}Ta_{1.667}O_{8.417}$ sample of FIG. 30.
Figure 32:
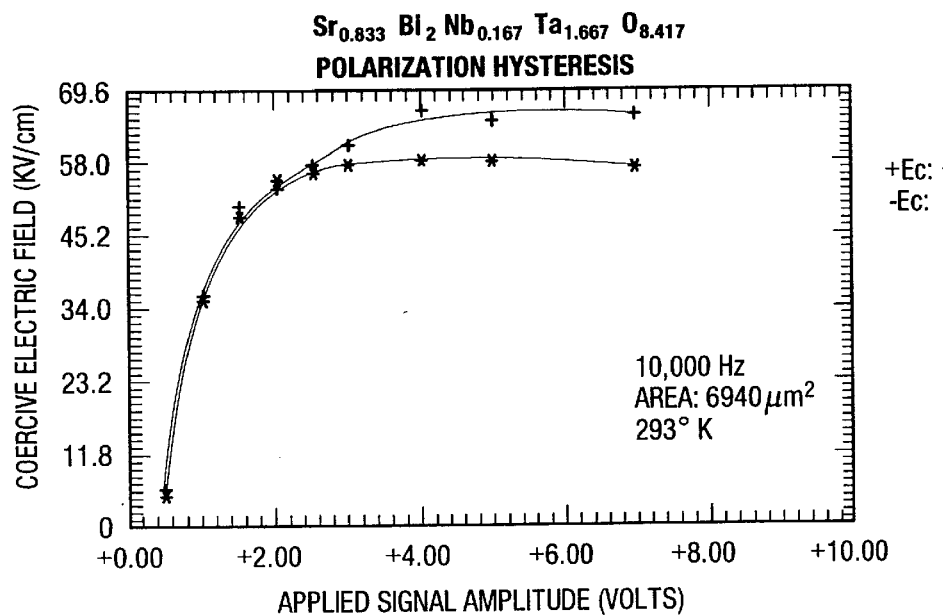
FIG. 32 depicts a plot like that of FIGS. 13 and 16, but includes comparative coercive electric field data from the $Sr_{0.833}Bi_2Nb_{0.167}Ta_{1.667}O_{8.417}$ sample of FIG. 30.

FIG. 31 is similar to FIGS. 12 and 15, and depicts results for the $Sr_{0.833}Bi_2Nb_{0.167}Ta_{1.667}O_{8.417}$ sample as (±Pr) values in $\mu C/cm^2$ plotted against an ordinate representing the applied signal voltage. The material was fully switched to a (±Pr) of about 12 $\mu C/cm^2$ at applied voltages greater than about 3V. FIG. 32 is similar to FIGS. 13 and 16, and depicts a plot of an abscissa representing a coercive electric field ±Ec in KV/cm versus an ordinate representing applied signal voltages for the $Sr_{0.833}Bi_2Nb_{0.167}Ta_{1.667}O_{8.417}$ sample. FIG. 32 demonstrates that a coercive electric field of about 58 KV/cm was required to switch the material, and this existed at voltages greater than about 3V.

Figure 33:
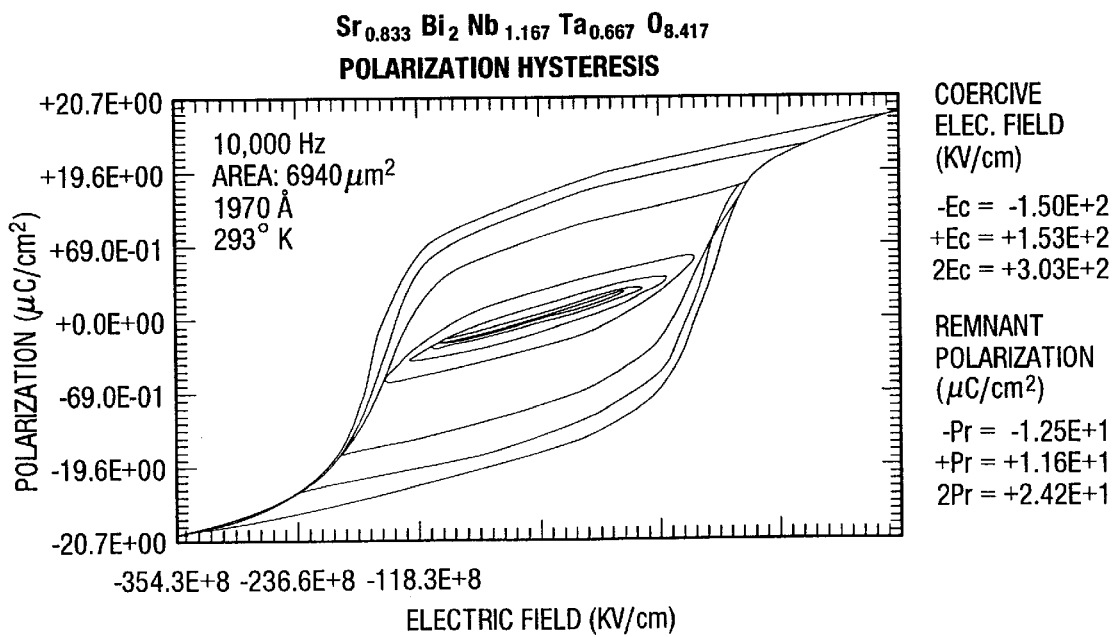
FIG. 33 depicts a polarization hysteresis plot like that of FIGS. 11, 14, and 30, but includes comparative results from a mixed layered superlattice material having an empirical formula $Sr_{0.833}Bi_2Nb_{1.667}Ta_{0.167}O_{8.417}$.
Figure 34:
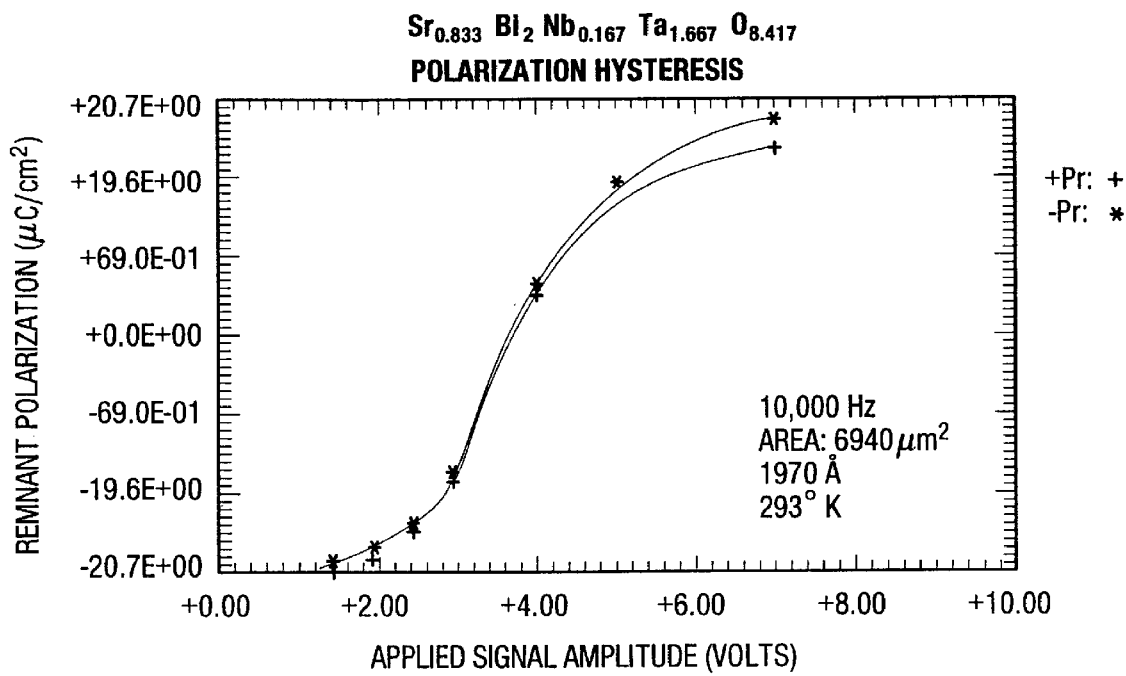
FIG. 34 depicts a plot like that of FIGS. 12, 15, and 31, but includes comparative polarization data from the $Sr_{0.833}Bi_2Nb_{1.667}Ta_{0.167}O_{8.417}$ sample of FIG. 33.
Figure 35:
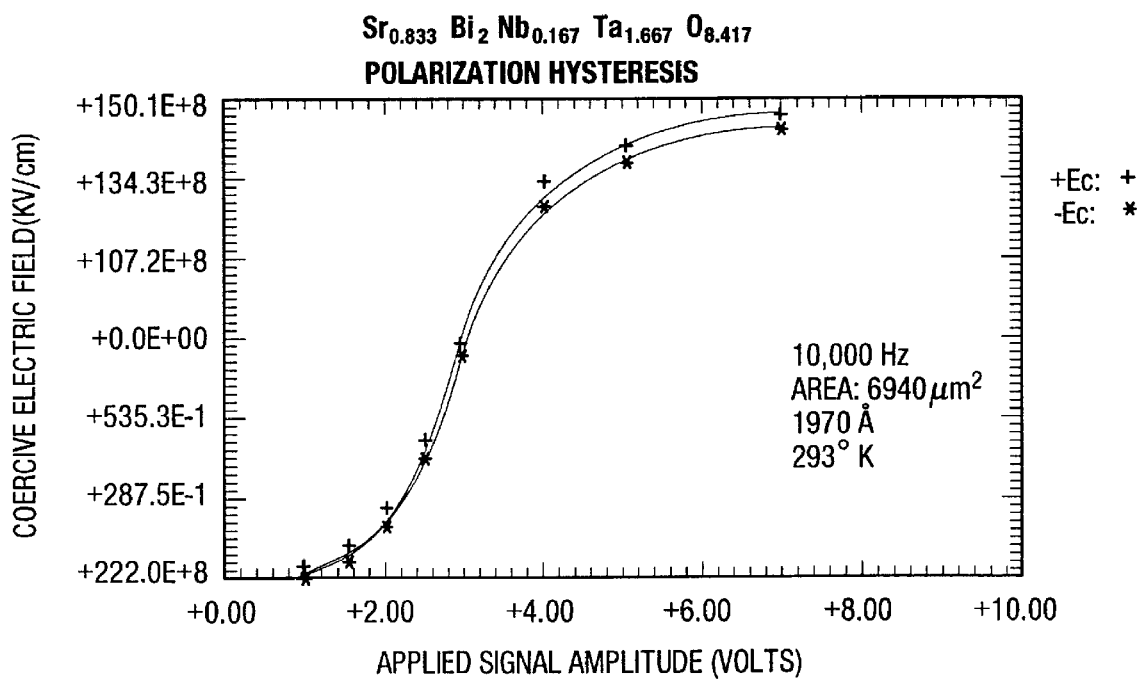
FIG. 35 depicts a plot like that of FIGS. 13, 16, and 32, but includes comparative coercive electric field data from the $Sr_{0.833}Bi_2Nb_{1.667}Ta_{0.167}O_{8.417}$ sample of FIG. 33.

FIG. 33 is similar to FIGS. 11, 14, and 30, and depicts results for the $Sr_{0.833}Bi_2Nb_{1.667}Ta_{0.167}O_{8.417}$ sample as (±Pr) values in $\mu C/cm^2$ plotted against an ordinate representing the applied signal voltage. FIG. 33 demonstrates a 2Pr polarization of 24 $\mu C/cm^2$. FIG. 34 is similar to FIGS. 12, 15, and 31, and depicts a plot of an abscissa representing a coercive electric field ±Ec in KV/cm versus an ordinate representing applied signal voltages for the $Sr_{0.833}Bi_2Nb_{1.6677}Ta_{0.167}O_{8.417}$ sample. The material was fully switched to a (±Pr) of about 12 $\mu C/cm^2$ at applied voltages greater than about 5V. FIG. 35 demonstrates that a coercive electric field of about 150 KV/cm was required to switch the material, and this existed at voltages greater than about 5V.

In comparison to the $SrBi_2Ta_2O_9$ sample, the $Sr_{0.833}Bi_2Ta_{1.833}O_{8.417}$ and $Sr_{0.833}Bi_2Nb_{0.167}Ta_{1.667}O_{8.417}$ samples required a slightly greater applied field for switching purposes, and switched to significantly greater polarization values. The $Sr_{0.833}Bi_2Nb_{1.6677}Ta_{0.167}O_{8.417}$ sample, which had the greatest niobium content, required the greatest coercive electric field but also had a large polarization value. Large polarization values (e.g., those exceeding 20 $\mu C/cm^2$) are required for the construction of high density memories. All of these materials switched within acceptable ranges (3 V to 5 V) for use in integrated circuits.

The approximate 100% improvement in 2Pr polarization from FIG. 14 to 11, from FIG. 14 to 30, and from FIG. 14 to 33, is truly astonishing when it is understood that pure $L_1$ (m=1) materials do not exhibit ferroelectric phenomenon. $L_1$ materials include those having only single octahedral perovskite-like A/B subunit cells or no perovskite-like structure at all. Thus, those skilled in the art would have predicted that the materials of FIGS. 11, 30, and 33, which included a mixture of nonferroelectric $L_1$ layers and ferroelectric $L_2$ layers, would have a lower polarization than the comparable thickness of pure $L_2$ ferroelectric material that produced FIG. 14. In contrast, the results indicate a substantially improved polarization in the mixed materials of FIGS. 11, 30, and 33.

Layer surface charges owing to point charge defects constitute a primary cause of reduced levels of polarization in ferroelectric materials. These surface defects typically increase with time due to surface migration of grain defects, as well as breakdown of the lattice surface proximal to existing defects under the repeated shock of transient electric fields. In the platinum titanium electrode structure of the present samples, titanium diffusion can responsible for a significant (e.g., 50%) reduction in polarization because of corresponding lattice defects in the ferroelectric material. Charged surface defects can screen the applied electric field by reducing its ability to reach portions of the ferroelectric material layer that reside beneath the surface. Accordingly, by virtue of the observed polarizability improvements from materials having a relatively dilute concentration or percentage of ferroelectric layers, it is seen that the use of mixed layered superlattice materials has overcome a longstanding problem with ferroelectric materials. The mixed layered superlattice materials have improved polarizabilities derived from reductions in the amounts of surface point defects and other defects, and are particularly resistant to the deleterious effects of titanium diffusion. These reductions permit a more effective use of the existing ferroelectric material. The compensation of point defects in material formation have further benefits in terms of greater fatigue endurance. Furthermore, the initial compensation of point defects within the crystal prevents them from becoming ordered in the lattice structure. The ordering of point defects could, otherwise, lead to line defects, which are a primary cause of cracking and/or shorting in weakened thin-film materials.

EXAMPLE 10

POLARIZATION AS A FUNCTION OF $L_1$ MATERIAL CONCENTRATION

Table 7 includes a variety of precursor solutions that can be utilized to form metal oxide materials having X values that are defined by relationship (19). These solid metal oxide materials were produced in Example 8 as exemplary mixed $L_1$ (m=1) and $L_2$ (n=2) materials. Polarization hysteresis measurements were conducted upon each of the resultant ferroelectric capacitors 100 in an identical manner to that described in Example 9.

Figure 17:
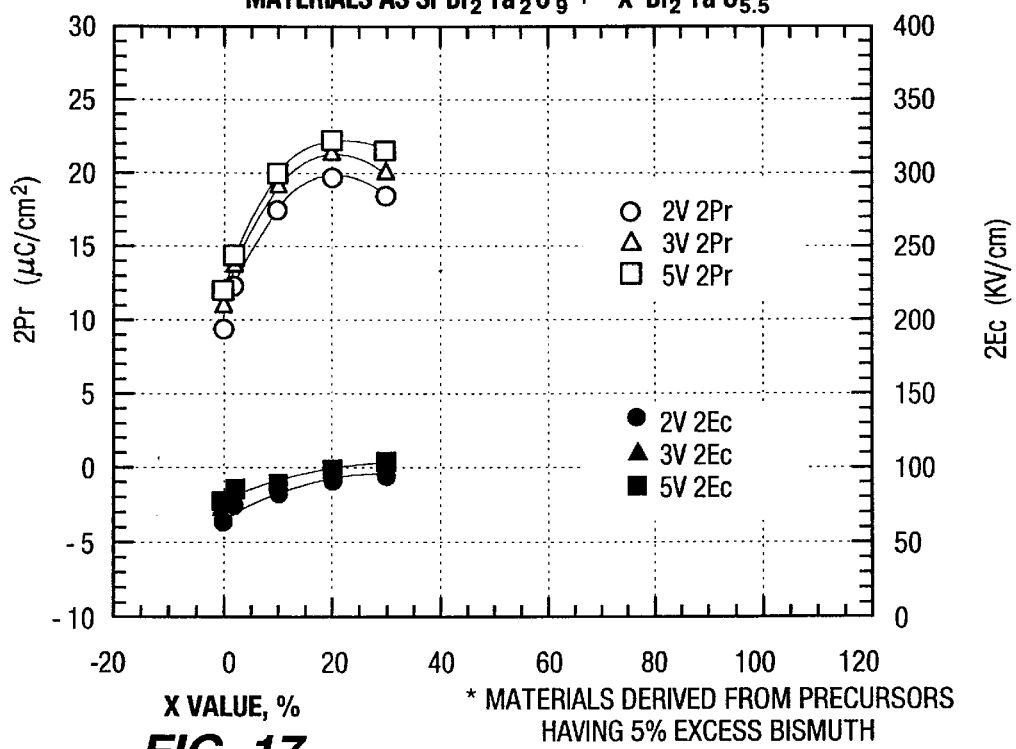
FIG. 17 depicts a plot having a dual abscissa for 2Pr polarization values in $\mu C/cm^2$ and 2Ec coercive electric field values in kV/cm versus an "X-value" or percentage of $L_1$ layers, with measurements obtained at different voltages from a variety strontium bismuth tantalate mixed layered superlattice materials having up to a 30% X-value obtained by adding a bismuth tantalate precursor to a strontium bismuth tantalate precursor.

FIG. 17 depicts results for the strontium bismuth tantalate materials with varied X values according to Table 7. FIG. 17 is a plot of X value versus a dual abscissa representing remanent polarization (2Pr in $\mu C/cm^2$) and coercive electric field values (2Ec in KV/cm) for the strontium bismuth tantalate materials. The different curves represent measurements that were taken from hysteresis curves for respective 2V, 3V, and 5V switching voltages. Some electrical shorting of materials was observed for X values exceeding about 30% (i.e., 23% $L_1$ materials), and the optimum ferroelectric switching performance existed at an X value of about 20% (17% $L_1$) with a 2Pr value of about 22 $\mu C/cm^2$ at 5V.

Figure 18:
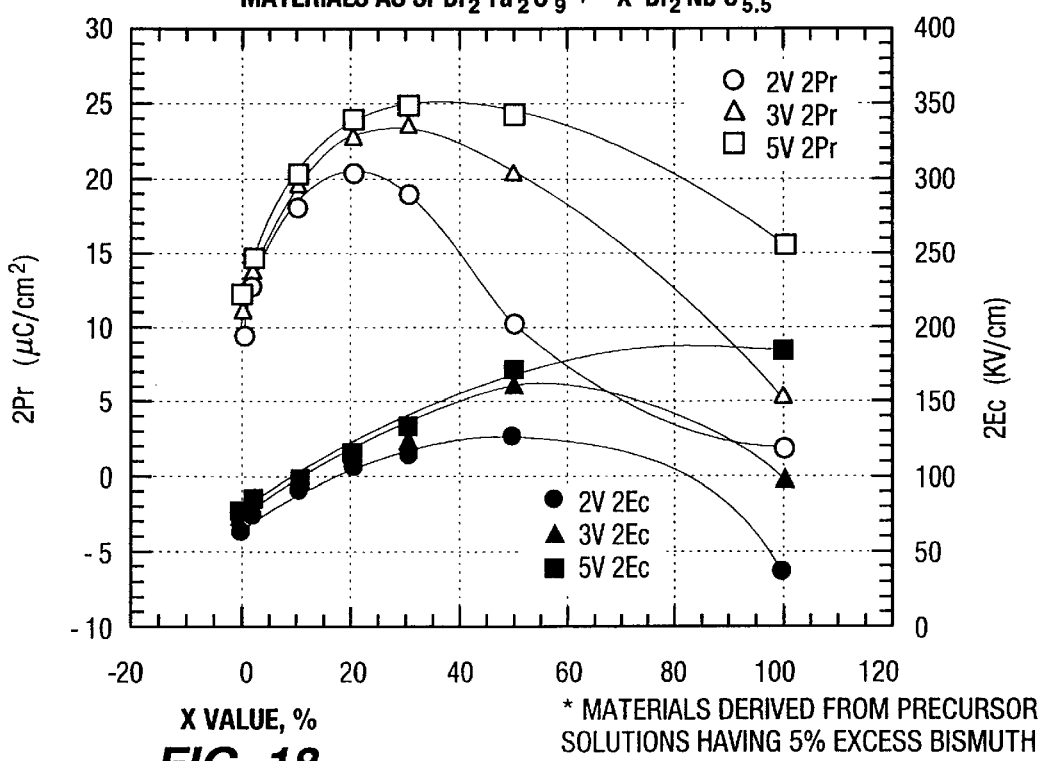
FIG. 18 depicts a plot like that of FIG. 17, but includes comparative polarization data obtained from strontium bismuth niobium tantalate materials with X values obtained by adding a bismuth niobate precursor to s strontium bismuth tantalate precursor.

FIG. 18 is similar to FIG. 17, but depicts results obtained for the strontium bismuth niobium tantalate materials of Table 7 that were obtained by adding a bismuth niobate precursor to a strontium bismuth tantalate precursor. The FIG. 18 results indicate an optimal 2Pr value of about 25 $\mu C/cm^2$ at 5V in the X value range of from 30–50% (i.e., 23%–33% $L_1$).

Figure 19:
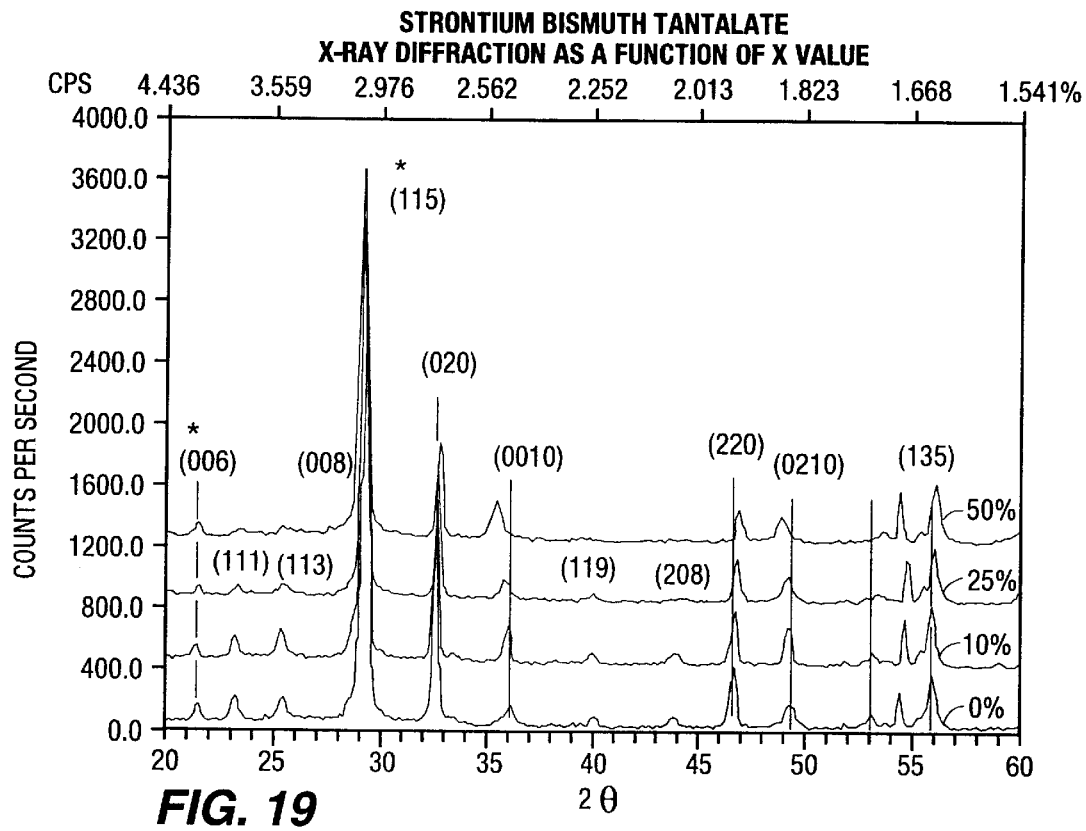
FIG. 19 depicts an X-ray diffraction plot of X-ray intensity in counts per second versus an ordinate of 2Θ (twice the Bragg angle), with measurements obtained from strontium bismuth tantalate materials having different proportions of mixed A/B and AB-types of layers.
Figure 36:
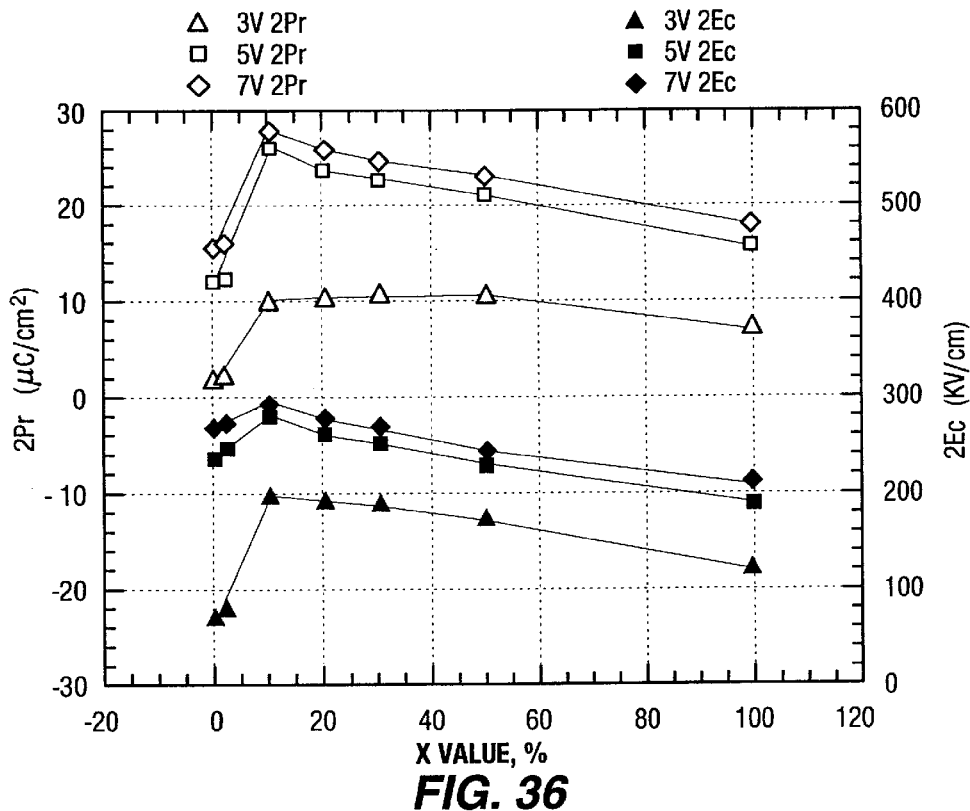
FIG. 36 depicts a dual abscissa polarization plot like that of FIG. 17, but includes data obtained from samples having X-values derived by adding a bismuth tantalate precursor to a strontium bismuth niobate precursor.

FIG. 19 is similar to FIGS. 17 and 18, but depicts results obtained for the strontium bismuth niobium tantalate materials of Table 7 that were obtained by adding a bismuth tantalate precursor to a strontium bismuth niobate precursor. The FIG. 36 results indicate an optimal 2Pr value of about 27 $\mu C/cm^2$ at 5–7V at an X value of about 10%.

EXAMPLE 11

SUPERLATTICE STRUCTURAL ANALYSIS THROUGH X-RAY DIFFRACTION

X-ray diffraction measurements were obtained from the strontium bismuth tantalate and strontium bismuth niobium tantalate $L_1$ (m=1) and $L_2$ (n=2) materials.

FIG. 19 depicts the X-ray diffraction results from the strontium bismuth tantalate materials of Table 7 having X values 0%, 10%, 25%, and 50% $L_1$ materials provided by the addition of $Bi_2TaO_{5.5}$. FIG. 19 is a plot of X-ray intensity in counts per second ("CPS") versus 2Θ on the ordinate, where Θ is the Bragg angle. Each curve is labeled with the respective X value concentration of $L_1$ materials in a given sample. The respective curves are superimposed over one another by aligning each curve at an approximate 21.3 degree 2Θ value that represents a common (a,b,c) lattice point, i.e., a (006) peak, and adding 400 CPS to the intensity count of each successive curve.

Figure 20:
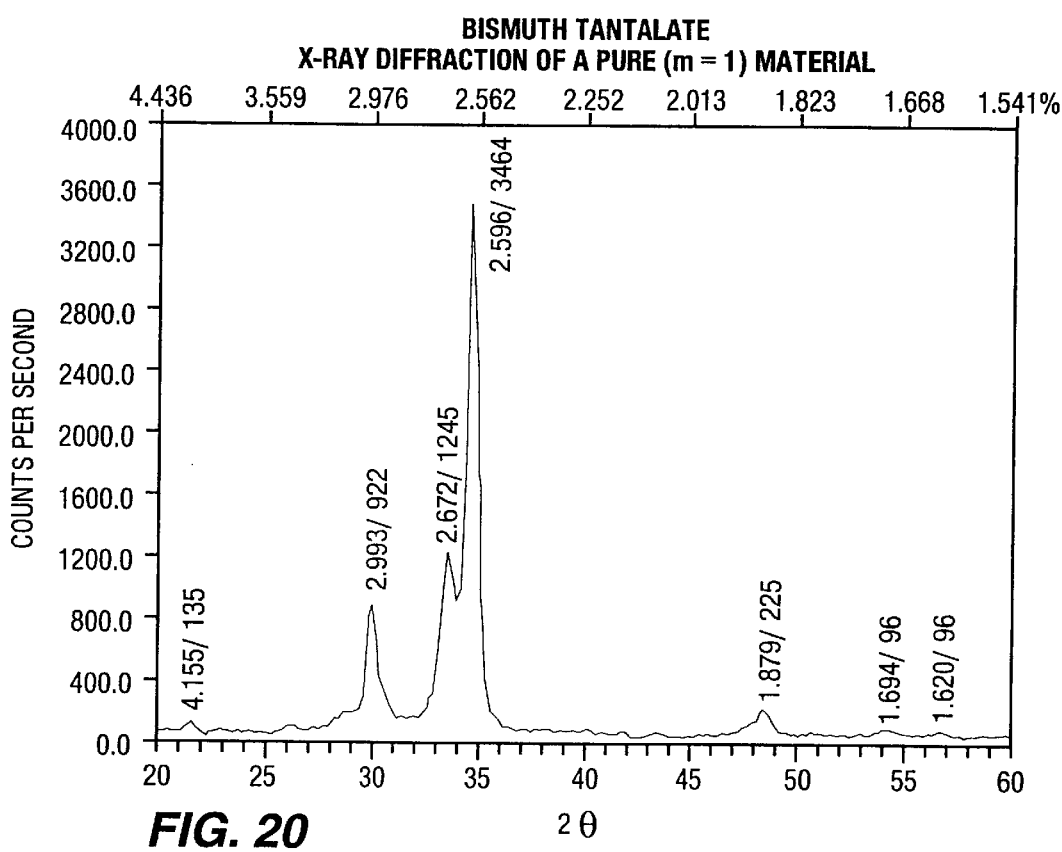
FIG. 20 depicts an X-ray diffraction plot having axes like those of FIG. 19, but with diffraction results for a strontium bismuth tantalate having A/B layers with no AB layers.

FIG. 20 is a plot similar to that of FIG. 19, but depicts results that were obtained from a 100% (m=1) material having an empirical formula of $Bi_2TaO_{5.5}$. In comparison to FIG. 19, the two curves align at the 21.3° (006) peak. On the other hand, the (0010) low amplitude peak of FIG. 19 shifts towards a 35° and increases in intensity with greater concentrations of $L_1$ materials. FIG. 20 shows this same peak at 35° with a much greater relative abundance as compared to other peaks. These peak shifting and intensity changes indicate a much greater abundance of the (0010) peak materials, as well as a corresponding positional change, and confirm the existence of a mixed superlattice unit cell.

Figure 21:
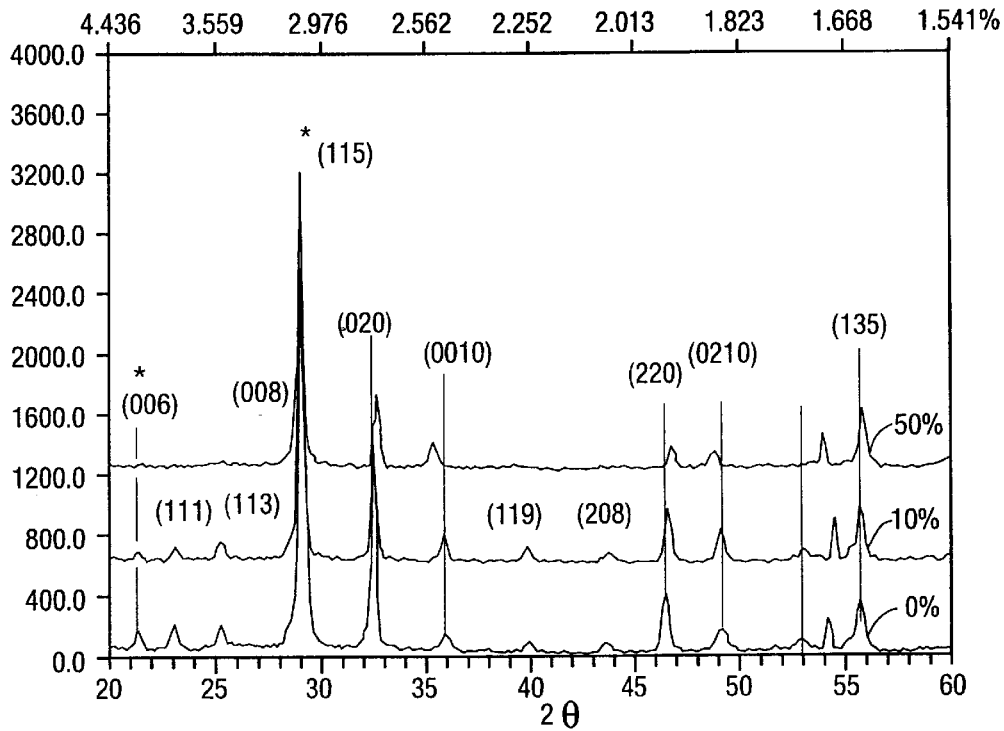
FIG. 21 depicts a plot like that of FIG. 19, but includes X-ray diffraction results that were obtained from a variety of strontium bismuth niobium tantalate materials.
Figure 22:
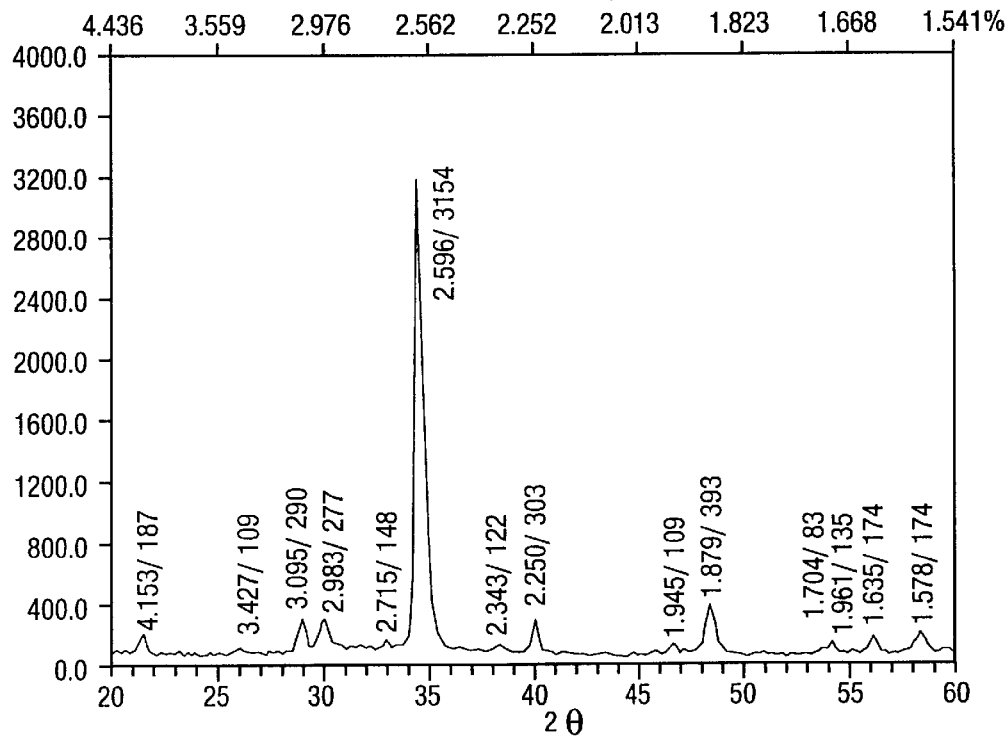
FIG. 22 depicts as plot like that of FIG. 20, but including results taken from strontium bismuth tantalum niobate materials having only A/B layers with no AB layers.

FIG. 21 is a plot like that of FIG. 19, but depicts X-ray diffraction results for strontium bismuth tantalum niobate materials of Table 7 having X values of 0%, 10% and 50% obtained by adding bismuth niobate to strontium bismuth tantalate. Less abundance of the (111) and (113) peaks is confirmed by a decline in intensity as the X value increases. Again, the addition of m=1 materials leads to an intensified peak development at 35°. FIG. 22 is a plot like that of FIG. 20, but depicts X-ray diffraction measurements for the 100% (m=1) material $Bi_2NbO_{5.5}$. The (0010) peak of FIG. 21 has grown in intensity and shifted to a 35° value.

The observed shifting of subunit cell structures along the respective axes indicates that the enhanced polarization (Example 9) of mixed layered superlattice materials is, in part, due to small changes in crystalline orientation. These changes likely result from long-range interlayer electrostatic forces that may also serve to enhance polarization at ambient temperatures.

EXAMPLE 12

COMPARATIVE EVALUATION OF MIXED LAYERED SUPERLATTICE METAL OXIDE LEAKAGE CURRENT PERFORMANCE

Figure 23:
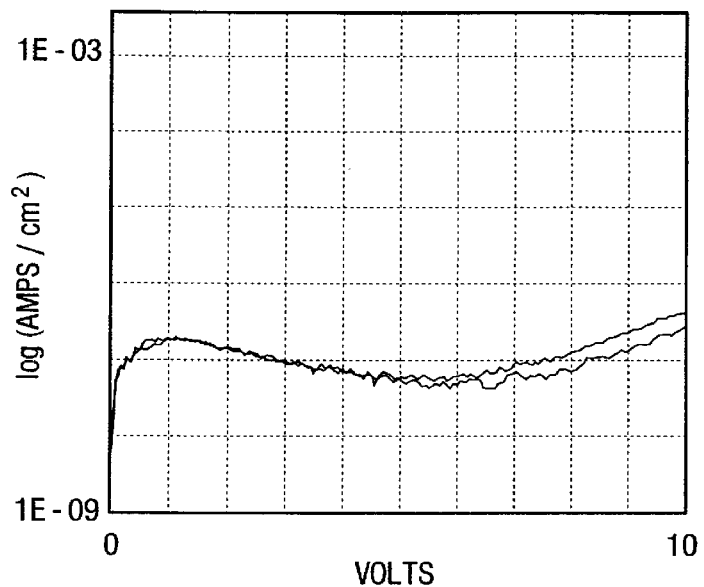
FIG. 23 depicts a leakage current plot of a current logarithm in amperes/cm² versus an ordinate in volts, with measurements obtained from a mixed layered superlattice material having an empirical formula of $Sr_{0.833}Bi_2Ta_{1.833}O_{8.417}$.

A capacitor 100 that contained the $Sr_{0.833}Bi_2Ta_{1.833}O_{8.417}$ material indicated in Table 7 was operably connected to a Hewlit Packard 4145A semiconductor analyzer (picoampmeter) for purposes of conducting leakage current measurements. FIG. 23 depicts a plot of the data obtained, and includes a plot of leakage current in amperes per $cm^2$ (logarithmic scale) versus voltage on the ordinate. The data points were obtained in 0.05V increments in a range between 0 and 10V. The magnitude of the leakage current was relatively constant over the voltage range studied, and varied slightly around the $10^{-7}$ mark. The relatively straight line indicates that a single charge transfer mechanism predominated over the voltage interval that was studied.

Figure 24:
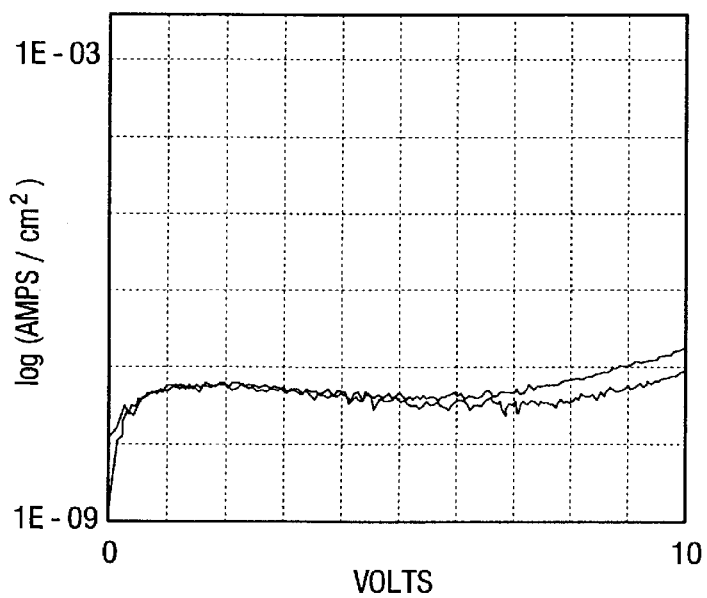
FIG. 24 depicts a plot like that of FIG. 23, but includes comparative leakage current data obtained from the $SrBi_2Ta_2O_9$ non-mixed layered superlattice material.

A $SrBi_2Ta_2O_9$ (see Example 8) sample was subjected for comparative purposes to the same measurements as the $Sr_{0.833}Bi_2Ta_{1.833}O_{8.417}$ sample. FIG. 24 is a plot of the measurements, which indicate an extremely low leakage current material on the order of $^{-7}$ amps/$cm^2$ throughout the subject voltage range. Accordingly, the addition of $L_1$ materials has significantly increased the polarization (Example 9) without substantially increasing the leakage current. This aspect is extremely significant because prior attempts to increase the polarization of ferroelectric materials have resulted in a corresponding increase in leakage current which renders the materials less suitable for use as conventional dielectrics.

EXAMPLE 13

COMPARATIVE EVALUATION OF MIXED LAYERED SUPERLATTICE METAL OXIDE CAPACITANCE

Figure 25:
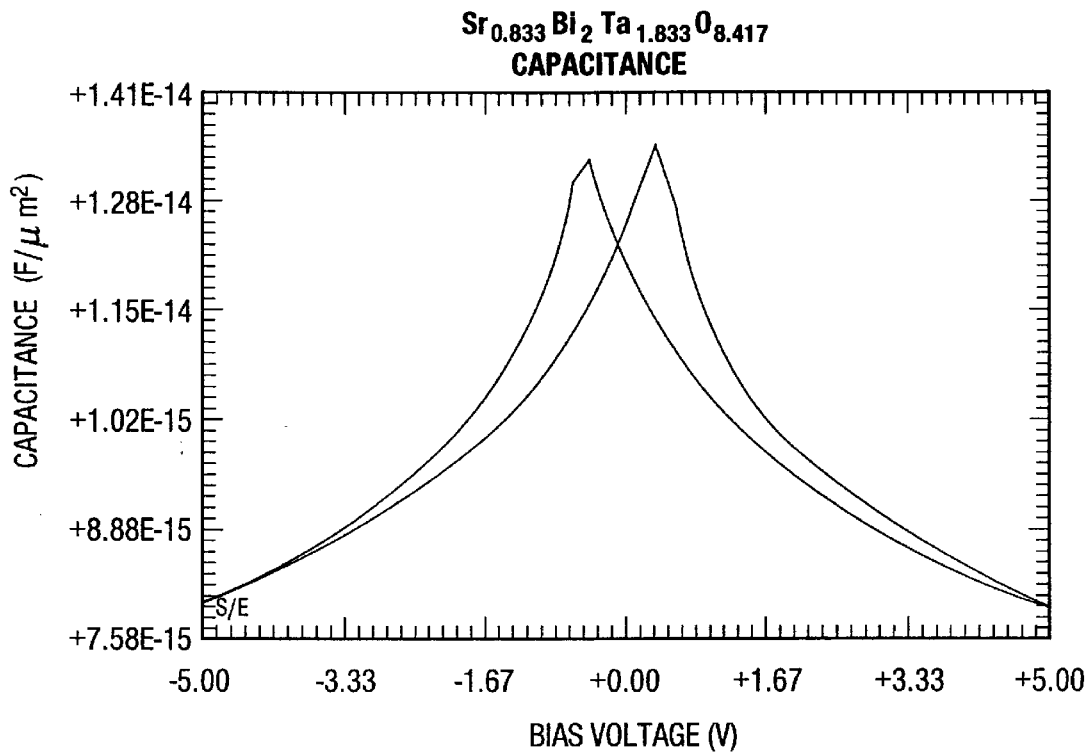
FIG. 25 depicts a plot of capacitance in $F/\mu m^2$ versus an ordinate of bias voltage in volts, with measurements obtained from the $Sr_{0.833}Bi_2Ta_{1.833}O_{8.417}$ 16.7% $L_1$ mixed layered superlattice material.

A $Sr_{0.833}Bi_2Ta_{1.833}O_{8.417}$ sample was operably connected to a Hewlet Packard 4275A LCR meter for purposes of conducting capacitance versus voltage measurements at 20° C. A sine wave function at a frequency of 100,000 Hz and an oscillation amplitude of 0.050V was modulated against a bias voltage ranging from −5 to 5V in stepped 0.200V increments. FIG. 25 depicts the results as a plot of capacitance in $F/\mu m^2$ versus bias voltage. Peak capacitance exceeded about $1.3 \times 10^{-14}$ $F/\mu m^2$ in the range around 0 V, and fell to about $8 \times 10^{-15}$ $F/\mu m^2$ in the 5V range. These results indicate a very high capacitance for a thin-film material.

Figure 26:
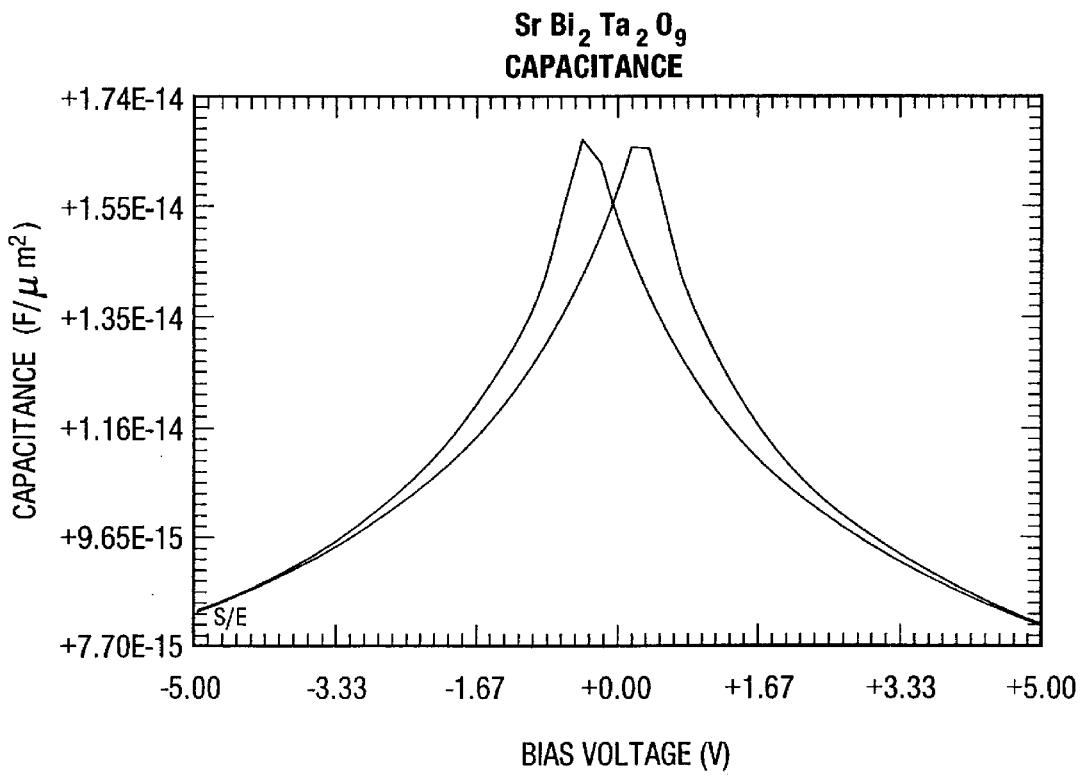
FIG. 26 depicts a plot like that of FIG. 25, but includes comparative capacitance data obtained from the $SrBi_2Ta_2O_9$ layered superlattice material.

The $SrBi_2Ta_2O_9$ sample from Table 7 was subjected for comparative purposes to the same measurements as the $Sr_{0.833}Bi_2Ta_{1.833}O_{8.417}$ sample. FIG. 26 depicts the results. Peak capacitance exceeded about $1.6 \times 10^{-14}$ $F/\mu m^2$ in the range around 0 V, and fell to about $8 \times 10^{-15}$ $F/\mu m^2$ in the 5V range.

Figure 41:
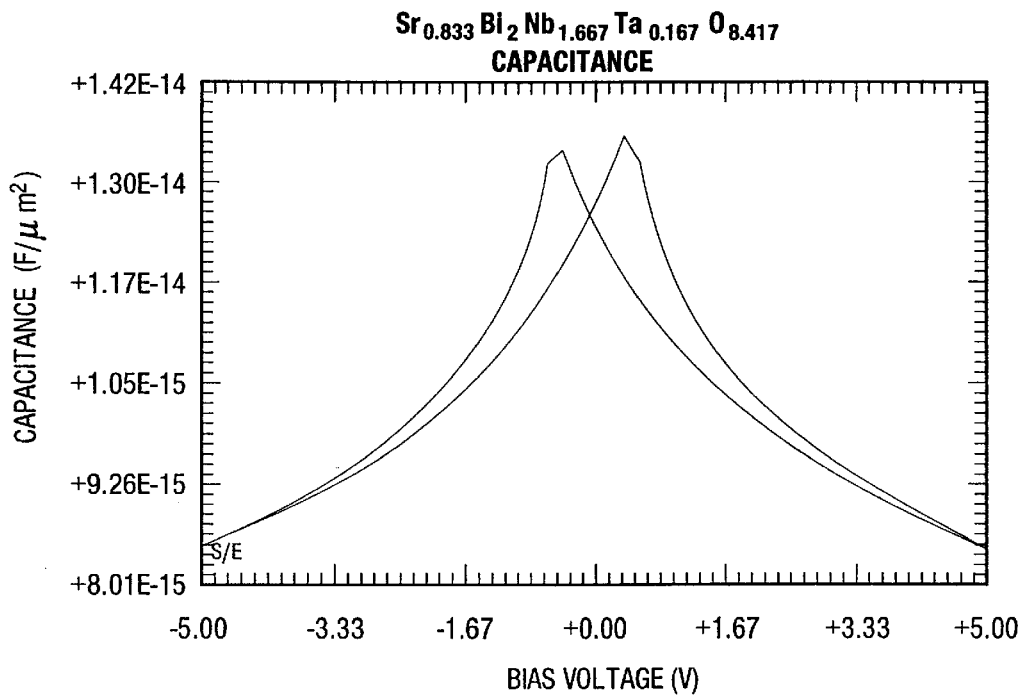
FIG. 41 depicts a plot like that of FIGS. 25 and 26, but including capacitance data from the $Sr_{0.833}Bi_2Nb_{1.667}Ta_{0.167}O_{8.417}$ sample.
Figure 42:
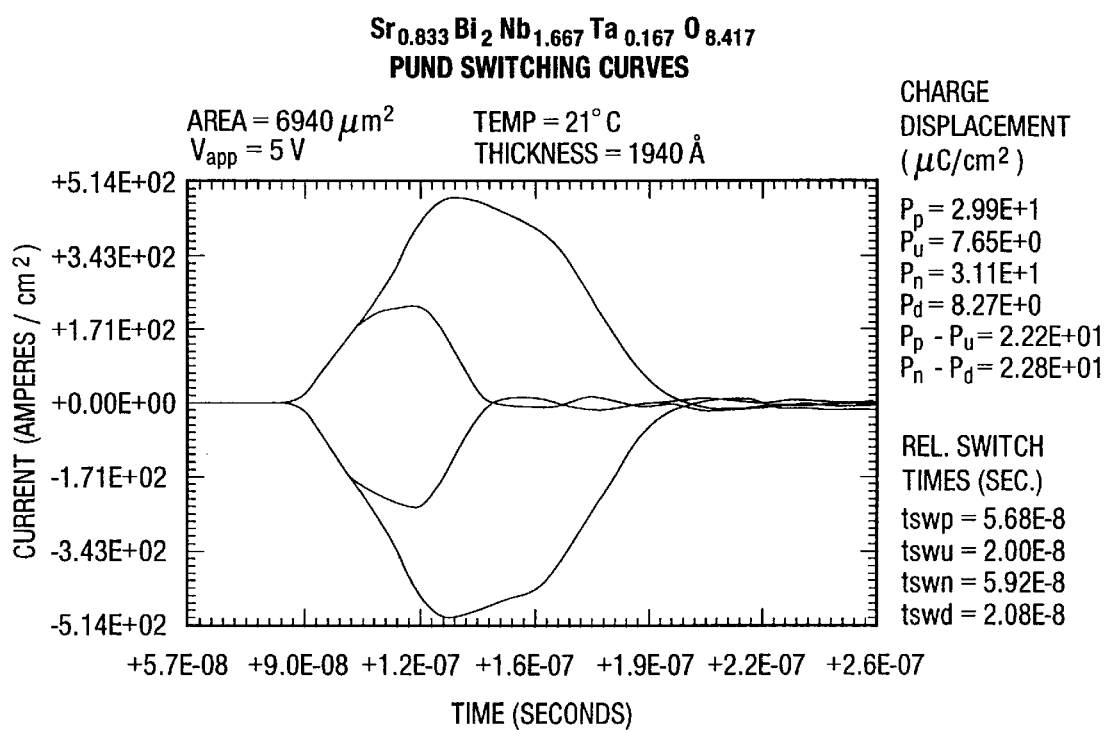
FIG. 42 depicts a plot like that of FIGS. 27 and 28, but including PUND switching data from the $Sr_{0.833}Bi_2Nb_{1.667}Ta_{0.167}O_{8.417}$ sample.

FIG. 41 depicts comparative measurements for the $Sr_{0.833}Bi_2Nb_{1.667}Ta_{0.167}O_{8.417}$ sample from Table 7. Peak capacitance exceeded about $1.37 \times 10^{-14}$ $F/\mu m^2$ in the range around 0 V, and fell to about $8.5 \times 10^{-15}$ $F/\mu m^2$ in the 5V range. These results were slightly improved with respect to those of FIG. 25.

EXAMPLE 14

COMPARATIVE EVALUATION OF MIXED LAYERED SUPERLATTICE METAL OXIDE PUND SWITCHING PERFORMANCE

A $Sr_{0.833}Bi_2Ta_{1.833}O_{8.417}$ sample was connected to a Hewlit Packard 8115A dual channel pulse generator, a Hewlit Packard 54502A digitizing oscilloscope, and 50 ohm load resistor for purposes of conducting PUND switching measurements. The PUND switching curves are given in terms of seconds versus current in amps/cm². The PUND curves are generated in a well-known manner by first initializing the sample with a pulse in the negative direction, then measuring the current through the resistive load for a series of four voltage pulses that give the measurement its name: a positive (P) pulse, a second positive of up (U) pulse, a negative (N) pulse, and then another negative or down (D) pulse. All pulses have the same absolute amplitude. The initial negative pulse makes sure the material starts with a negative polarization. The first positive, "P", pulse therefore switches the material to a positive polarization. Since the sample is already polarized positively, the second, or "U", pulse measures the change between the residual polarization and the saturated polarization in the positive direction. Likewise the "N" pulse measures the negative switching current, and the "D" pulse measures the change between the residual polarization and the saturated polarization in the negative direction.

For a standard architecture of a memory cell (but not for all architectures) the PUND curves indicate the suitability of the material for a non-volatile ferroelectric switching memory application. Generally, it is desirable that the "P" and "N" curves are well-separated from the "U" and "D" curves, respectively, which provides a large signal in the standard architecture. It is also desirable that all the curves fall quickly to a low value; a curve that falls quickly indicates that the material completes the current flow, which produces the signal quickly. That is, it is a "fast switching" material. Generally, in the tests herein, the switching time is taken to be the time to fall to a value of 10% of the maximum amplitude, since this 10% level will generally be within the noise level of a typical integrated circuit.

Figure 27:
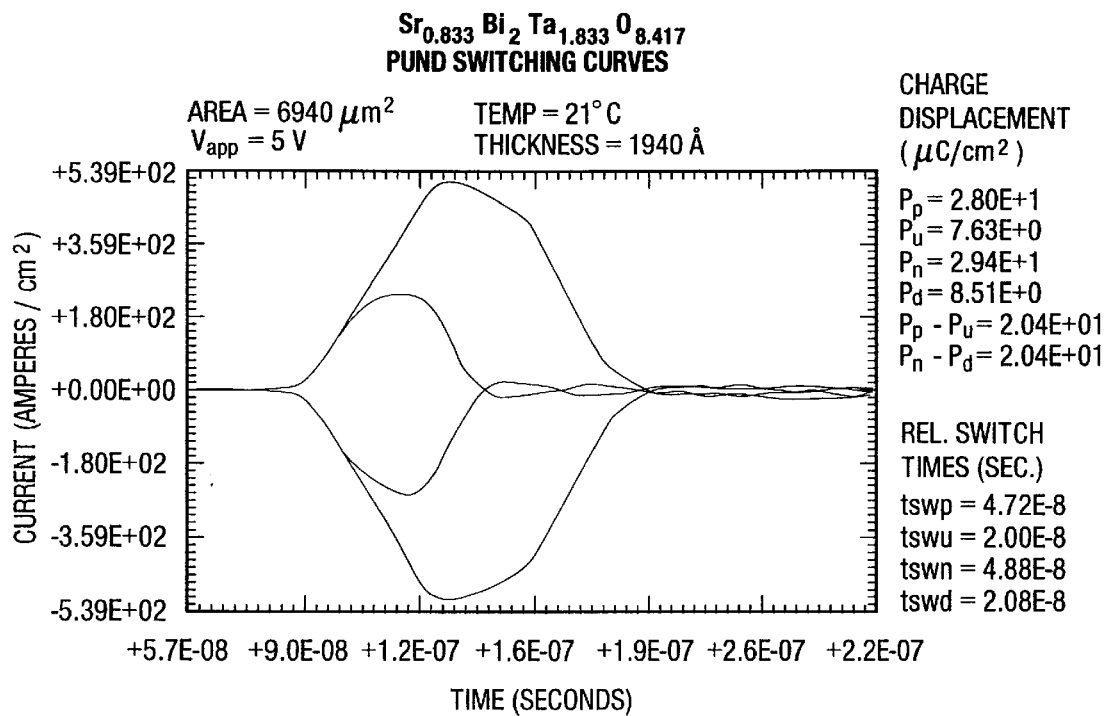
FIG. 27 depicts a positive up negative down ("PUND") switching measurement plot of current in amperes versus an ordinate of switching time in seconds, with measurements obtained from the $Sr_{0.833}Bi_2Ta_{1.833}O_{8.417}$ 16.7% mixed layered superlattice material.

FIG. 27 includes PUND switching curves for the $Sr_{0.833}Bi_2Ta_{1.833}O_{8.417}$ $L_1$ and $L_2$ mixed sample, as a plot of current in amps versus an ordinate of time in seconds. These curves indicate that the ferroelectric material had a very quick memory switching time at 5V, with virtually complete memory switching being obtained in less than about 50 nanoseconds, even for the negative switching curves.

Figure 28:
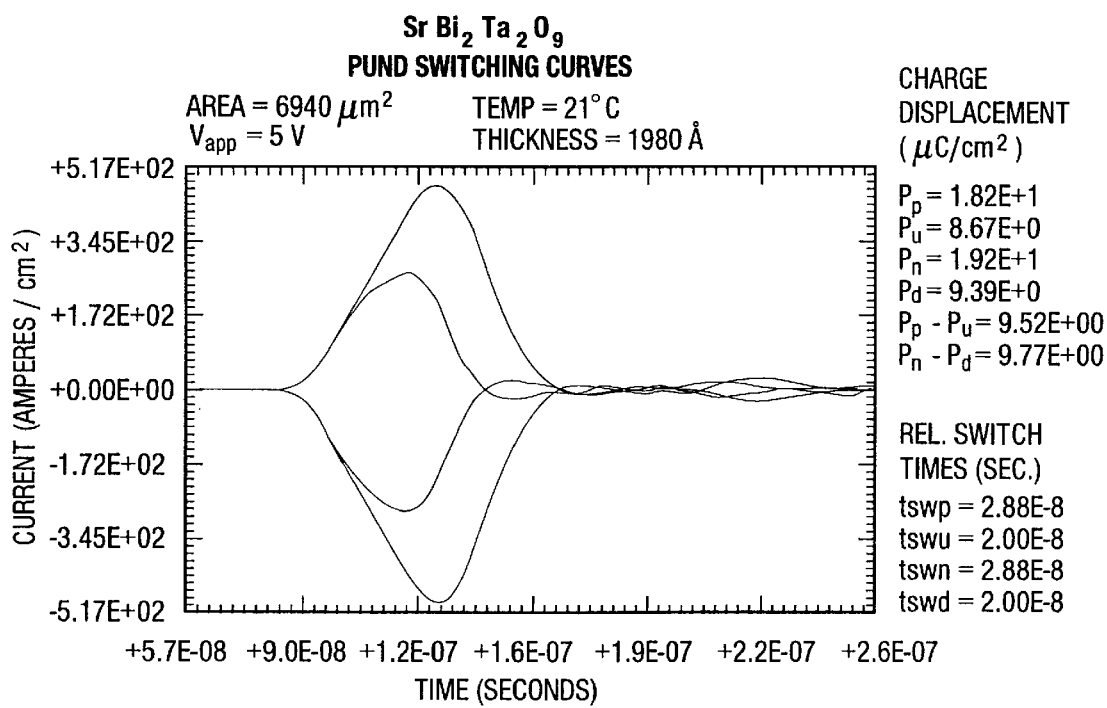
FIG. 28 depicts a plot like that of FIG. 27, but includes comparative PUND data obtained from the $SrBi_2Ta_2O_9$ non-mixed layered superlattice material.

A $SrBi_2Ta_2O_9$ sample was subjected to comparative PUND switching measurements. FIG. 28 depicts these results. The memory switching time was extremely quick, with switching being obtained in less than about 30 nanoseconds even for the negative switching cycles.

FIG. 28 is a plot of comparative switching measurements that were obtained from a $Sr_{0.833}Bi_2Nb_{0.167}Ta_{1.667}O_{8.417}$ sample. The switching time was less than 60 nanoseconds even for the negative switching cycles. The observed switching times for all samples fell well within acceptable limits for use in integrated circuit memories.

EXAMPLE 15

COMPARATIVE EVALUATION OF MIXED LAYERED SUPERLATTICE METAL OXIDE FATIGUE ENDURANCE PERFORMANCE

The $Sr_{0.833}Bi_2Ta_{1.833}O_{8.417}$, $Sr_{0.833}Bi_2Nb_{1.667}Ta_{0.167}O_{8.417}$, and $SrBi_2Ta_2O_9$ samples were subjected to repeated PUND switching measurements in the manner of Example 14 over $10^9$ cycles, except the magnitude of the applied sine wave voltage cycle was reduced from 5V to 3V. Results for these cycles indicated essentially no polarization decline or fatigue for any of the samples over the interval studied. A polarization hysteresis measurement was conducted for each sample before the first PUND measurement and again after $10^9$ PUND switching cycles. In each case, the initial hysteresis loop and the final hysteresis loop after $10^9$ cycles exactly overlaid one another. Both the mixed and non-mixed layered superlattice materials had excellent fatigue endurance, and it appeared that the 3V sine wave switching could continue for an indefinite number of cycles.

An identical set of $Sr_{0.833}Bi_2Ta_{1.833}O_{8.417}$, $Sr_{0.833}Bi_2Nb_{1.667}Ta_{0.167}O_{8.417}$, and $SrBi_2Ta_2O_9$ samples was subjected to harsher switching conditions. These conditions included a square wave with an amplitude of 5V. Even under these harsher conditions, fatigue was negligible, i.e., less than about 1–3% of the initial polarization magnitude over more than $10^{10}$ square wave cycles.

EXAMPLE 16

ELECTRON MICROSCOPY

Figure 29:
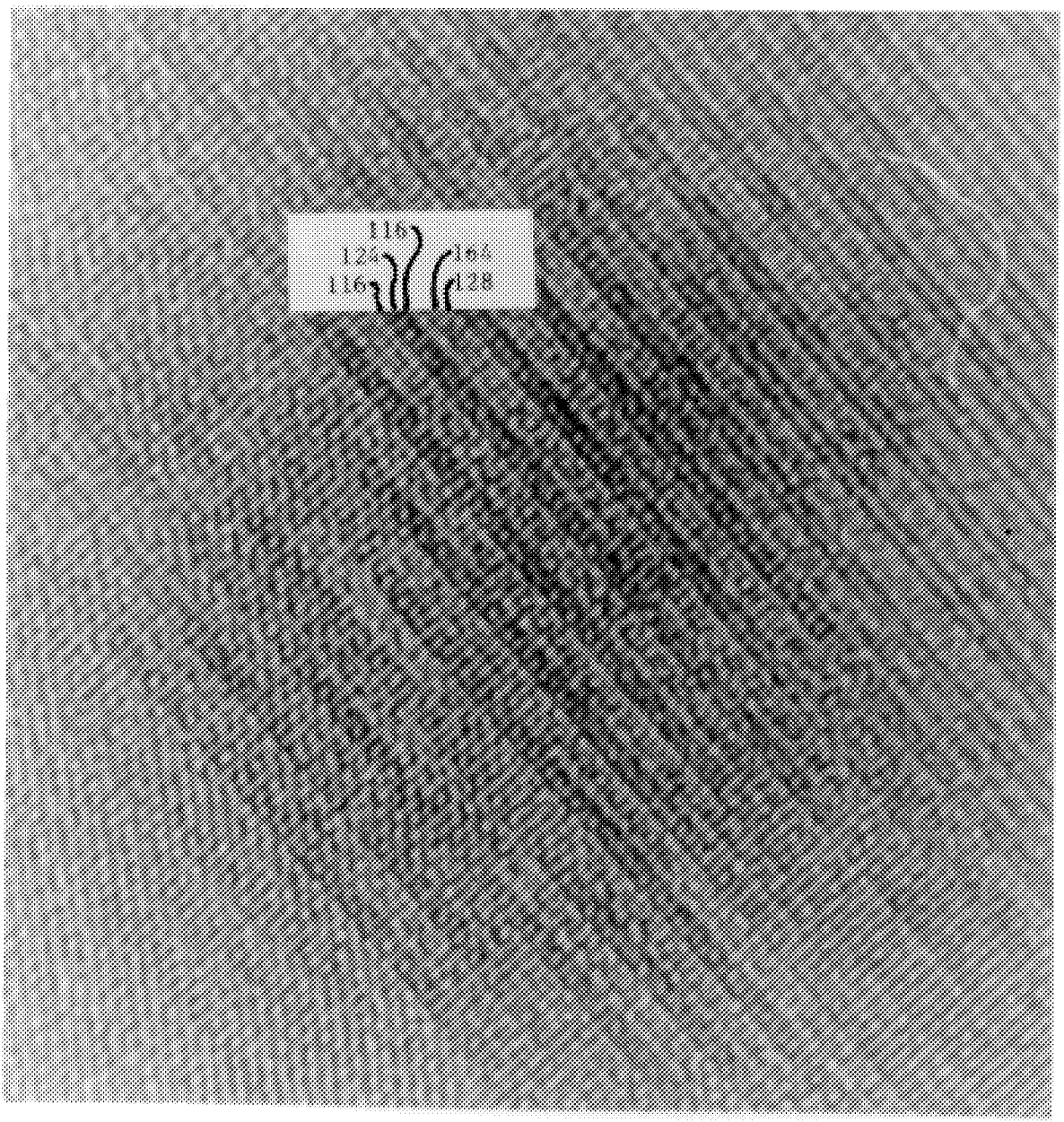
FIG. 29 depicts an 8,000,000× transmission electron microscope ("TEM") photomicrograph that reveals a layered structure in a mixed layered superlattice material having an empirical formula of $Sr_{0.5}Bi_2Ta_{1.5}O_{7.25}$ (50% m=1 and 50% n=2)

FIG. 29 is a photomicrograph of the $Sr_{0.500}Bi_2Ta_{1.500}O_{7.25}$ (50% m=1) mixed layered superlattice material from Table 7. FIG. 29 was obtained from Hitachi H-9000 transmission electron microscope equipment located at the Matsushita Electronics Laboratories in Osaka, Japan, and represents a magnification of about eight million (8,000,00×) taken at 300 kV from the original sample. Superlattice generator layers such as bismuth oxide layer 116 are visible as dark lines that separate A/B layer (m=1) 124 and AB layer (n=2) 128. Three rows are visible in layer 128 including the middle row 164 of strontium A-site ions which separate oxygen octahedra rows on either side. FIG. 29 confirms the existence of mixed (m=1 and m=2) layered superlattice materials by the calculated distances between the visible layers. A non-mixed n=2 $SrBi_2Ta_2O_9$ material would present a distance of about 25 Å including this sequence of layers: $(Bi_2O_2)^{2+}$, $(SrTa_2O_7)^{2-}$, $(Bi_2O_2)^{2+}$, and $(SrTa_2O_7)^{2-}$. A comparison with FIG. 29 demonstrates a repeat unit cell distance of about 19.5 Å including 3 Å for $(Bi_2O_2)^{2+}$ layer 116, 4.5 Å for $(TaO_{3.5})^{2-}$ layer 124, 3 Å for a second layer 116, and 9 Å for $(SrTa_2O_7)^{2-}$ layer 128. These comparable distances indicate that the $(TaO_{3.5})^{2-}$ layer 124 of FIG. 29 shortens the analogous mixed layer structure of FIG. 29 by 5.5 Å. One would expect the $(SrTa_2O_7)^{2-}$ layers in both materials to occupy 9 Å and the $(Bi_2O_2)^{2+}$ layers in both materials to occupy 3 Å. Use of these distance values in the non-mixed material, however, provides a total of only 24 Å which fails to account for an observed incremental distance of 1 Å in the 25 Å total. This 1 Å variation falls within the range of experimental error.

EXAMPLE 17

MIXED LAYERED SUPERLATTICE MATERIAL POLARIZATION AS A FUNCTION OF TEMPERATURE

Figure 37:
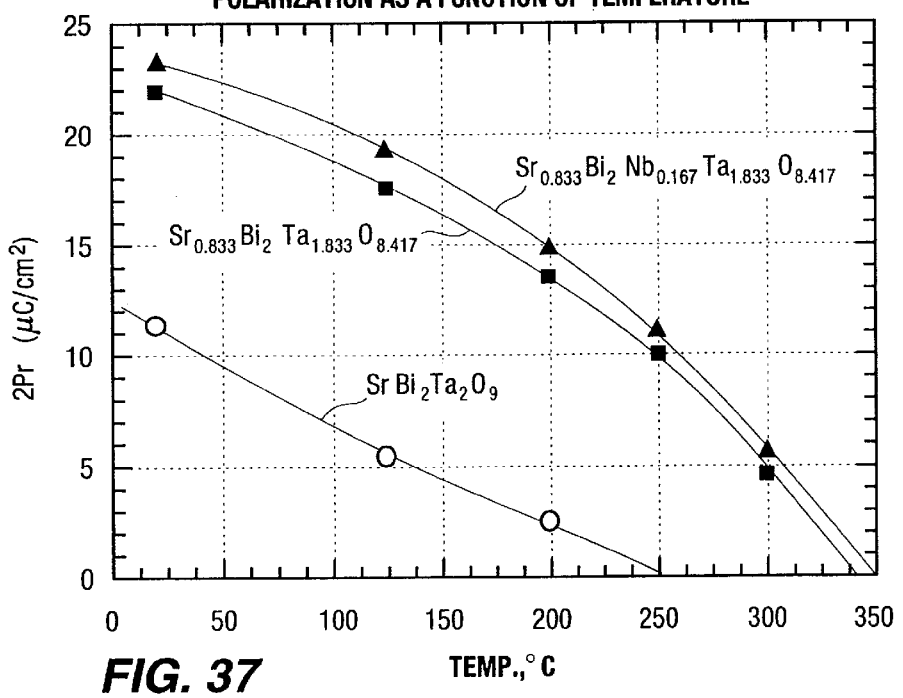
FIG. 37 depicts a plot of 2Pr polarization in $\mu C/cm^2$ versus temperature in degrees celsius for respective mixed and non-mixed layered superlattice materials.

Polarization measurements were conducted as in Example 9, except the sample was heated on a hot plate set at a specific temperature for each polarization run. FIG. 37 depicts the results obtained as a plot of 2Pr in $\mu C/cm^2$ versus temperature in degrees Celsius on the x-axis. The mixed layered superlattice materials retained much greater polarizabilities at elevated temperatures, when compared to the non-mixed $SrBi_2Ta_2O_9$ materials.

The intended environment of use for the mixed materials is in computer memories. In personal computer applications, these memories commonly have operating temperatures that range from 120° C. to 150° C. Accordingly, the mixed layered superlattice materials permit use of ferroelectric memories at elevated temperatures. Mixed layered superlattice materials also provide the capability of altering the polarization to accommodate the temperature of an intended environment of use.

Figure 38:
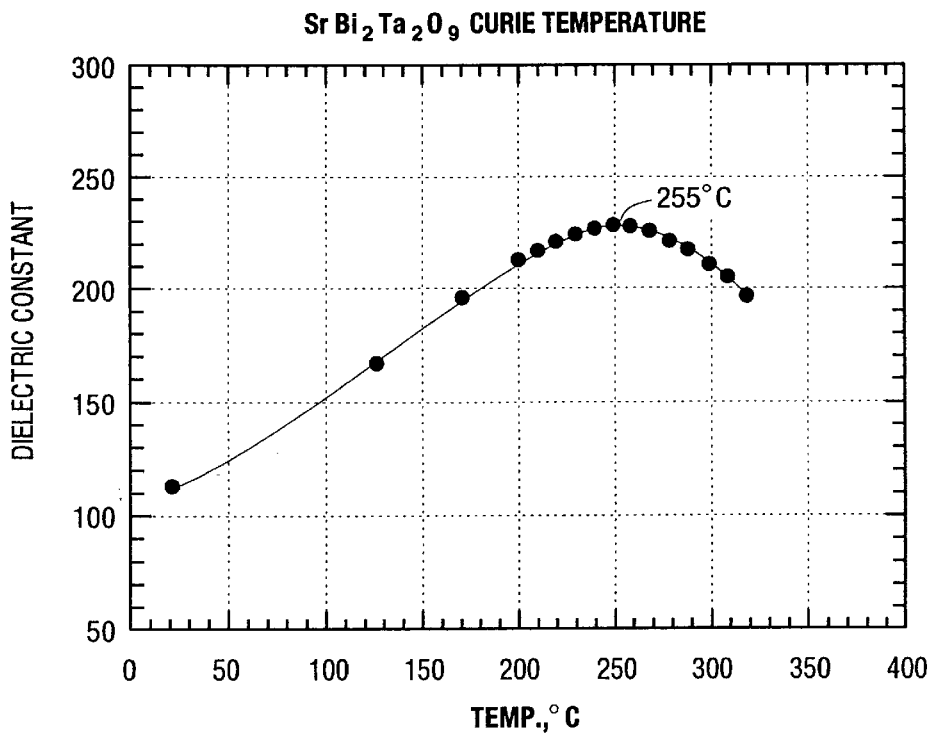
FIG. 38 depicts a plot of dielectric constant versus temperature in degrees celsius for the $SrBi_2Ta_2O_9$ sample.
Figure 39:
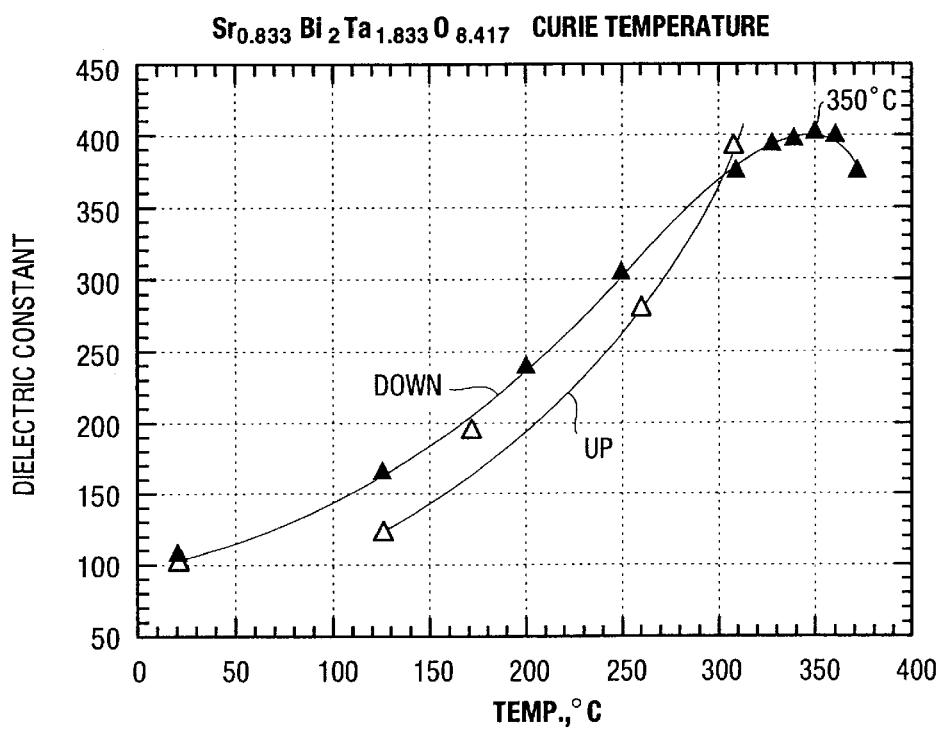
FIG. 39 depicts a plot like that of FIG. 38, but including data obtained for the $Sr_{0.833}Bi_2Ta_{1.833}O_{8.417}$ sample.
Figure 40:
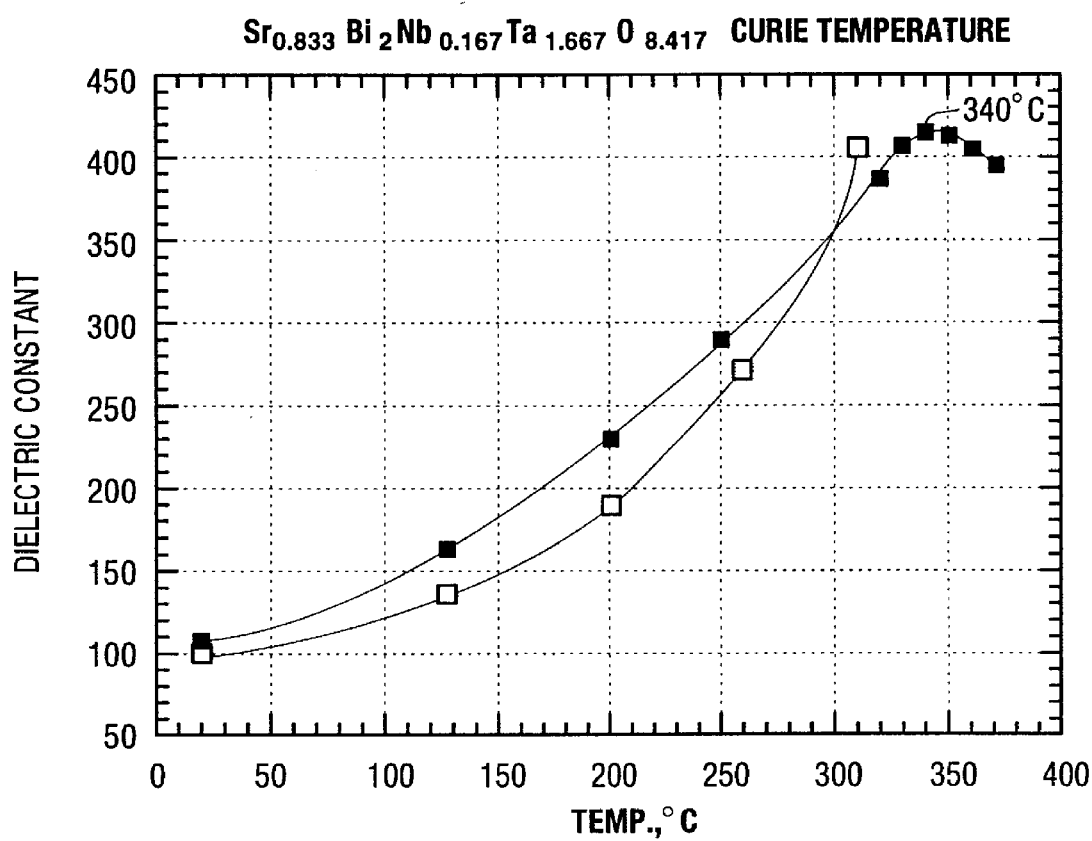
FIG. 40 depicts a plot like that of FIG. 38, but including data obtained from the $Sr_{0.833}Bi_2Nb_{0.167}Ta_{1.667}O_{8.417}$ sample.

FIGS. 38–40 depict dielectric constant versus temperature data that was obtained from respective $SrBi_2Ta_2O_9$, 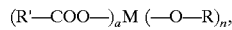 $Sr_{0.833}Bi_2Ta_{1.833}O_{8.417}$, and $Sr_{0.833}Bi_2Nb_{0.167}Ta_{1.667}O_{8.417}$ samples. The data were obtained from a Hewlit Packard 4275A LCR meter using a signal having a one MHz oscillation frequency and a 5 mV amplitude. The sample was heated on a hot plate to obtain the elevated temperature for each measurement. The Curie temperature is marked as an optimal point on each curve, i.e., 255° C. for $SrBi_2Ta_2O_9$; 350° C. for $Sr_{0.833}Bi_2Ta_{1.833}O_{8.417}$; and 340° C. for $Sr_{0.833}Bi_2Nb_{0.167}Ta_{1.667}O_{8.417}$. The samples at temperatures greater than the Curie temperature exhibit paraelectric behavior. The samples exhibit ferroelectric behavior at temperature less than the Curie temperature. Again, the intended environment of use for these materials is in the preferred range of from 125° C. to 150° C.

We claim:

1. A liquid precursor solution for use in making thin-film ferroelectric capacitor devices, comprising:

a substantially homogeneous liquid mixture of polyoxyalkylated metal moieties including an A-site metal moiety, a B-site metal moiety, a superlattice-generator metal moiety, and a solvent, said respective metal moieties, being mixed in effective amounts for spontaneously yielding, upon annealing of said mixture, a solid layered superlattice material having a plurality of collated layers in a sequence of an A/B layer including an A/B ionic subunit cell, a superlattice-generator layer including a superlattice-generator ionic subunit cell, and an AB layer including an AB octahedral ionic subunit cell different form said A/B ionic subunit cell.

2. The solution as set forth in claim 1, said solvent being selected from a group consisting of xylenes, n-octane, 1-butanol, n-butyl acetate, and mixtures thereof.

3. The solution as set forth in claim 1, each of said metal portions including a substance defined by a formula wherein a corresponding metal atom is bonded to an organic ligand through an oxygen atom.

4. The solution as set forth in claim 1, at least one of said metal moieties including a substance defined by a molecular formula

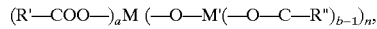
$(R'—COO—)_aM(—O—M'(—O—C—R'')_{b-1})_n,$ wherein M is a metal having an outer valence of (a+n) and M' is a metal having an outer valence of b, with M and M' being independently selected from a group consisting of tantalum, calcium, bismuth, lead, yttrium, scandium, lanthanum, antimony, chromium, thallium, hafnium, tungsten, niobium, zirconium, vanadium, manganese, iron, cobalt, nickel, magnesium, molybdenum, strontium, barium, titanium, and zinc; and R' and R'' are alkyl groups having from 4 to 9 carbon atoms.

5. The solution as set forth in claim 1, at least one of said metal moieties including a substance defined by a molecular formula $(R'—COO—)_aM(—O—R)_n,$ wherein M is a metal having an outer valence of (a+n) and selected from a group consisting of tantalum, calcium, bismuth, lead, yttrium, scandium, lanthanum, antimony, chromium, thallium, hafnium, tungsten, niobium, zirconium, manganese, iron, cobalt, nickel, magnesium, molybdenum, strontium, barium, titanium, and zinc; R' is an alkyl group having from 4 to 9 carbon atoms and R is an alkyl group having from 3 to 8 carbon atoms.

6. The solution as set forth in claim 5, said effective amounts including A/B layer amounts capable of yielding said A/B layer having an A/B layer empirical formula

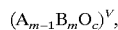
$(A_{m-1}B_mO_c)^V,$ wherein A is an A-site atom in the A/B ionic subunit cell; B is a B-site atom in the A/B ionic subunit cell; O is oxygen; m is a number having a value of at least one; c is a value selected from a group consisting of (3m+1) and (3m); S is a trivalent superlattice-generator element; and V is an A/B layer charge selected from a group consisting of 1+, 1−, 2−, and 3−.

7. The solution as set forth in claim 6, said effective amounts including AB layer amounts capable of yielding said AB layer having a AB empirical formula

$(A'_{n-1}B'_nO_{3n+1})^{V'},$ wherein A' is an A-site atom in said AB ionic subunit cell; B' is a B-site atom in said AB ionic subunit cell; O is oxygen; n is a number having a value greater than one; and V' is a second formula ionic charge selected from a group consisting of 1+, 1−, 2− and 3−, at least one of A', B', and n being different from the corresponding elements A, B, and m of said A/B layer empirical formula.

8. The solution as set forth in claim 7, said effective amounts including superlattice-generator layer amounts capable of yielding a superlattice-generator layer empirical formula of $(S_2O_2)^{2+}$, wherein S is a superlattice-generator element.

9. The solution as set forth in claim 8, said S being bismuth.

10. The solution as set forth in claim 8, said S being thallium.

11. The solution as set forth in claim 8, wherein said A and said A' are $Sr^{2+}$; said B and said B' are selected from a group consisting of $Ta^{5+}$, $Nb^{5+}$, and mixtures thereof; and said S is $Bi^{3+}$.

12. The solution as set forth in claim 11, said effective amounts including said A/B layer amounts corresponding to m=1 and said AB layer amounts corresponding to n=2.

13. The solution as set forth in claim 12, including a ratio of said A/B layer amounts to said AB layer amounts of up to about 3:10 (layer to layer) when said B and B' are $Ta^{5+}$ and up to about 2:5 when one of said B and B' includes $Nb^{5+}$.

14. The solution as set forth in claim 7, said B and B' each including a valence state having a charge of plus five.

15. The solution as set forth in claim 7, said B and B' being selected from a B-site group consisting of titanium, zirconium, molybdenum, tungsten, vanadium, and mixtures thereof.

16. The solution as set forth in claim 7, wherein said B and B' are tantalum.

17. The solution as set forth in claim 7, wherein said B and B' are niobium.

18. The solution as set forth in claim 7, said B and B' including a mixture of tantalum and niobium.

19. The solution as set forth in claim 7, said A and A' each including a valence state having a charge of plus two.

20. The solution as set forth in claim 7, said A and A' being selected from an A-site group consisting of barium, lead, lanthanum, calcium, and mixtures thereof.

21. The solution as set forth in claim 7, wherein at least one of said A and said A' is $Sr^{2+}$.

22. The solution as set forth in claim 7, wherein at least one of said A and A' is $Bi^{3+}$.

23. The solution as set forth in claim 7, said effective amounts including an A/B portion allocated to yielding respective layers of said AB octahedral ionic subunit cell corresponding to m=1 and a AB layer portion allocated to yielding respective layers of said AB octahedral ionic subunit cell corresponding to n=2.

* * * * *